US011358372B2

(12) United States Patent
Chang et al.

(10) Patent No.: US 11,358,372 B2
(45) Date of Patent: *Jun. 14, 2022

(54) BENDABLE GLASS STACK ASSEMBLIES, ARTICLES AND METHODS OF MAKING THE SAME

(71) Applicant: CORNING INCORPORATED, Corning, NY (US)

(72) Inventors: Theresa Chang, Painted Post, NY (US); Polly Wanda Chu, Painted Post, NY (US); Patrick Joseph Cimo, Corning, NY (US); Adam James Ellison, Corning, NY (US); Timothy Michael Gross, Corning, NY (US); Guangli Hu, Berkeley Heights, NJ (US); Nicholas James Smith, Port Matilda, PA (US); Butchi Reddy Vaddi, Painted Post, NY (US); Natesan Venkataraman, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/062,978

(22) Filed: Oct. 5, 2020

(65) Prior Publication Data
US 2021/0034112 A1 Feb. 4, 2021

Related U.S. Application Data

(62) Division of application No. 16/162,901, filed on Oct. 17, 2018, now Pat. No. 10,824,200, which is a
(Continued)

(51) Int. Cl.
*B32B 15/04* (2006.01)
*B32B 17/06* (2006.01)
(Continued)

(52) U.S. Cl.
CPC ............ *B32B 17/10* (2013.01); *B32B 7/12* (2013.01); *B32B 17/06* (2013.01); *B32B 17/101* (2013.01);
(Continued)

(58) Field of Classification Search
CPC ............ C03C 21/002; B32B 2307/558; B32B 2255/26; B32B 17/06
(Continued)

(56) References Cited

U.S. PATENT DOCUMENTS 3,573,075 A 3/1971 Karstetter
3,803,762 A 4/1974 Schreiber et al.
(Continued)

FOREIGN PATENT DOCUMENTS

CA 2718446 A1 4/2011
CN 101076447 A 11/2007
(Continued)

OTHER PUBLICATIONS

An experimental report from the inventor Timothy Michael Gross.
(Continued)

*Primary Examiner* — Lauren R Colgan
(74) *Attorney, Agent, or Firm* — Jeffrey A. Schmidt

(57) ABSTRACT

A glass element having a thickness from 25 μm to 125 μm, a first primary surface, a second primary surface, and a compressive stress region extending from the first primary surface to a first depth, the region defined by a compressive stress GI of at least about 100 MPa at the first primary surface. Further, the glass element has a stress profile such that it does not fail when it is subject to 200,000 cycles of bending to a target bend radius of from 1 mm to 20 mm, by the parallel plate method. Still further, the glass element has a puncture resistance of greater than about 1.5 kgf when the
(Continued)

first primary surface of the glass element is loaded with a tungsten carbide ball having a diameter of 1.5 mm.

20 Claims, 21 Drawing Sheets

Related U.S. Application Data division of application No. 15/843,346, filed on Dec. 15, 2017, now Pat. No. 10,809,766, which is a division of application No. 15/398,372, filed on Jan. 4, 2017, now Pat. No. 9,898,046, which is a division of application No. 15/072,027, filed on Mar. 16, 2016, now Pat. No. 9,557,773, which is a division of application No. 14/602,299, filed on Jan. 22, 2015, now Pat. No. 9,321,678.

(60) Provisional application No. 61/932,924, filed on Jan. 29, 2014, provisional application No. 61/974,732, filed on Apr. 3, 2014, provisional application No. 62/090,604, filed on Dec. 11, 2014.

(51) Int. Cl.
| | | |
|---|---|---|
| *B32B 17/10* | (2006.01) | |
| *C03C 21/00* | (2006.01) | |
| *H05K 1/02* | (2006.01) | |
| *H05K 1/03* | (2006.01) | |
| *C03C 17/32* | (2006.01) | |
| *B32B 27/36* | (2006.01) | |
| *C03C 17/30* | (2006.01) | |
| *C03C 15/00* | (2006.01) | |
| *G06F 1/16* | (2006.01) | |
| *C03C 3/091* | (2006.01) | |
| *B32B 7/12* | (2006.01) | |
| *B32B 37/12* | (2006.01) | |
| *B32B 37/16* | (2006.01) | |
| *H05K 3/46* | (2006.01) | |
| *G02F 1/1333* | (2006.01) | |
| *H04M 1/02* | (2006.01) | |

(52) U.S. Cl.
CPC .. *B32B 17/10009* (2013.01); *B32B 17/10137* (2013.01); *B32B 27/36* (2013.01); *B32B 37/12* (2013.01); *B32B 37/16* (2013.01); *C03C 3/091* (2013.01); *C03C 15/00* (2013.01); *C03C 17/30* (2013.01); *C03C 17/32* (2013.01); *C03C 21/002* (2013.01); *G06F 1/1652* (2013.01); *H05K 1/028* (2013.01); *H05K 1/0306* (2013.01); *H05K 3/46* (2013.01); *B32B 2255/00* (2013.01); *B32B 2255/26* (2013.01); *B32B 2307/536* (2013.01); *B32B 2307/546* (2013.01); *B32B 2307/558* (2013.01); *B32B 2307/5825* (2013.01); *B32B 2315/08* (2013.01); *B32B 2367/00* (2013.01); *B32B 2457/00* (2013.01); *B32B 2457/20* (2013.01); *G02F 1/133305* (2013.01); *H04M 1/0268* (2013.01); *Y10T 428/24942* (2015.01); *Y10T 428/26* (2015.01); *Y10T 428/266* (2015.01)

(58) Field of Classification Search
USPC ............... 428/220, 426, 428, 432, 433
See application file for complete search history.

(56) References Cited

U.S. PATENT DOCUMENTS

| 5,484,657 | A | 1/1996 | Kramling et al. |
|---|---|---|---|
| 6,092,392 | A | 7/2000 | Verlinden et al. |
| 6,261,398 | B1 | 7/2001 | Costa |
| 6,592,969 | B1 | 7/2003 | Burroughes et al. |
| 6,660,387 | B2 | 12/2003 | Oaku et al. |
| 6,992,008 | B2 | 1/2006 | Kobayashi et al. |
| 7,201,965 | B2 * | 4/2007 | Gulati ............... C03B 33/02 428/426 |
| 7,461,564 | B2 | 12/2008 | Glaesemann |
| 7,736,997 | B2 | 6/2010 | Takechi |
| 8,017,220 | B2 | 9/2011 | Garner et al. |
| 8,106,583 | B2 | 1/2012 | Shin et al. |
| 8,159,130 | B2 | 4/2012 | Shim et al. |
| 8,203,261 | B2 | 6/2012 | Tanaka et al. |
| 8,349,194 | B2 | 1/2013 | Paek et al. |
| 8,398,873 | B2 | 3/2013 | Yoshikawa et al. |
| 8,436,122 | B2 | 5/2013 | Kho et al. |
| 8,454,851 | B2 | 6/2013 | Kim et al. |
| 8,525,405 | B2 | 9/2013 | Kuwabara et al. |
| 8,593,061 | B2 | 11/2013 | Yamada |
| 8,607,590 | B2 | 12/2013 | Glaesemann et al. |
| 8,609,229 | B2 | 12/2013 | Kondo |
| 8,840,997 | B2 | 9/2014 | Koyama et al. |
| 8,889,254 | B2 | 11/2014 | Bayne et al. |
| 9,069,521 | B2 | 6/2015 | Lee et al. |
| 9,073,291 | B2 | 7/2015 | Bookbinder et al. |
| 9,212,084 | B2 | 12/2015 | Wang et al. |
| 9,238,352 | B2 | 1/2016 | Merz et al. |
| 9,321,574 | B2 | 4/2016 | Garner et al. |
| 9,321,677 | B2 | 4/2016 | Chang et al. |
| 9,321,678 | B2 | 4/2016 | Chang et al. |
| 9,321,679 | B2 | 4/2016 | Chang et al. |
| 9,354,476 | B2 | 5/2016 | Han et al. |
| 9,557,773 | B2 | 1/2017 | Chang et al. |
| 9,802,859 | B2 | 10/2017 | Hori et al. |
| 9,898,046 | B2 | 2/2018 | Chang et al. |
| 10,216,230 | B2 | 2/2019 | Kim et al. |
| 10,261,546 | B2 | 4/2019 | Park et al. |
| 10,273,184 | B2 * | 4/2019 | Garner ............... C03C 4/18 |
| 2002/0020053 | A1 | 2/2002 | Fonash et al. |
| 2004/0004058 | A1 | 1/2004 | Smith et al. |
| 2004/0142118 | A1 | 7/2004 | Takechi |
| 2005/0090377 | A1 | 4/2005 | Shelestak et al. |
| 2005/0258135 | A1 | 11/2005 | Ishikawa et al. |
| 2008/0110862 | A1 | 5/2008 | Kim et al. |
| 2008/0292856 | A1 | 11/2008 | Garner et al. |
| 2009/0021666 | A1 | 1/2009 | Chen |
| 2009/0081512 | A1 | 3/2009 | Blanchard et al. |
| 2009/0087617 | A1 | 4/2009 | Suzuki et al. |
| 2009/0197088 | A1 | 8/2009 | Murata |
| 2010/0065116 | A1 | 3/2010 | Stancel et al. |
| 2010/0276066 | A1 | 11/2010 | Kondo |
| 2011/0050657 | A1 | 3/2011 | Yamada |
| 2011/0088777 | A1 | 4/2011 | Becker et al. |
| 2011/0122559 | A1 | 5/2011 | Lee et al. |
| 2011/0129650 | A1 * | 6/2011 | Shashidhar ......... C03B 27/0413 428/192 |
| 2011/0165393 | A1 * | 7/2011 | Bayne ............... C03C 15/00 428/215 |
| 2011/0232945 | A1 | 9/2011 | Whitcomb et al. |
| 2011/0241063 | A1 | 10/2011 | Winscom |
| 2011/0255034 | A1 | 10/2011 | Nakano et al. |
| 2011/0300908 | A1 | 12/2011 | Grespan et al. |
| 2012/0083401 | A1 | 4/2012 | Koyama et al. |
| 2012/0094084 | A1 | 4/2012 | Fisher et al. |
| 2012/0111056 | A1 | 5/2012 | Prest |
| 2012/0192466 | A1 | 8/2012 | Kee et al. |
| 2012/0216570 | A1 | 8/2012 | Abramov et al. |
| 2012/0263945 | A1 | 10/2012 | Yoshikawa |
| 2012/0270961 | A1 | 10/2012 | Kotani |
| 2012/0280368 | A1 | 11/2012 | Garner et al. |
| 2012/0282449 | A1 * | 11/2012 | Gross ............... C03C 17/28 428/220 |
| 2013/0017380 | A1 | 1/2013 | Murata et al. |
| 2013/0037308 | A1 | 2/2013 | Wang et al. |
| 2013/0037832 | A1 | 2/2013 | Kang |
| 2013/0044282 | A1 | 2/2013 | Kuwabara et al. |
| 2013/0083496 | A1 | 4/2013 | Franklin et al. |
| 2013/0114219 | A1 | 5/2013 | Garner et al. |
| 2013/0155004 | A1 | 6/2013 | Yoshikawa |
| 2013/0169591 | A1 | 7/2013 | Hung et al. |

(56) References Cited

U.S. PATENT DOCUMENTS

| | | |
|---|---|---|
| 2013/0189486 A1 | 7/2013 | Wang et al. |
| 2013/0196163 A1 | 8/2013 | Swanson |
| 2013/0202715 A1 | 8/2013 | Wang et al. |
| 2013/0209751 A1 | 8/2013 | Zhang et al. |
| 2013/0216740 A1 | 8/2013 | Russell-Clarke et al. |
| 2013/0224492 A1 | 8/2013 | Bookbinder et al. |
| 2013/0236666 A1 | 9/2013 | Bookbinder et al. |
| 2013/0273357 A1 | 10/2013 | Whitcomb et al. |
| 2013/0323444 A1 | 12/2013 | Ehemann et al. |
| 2013/0337233 A1 | 12/2013 | Chen et al. |
| 2014/0034544 A1 | 2/2014 | Chang et al. |
| 2014/0050911 A1 | 2/2014 | Mauro et al. |
| 2014/0106150 A1* | 4/2014 | Decker .................. C03C 17/42 428/216 |
| 2014/0132856 A1 | 5/2014 | Hung et al. |
| 2014/0141206 A1 | 5/2014 | Gillard et al. |
| 2014/0141217 A1* | 5/2014 | Gulati ................... C03B 17/02 428/212 |
| 2014/0240985 A1 | 8/2014 | Kim et al. |
| 2014/0370264 A1 | 12/2014 | Ohara et al. |
| 2015/0147532 A1 | 5/2015 | Nam et al. |
| 2015/0166407 A1 | 6/2015 | Varshneya et al. |
| 2015/0266272 A1 | 9/2015 | Lee et al. |
| 2016/0000210 A1 | 1/2016 | Robenalt |
| 2016/0002103 A1* | 1/2016 | Wang ..................... C03B 17/06 428/141 |
| 2016/0031187 A1 | 2/2016 | Zhang et al. |
| 2016/0048171 A1 | 2/2016 | Lee et al. |
| 2018/0132371 A1 | 5/2018 | Yeum et al. |
| 2018/0228002 A1 | 8/2018 | Murashige et al. |

FOREIGN PATENT DOCUMENTS

| | | |
|---|---|---|
| CN | 101443429 A | 5/2009 |
| CN | 102123960 A | 7/2011 |
| CN | 102131743 A | 7/2011 |
| CN | 102156360 A | 8/2011 |
| CN | 102249542 A | 11/2011 |
| CN | 102421597 A | 4/2012 |
| CN | 102531384 A | 7/2012 |
| CN | 102574736 A | 7/2012 |
| CN | 102741187 A | 10/2012 |
| CN | 102782772 A | 11/2012 |
| CN | 102933517 A | 2/2013 |
| CN | 202924913 U | 5/2013 |
| CN | 103153607 A | 6/2013 |
| CN | 103159411 A | 6/2013 |
| CN | 103261112 A | 8/2013 |
| CN | 103338926 A | 10/2013 |
| CN | 103474580 A | 12/2013 |
| EP | 2202208 A1 | 6/2010 |
| EP | 2251497 A2 | 11/2010 |
| EP | 2374766 A1 | 10/2011 |
| EP | 2532628 A1 | 12/2012 |
| EP | 2686280 A1 | 1/2014 |
| GB | 1246384 A | 9/1971 |
| JP | 56-041859 A | 4/1981 |
| JP | 57-153962 A | 9/1982 |
| JP | 04-219204 A | 8/1992 |
| JP | 05-183320 A | 7/1993 |
| JP | 05-334216 A | 12/1993 |
| JP | 11-158648 A | 6/1999 |
| JP | 11-263639 A | 9/1999 |
| JP | 2000-234071 A | 8/2000 |
| JP | 2005-019082 A | 1/2005 |
| JP | 2006-062187 A | 3/2006 |
| JP | 2008-302351 A | 12/2008 |
| JP | 2011-052158 A | 3/2011 |
| JP | 2011-093728 A | 5/2011 |
| JP | 2011-164508 A | 8/2011 |
| JP | 2011-195450 A | 10/2011 |
| JP | 2011-208113 A | 10/2011 |
| JP | 2012-051777 A | 3/2012 |
| JP | 2012-148955 A | 8/2012 |
| JP | 2012-184155 A | 9/2012 |
| JP | 2013-001615 A | 1/2013 |
| JP | 2013-516387 A | 5/2013 |
| JP | 2013-521615 A | 6/2013 |
| JP | 2013-184872 A | 9/2013 |
| JP | 2016-508954 A | 3/2016 |
| KR | 10-1986-0004732 A | 7/1986 |
| KR | 10-1993-0701290 A | 6/1993 |
| KR | 10-1997-0701677 A | 4/1997 |
| KR | 10-2002-0077256 A | 10/2002 |
| KR | 10-2007-0087650 A | 8/2007 |
| KR | 10-1020352 B1 | 3/2011 |
| KR | 10-2011-0043520 A | 4/2011 |
| KR | 10-2011-0049524 A | 5/2011 |
| KR | 10-2011-0095427 A | 8/2011 |
| KR | 10-1057151 B1 | 8/2011 |
| KR | 10-2012-0016906 A | 2/2012 |
| KR | 10-2012-0034506 A | 4/2012 |
| KR | 10-1141688 | 5/2012 |
| KR | 10-1151909 B1 | 5/2012 |
| KR | 10-1238214 B1 | 3/2013 |
| KR | 10-2013-0121109 A | 11/2013 |
| KR | 10-2013-0123960 A | 11/2013 |
| KR | 10-2014-0002683 A | 1/2014 |
| KR | 10-2014-0007252 A | 1/2014 |
| TW | 201240899 A | 10/2012 |
| TW | 201245075 A | 11/2012 |
| TW | 201414687 A | 4/2014 |
| WO | 98/41396 A1 | 9/1998 |
| WO | 2010/151459 A1 | 12/2010 |
| WO | 2011/042983 A1 | 4/2011 |
| WO | 2011/085190 A1 | 7/2011 |
| WO | 2011/109114 A2 | 9/2011 |
| WO | 2012/034506 A1 | 3/2012 |
| WO | 2012/125857 A1 | 9/2012 |
| WO | 2012/126394 A1 | 9/2012 |
| WO | 2012/151459 A1 | 11/2012 |
| WO | 2012/166343 A2 | 12/2012 |
| WO | 2013/004473 A1 | 1/2013 |
| WO | 2013/006750 A2 | 1/2013 |
| WO | 2013/016157 A1 | 1/2013 |
| WO | WO2013016157 * | 1/2013 |
| WO | 2013/061764 A1 | 5/2013 |
| WO | 2013/129400 A1 | 9/2013 |
| WO | 2013/145595 A1 | 10/2013 |
| WO | 2013/181213 A1 | 12/2013 |
| WO | 2014/045809 A1 | 3/2014 |
| WO | 2014/139147 A1 | 9/2014 |
| WO | 2015/116465 A1 | 8/2015 |
| WO | 2015/116466 A1 | 8/2015 |
| WO | 2015/116649 A1 | 8/2015 |
| WO | 2015/178175 A1 | 11/2015 |
| WO | 2016/028542 A1 | 2/2016 |
| WO | 2016/037589 A1 | 3/2016 |
| WO | 2016/073551 A1 | 5/2016 |
| WO | 2020/041015 A1 | 2/2020 |

OTHER PUBLICATIONS

Corning experimental results.
Jen-Chieh Lin, "Employee Intellectual Property Rights Agreement", (A14) Opposition against EP3099642, 4 pages.
SciGlass archived web page dated Jan. 2, 2014.
Statement from US attorney on transfer of rights from CDTT to Corning Incorporated.
Statement from US attorney on validity of priority claims.
Adam James Elison, "Corning Incorporated", (A9) Opposition against EP3099642, Employee Patent and Proprietary Information Agreement, 1 page.
Alan T. Eusden, "Research and Development Agreement between Corning Incorporated and Corning Display Technologies Taiwan", Corning ip agreement No. L13014, 8 pages.
Apple Inc.'s May 12, 2017 Press Release, available at www.apple.com/newsroom/2017/05/apple-awards-corning-first-advancedmanufacturing-fund-investment/.
April Gocha, Video: Flip Phones Are Making a Comeback, but This Time Glass Is Involved, AM. Ceramic SOC'Y, Feb. 26, 2020,

(56) References Cited

OTHER PUBLICATIONS available at ceramics.org/ceramic-tech-today/ceramic-video/video-flip-phones-aremaking--a-comeback-but-this-time-glass-is-involved.
C. Ziegler, "Samsung shows flexible and transparent displays at CES 2011," Engadget, Jan. 9, 2011.
Chai et al., "Fracture mode transitions in brittle coatings on compliant substrates as a function of thickness", J, Mater. Res , vol. 19, No. 6, Jun. 2004, pp. 1752-1761.
Chouhwan Moon, "Corning Incorporated", (A8) Opposition against EP3099642, Employee Patent and Proprietary Information Agreement, 3 pages.
Corning Inc., Values, available at www.corning.com/worldwide/en/sustainability/people/values.html.
Corning Incorporated, Notice of Allowance of U.S. Appl. No. 14/601,698, dated Feb. 5, 2016.
Corning Incorporated, Notice of Allowance of U.S. Appl. No. 14/602,299, dated Feb. 9, 2016.
Corning Incorporated, Notice of Allowance of U.S. Appl. No. 15/398,372, dated Oct. 12, 2017.
Corning Incorporated, U.S. Appl. No. 61/932,924, filed Jan. 29, 2014.
Corning Incorporated, U.S. Appl. No. 62/090,604, filed Dec. 11, 2014.
English Translation EP15704140.1 Notice of Opposition and Supporting Documents dated Nov. 27, 2018, European Patent Office, 113 Pgs.
English Translation EP15705416.4 Notice of Opposition and Supporting Documents dated Dec. 4, 2018, European Patent Office, 134 Pgs.
English Translation of CN201810240023.8 Office Action dated May 7, 2020; 6 pages; Chinese Patent Office.
English Translation of CN201810240957.1 Office Action dated May 28, 2020; 16 pages; Chinese Office Patent.
English Translation of CN201810241090.1 Office Action dated Apr. 26, 2020; 10 pages; Chinese Patent Office.
English Translation of KR20187000529 Notice of Allowance dated Feb. 8, 2019, Korea Patent Office, 2 Pgs.
Englisth Translation of CN201810240038.4 Office Action dated May 28, 2020; 10 pages; Chinese Office Patent.
Englisth Translation of CN201810240939.3 Office Action dated Jun. 2, 2020; 6 pages; Chinese Office Patent.
Englisth Translation of CN201810241009.X Office Action dated Jul. 9, 2020; 9 pages; Chinese Office Patent.
European Patent Application No. 15704139.3 Notice of opposition dated Dec. 20, 2018, 46 pages European Patent Office.
European Patent Application No. 15704140.1 Decision to grant a European patent dated Jan. 25, 2018; 2 pages.
European Patent Application No. 15704140.1 Notice of opposition dated Nov. 21,2 018; 41 Pages; European Patent Office.
European Patent Application No. 15704139 Office Action dated May 17, 2019; 34 Pages; European Patent Office.
European Patent Application No. 15704139.3 Communication under Rule 71(3) EPC dated Oct. 23, 2017; 6 Pages; European Patent Office.
European Patent Application No. 15704139.3 Decision to grant a European patent dated Feb. 22, 2018; 2 Pages; European Patent Office.
European Patent Application No. 15704139.3 Office Action dated Feb. 20, 2017; 5 Pages; European Patent Office.
European Patent Application No. 15704140.1 Communication under Rule 71(3) EPC dated Sep. 4, 2017; 6 Pages; European Patent Office.
European Patent Application No. 15704140.1 Reply of the patent proprietor to the notice(s) of opposition dated Apr. 12, 2019; 31 Pages; European Patent Office.
European Patent Application No. 15705416.4 Communication under Rule 71(3) EPC dated Sep. 6, 2017; 6 Pages; European Patent Office.
European Patent Application No. 15705416.4 Decision to grant a European patent dated Feb. 1, 2018; 2 Pages; European Patent Office.
European Patent Application No. 15705416.4 Notice of opposition dated Nov. 28, 2018; 47 Pages; European Patent Office.
European Patent Application No. 15705416.4 Reply of the patent proprietor to the notice(s) of opposition dated Apr. 18, 2019; 34 Pages; European Patent Office.
European Patent Application No. 15705416.4 Summons to attend oral proceedings pursuant to Rule 115(1) EPC dated Oct. 19, 2020; 21 Pages; European Patent Office.
European Patent Application No. 17193428.4 Office Action dated Mar. 6, 2019; 7 Pages; European Patent Office.
European Patent Application No. 17193428.4 Office Action dated Mar. 31, 2020; 7 Pages; European Patent Office.
European Patent Application No. 17193428.4 Office Action dated Sep. 4, 2019; 11 Pages; European Patent Office.
European Patent Application No. 17193428.4 Office Action dated Sep. 11, 2020; 4 Pages; European Patent Office.
European Patent Application No. 20174468.7 Extended European Search Report dated Oct. 20, 2020; 10 pages; European Patent Office.
Extended European Search Report and Search Opinion; 17193428.4; dated May 16, 2018; 12 pages; European Patent Office.
Gross, Timothy Michael, "Corning Incorporated", (A10) Opposition against EP3099642, Employee Patent and Proprietary Information Agreement, 2 pages.
Gross, Timothy Michael, "Corning Bendable Glass Testing Summary", (A2) Opposition against EP3099642, Apr. 11, 2019, 3 pages.
Gross, Timothy Michael, "Corning Bendable Glass Testing Summary", (A2) Opposition against EP3099642, May 16, 2019, 4 pages.
Gross, Timothy Michael, "Witness Statement", (A1) Opposition against EP3099642, 2 pages.
Information Disclosure Statement (IDS), p. 1, filed Dec. 1, 2017 in U.S. Appl. No. 15/828,546.
Information Disclosure Statement (IDS), p. 1, filed Dec. 1, 2017 in U.S. Appl. No. 15/858,546.
Information Disclosure Statement (IDS), p. 1, filed Nov. 6, 2017 in U.S. Appl. No. 15/804,274.
Information Discolsure Statement (IDS), p. 1, filed Jun. 16, 2017 in U.S. Appl. No. 15/625,407.
European Patent Application No. 21166187.1, Extended European Search dated Jun. 28, 2021; 18 pages; European Patent Office.
Wang, "Introduction to Fracture Mechanics", Retrieved from https://www.researchgate.net/publication/277137659_Introduction_to_Fracture_Mechanics/link/5562ce3f08ae86c06b65f6ee/download, Apr. 30, 2010, pp. 81.
European Patent Application No. 17193428.4; Office Action dated Feb. 12, 2021; 8 Pages; European Patent Office.
Wang C. H.: "Introduction to Fracture Mechanics", Apr. 2010, pp. 1-72, Melbourne (AU) Retrieved from the Internet: URL:https://afendirojan.files.wordpress.com/201 0/04/dstogd- 0103.pdf.
International Search Report and Written Opinion of the International Searching Authority; PCT/US15/12401; dated May 12, 2015; 11 Pages; European Patent Office.
International Search Report and Written Opinion of the International Searching Authority; PCT/US15/12414; dated May 15, 2015; 12 Pages; European Patent Office.
International Search Report and Written Opinion of the International Searching Authority; PCT/US15/13234; dated May 8, 2015; 11 Pages; European Patent Office.
J. Kang, Foldable Display Technology & Market 2019, IHS Markit dated Mar. 7, 2019.
J. Skillings, "Samsung shows off Yourn flexible display," CNET, Jan. 9, 2013.
Japanese Patent Application No. 2019019474; Machine Translation of the Office Action dated Mar. 11, 2020; Japan Patent Office; 8 Pgs.
Jen-Chieh Lin, Part of employment contract of inventor, (A12) Opposition against EP3099642, 2 pages.
Korean Patent Application No. 10-2019-7005728 Notice of Allowance dated Jan. 31, 2020; 3 pages; Korean Patent Office.
Korean Patent Application No. 10-2019-7005728 Office Action dated Mar. 3, 2019; 7 Pages; Korean Patent Office.

(56) References Cited

OTHER PUBLICATIONS

Korean Patent Application No. 10-2020-7005332 Grant of Patent dated Oct. 28, 2020; 5 Pages; Korean Patent Office.

Matthewson, M.J., Kurkjian, C.R., Gulati, S.T., 1986. Strength Measurement of Optical Fibers by Bending. J Am Ceram Soc 69, 815-821.

NineSigma About Us—Solution Providers available at www.ninesigma.com/about-us/solution-providers/.

NineSigma Inc., Samsung Display Launches Gallery on NineSigma's Open Innovation Social Media Platform, PR Newswire, Mar. 11, 2013.

Ninesigma, Request for Proposal No. 68292, Solutions to Protect Ultra Bendable Thin Layers from Scratches and Punctures, available at least as early as Response Due Date of May 14, 2012.

Nordberg et al., "Strengthening by Ion Exchange", Journal of The American Ceramic Society, (A3) Opposition against EP3099642, vol. 47, No. 5, May 1964, pp. 215-219.

Patent Prosecution History, U.S. Appl. No. 15/398,372, Response to Office Action dated Oct. 29, 2017.

Pei-Lien Tseng, Part of employment contract of inventor, (A13) Opposition against EP3099642, 2 pages.

Plastic Products, Inc. (http://www.plastic-products.com/part12.htm).

Rene Gy, "Ion exchange for glass strengthening", Materials Science and Engineering B, vol. 149, 2008, pp. 159-165.

Robert Bumiu Lee, "Corning Incorporated", (A7) Opposition against EP3099642, Employee Patent and Proprietary Information Agreement, 3 pages.

Samsung Newsroom, "IMID 2007," Aug. 27, 2007 [original followed by unofficial English Translation].

Sean Hollister, Folding Glass: How, Why, and the Truth of Samsung's Z Flip, The Verge, Feb. 19, 2020, available at www.theverge.com/2020/2/19/21142728/samsung-foldable-glass-galaxy-zflip-e-xplained-schott-corning.

Smedskjaer et al., "Sodium diffusion in boroaluminosilicate glasses", Journal of Non-Crystalline Solids, (A5) Opposition against EP3099642, vol. 357, 2011, pp. 3744-3750.

Statement from Taiwanese attorney on Taiwan employment Contracts, Right of Priority with respect to U.S. Appl. Nos. 61/932,924, and 62/090,604, filed Mar. 26, 2019, 3 pages.

Suresh T. Gulati, Jamie Westbrook, Stephen Carley, Hemanth Vepakomma and Toshihiko Ono (Corning Inc.), Two Point Bending of Thin Glass Substrate, 42 SOC'Y Info. Display 652 (2011).

Taiwan Search Report 104103084 dated Jun. 15, 2016.

Tseng Pei-Lien, "Employee Intellectual Property Agreement", (A15) Opposition against EP3099642, 4 pages.

Korean Patent Application No. 10-2021-7002579 ,Office Action dated Aug. 10, 2021, 5 page ( 2 pages of English Translation and 3 pages of Original Document); Korean Patent Office.

Chinese Patent Application No. 202010259660.7, Office Action dated Feb. 25, 2022, 18 pages (9 pages of English Translation and 9 pages of original document), Chinese Patent Office.

\* cited by examiner

BENDABLE GLASS STACK ASSEMBLIES, ARTICLES AND METHODS OF MAKING THE SAME

RELATED APPLICATIONS

This application is a divisional of and claims the benefit of priority to U.S. application Ser. No. 16/162,901, filed on Oct. 17, 2018, which in turn, is a divisional of and claims the benefit of priority to U.S. application Ser. No. 15/843,346, filed on Dec. 15, 2017, now U.S. Pat. No. 10,809,766, issued on Oct. 20, 2020, which in turn, claims the benefit of priority of U.S. application Ser. No. 15/398,372, filed on Jan. 4, 2017, now U.S. Pat. No. 9,898,046, issued on Feb. 20, 2018, which in turn, claims the benefit of priority of U.S. application Ser. No. 15/072,027, filed on Mar. 16, 2016, now U.S. Pat. No. 9,557,773, issued on Jan. 31, 2017, which in turn, claims the benefit of priority of U.S. Pat. No. 9,321,678, issued on Apr. 26, 2016, which in turn, claims the benefit of priority of U.S. Provisional Application Ser. No. 61/932,924, 61/974,732, and 62/090,604, filed on Jan. 29, 2014, Apr. 3, 2014, and Dec. 11, 2014, respectively, the contents of each of which are relied upon and incorporated herein by reference in their entireties.

TECHNICAL FIELD

The disclosure generally relates to glass stack assemblies, elements and layers and various methods for making them. More particularly, the disclosure relates to bendable and puncture-resistant versions of these components and methods for making them.

BACKGROUND

Flexible versions of products and components that are traditionally rigid in nature are being conceptualized for new applications. For example, flexible electronic devices can provide thin, lightweight and flexible properties that offer opportunities for new applications, for example curved displays and wearable devices. Many of these flexible electronic devices require flexible substrates for holding and mounting the electronic components of these devices. Metal foils have some advantages including thermal stability and chemical resistance, but suffer from high cost and a lack of optical transparency. Polymeric foils have some advantages including resistance to fatigue failure, but suffer from marginal optical transparency, lack of thermal stability and limited hermeticity.

Some of these electronic devices also can make use of flexible displays. Optical transparency and thermal stability are often important properties for flexible display applications. In addition, flexible displays should have high fatigue and puncture resistance, including resistance to failure at small bend radii, particularly for flexible displays that have touch screen functionality and/or can be folded.

Conventional flexible glass materials offer many of the needed properties for flexible substrate and/or display applications. However, efforts to harness glass materials for these applications have been largely unsuccessful to date. Generally, glass substrates can be manufactured to very low thickness levels (<25 µm) to achieve smaller and smaller bend radii. These "thin" glass substrates suffer from limited puncture resistance. At the same time, thicker glass substrates (>150 µm) can be fabricated with better puncture resistance, but these substrates lack suitable fatigue resistance and mechanical reliability upon bending. Thus, there is a need for glass materials, components and assemblies for reliable use in flexible substrate and/or display applications and functions, particularly for flexible electronic device applications.

SUMMARY

According to one aspect, a stack assembly is provided that comprises: a glass element having a thickness from about 25 µm to about 125 µm, a first primary surface, and a second primary surface, the glass element further comprising: (a) a first glass layer having a first primary surface; and (b) a compressive stress region extending from the first primary surface of the glass layer to a first depth in the glass layer, the region defined by a compressive stress of at least about 100 MPa at the first primary surface of the layer. The glass element is characterized by: (a) an absence of failure when the element is held at a bend radius from about 3 mm to about 20 mm for at least 60 minutes at about 25° C. and about 50% relative humidity; (b) a puncture resistance of greater than about 1.5 kgf when the second primary surface of the element is supported by (i) an approximately 25 µm thick pressure-sensitive adhesive having an elastic modulus of less than about 1 GPa and (ii) an approximately 50 µm thick polyethylene terephthalate layer having an elastic modulus of less than about 10 GPa, and the first primary surface of the element is loaded with a stainless steel pin having a flat bottom with a 200 µm diameter; and (c) a pencil hardness of greater than or equal to 8 H.

According to one implementation, a foldable electronic device is provided that includes an electronic device having a foldable feature. The foldable feature includes a stack assembly according to the first aspect. In certain aspects, the foldable feature can include a display, printed circuit board, housing and other features of the electronic device.

In some embodiments, the glass element can further comprise one or more additional glass layers and one or more respective compressive stress regions disposed beneath the first glass layer. For example, the glass element can comprise two, three, four or more additional glass layers with corresponding additional compressive stress regions beneath the first glass layer.

According to an additional aspect, a glass article is provided that comprises: a glass layer having a thickness from about 25 µm to about 125 µm, the layer further comprising: (a) a first primary surface; (b) a second primary surface; and (c) a compressive stress region extending from the first primary surface of the glass layer to a first depth in the glass layer, the region defined by a compressive stress of at least about 100 MPa at the first primary surface of the layer. The glass layer is characterized by: (a) an absence of failure when the layer is held at a bend radius from about 3 mm to about 20 mm for at least 60 minutes at about 25° C. and about 50% relative humidity; (b) a puncture resistance of greater than about 1.5 kgf when the second primary surface of the layer is supported by (i) an approximately 25 µm thick pressure-sensitive adhesive having an elastic modulus of less than about 1 GPa and (ii) an approximately 50 µm thick polyethylene terephthalate layer having an elastic modulus of less than about 10 GPa, and the first primary surface of the layer is loaded with a stainless steel pin having a flat bottom with a 200 µm diameter; and (c) a pencil hardness of greater than or equal to 8 H.

In certain aspects, the glass article may further include a glass structure having a thickness greater than the thickness of the glass layer and two substantially parallel edge surfaces, the structure comprising the glass layer, wherein the layer is arranged in a central region of the structure between the substantially parallel edge surfaces.

In some embodiments, the glass layer comprises an alkali-free or alkali-containing aluminosilicate, borosilicate, boroaluminosilicate, or silicate glass composition. The thickness of the glass layer can also range from about 50 μm to about 100 μm. The thickness can range from 60 μm to about 80 μm, according to some aspects.

In some embodiments, the bend radius of the glass element or the glass layer can be from about 3 mm to about 20 mm. In other aspects, the bend radius can be from about 3 mm to about 10 mm. The bend radius of the glass layer can be from about 1 mm to about 5 mm in some embodiments. Further, the bend radius can also be from about 5 mm to about 7 mm.

According to certain aspects, the stack assembly can further comprise a second layer having a low coefficient of friction disposed on the first primary surface of the glass element or layer. According to certain aspects, the second layer can be a coating comprising a fluorocarbon material selected from the group consisting of thermoplastics and amorphous fluorocarbons. The second layer can also be a coating comprising one or more of the group consisting of a silicone, a wax, a polyethylene, a hot-end, a parylene, and a diamond-like coating preparation. Further, the second layer can be a coating comprising a material selected from the group consisting of zinc oxide, molybdenum disulfide, tungsten disulfide, hexagonal boron nitride, and aluminum magnesium boride. According to some embodiments, the second layer can be a coating comprising an additive selected from the group consisting of zinc oxide, molybdenum disulfide, tungsten disulfide, hexagonal boron nitride, and aluminum magnesium boride.

In some aspects, the compressive stress in the compressive stress region at the first primary surface is from about 600 MPa to 1000 MPa. The compressive stress region can also include a maximum flaw size of 5 μm or less at the first primary surface of the glass layer. In certain cases, the compressive stress region comprises a maximum flaw size of 2.5 μm or less, or even as low as 0.4 μm or less.

In other aspects, the compressive stress region comprises a plurality of ion-exchangeable metal ions and a plurality of ion-exchanged metal ions, the ion-exchanged metal ions selected so as to produce compressive stress. In some aspects, the ion-exchanged metal ions have an atomic radius larger than the atomic radius of the ion-exchangeable metal ions. According to another aspect, the glass layer can further comprise a core region, and a first and a second clad region disposed on the core region, and further wherein the coefficient of thermal expansion for the core region is greater than the coefficient of thermal expansion for the clad regions.

According to an additional aspect, a glass article is provided that comprises: a glass layer having a thickness, a first primary surface, and a second primary surface. The glass layer is characterized by: (a) an absence of failure when the layer is held at a bend radius from about 1 mm to about 5 mm for at least 60 minutes at about 25° C. and about 50% relative humidity; (b) a puncture resistance of greater than about 1.5 kgf when the second primary surface of the layer is supported by (i) an approximately 25 μm thick pressure-sensitive adhesive having an elastic modulus of less than about 1 GPa and (ii) an approximately 50 μm thick polyethylene terephthalate layer having an elastic modulus of less than about 10 GPa, and the first primary surface of the layer is loaded with a stainless steel pin having a flat bottom with a 200 μm diameter; and (c) a pencil hardness of greater than or equal to 8 H. The glass article also includes a glass structure having a thickness greater than the thickness of the glass layer and two substantially parallel edge surfaces. The structure includes the glass layer, and the layer is arranged in a central region of the structure between the substantially parallel edge surfaces. In some aspects, the thickness of the glass structure may be equal to or greater than 125 μm. In an additional aspect, the thickness of the glass layer may be set from about 20 μm to about 125 μm to achieve the bend radius. According to an exemplary embodiment, the thickness of the glass layer can be set from about 20 μm to about 30 μm to achieve the bend radius.

According to a further aspect, a method of making a stack assembly is provided that comprises the steps: forming a first glass layer having a first primary surface, a compressive stress region extending from the first primary surface of the glass layer to a first depth in the glass layer, and a final thickness, wherein the region is defined by a compressive stress of at least about 100 MPa at the first primary surface of the layer; and forming a glass element having a thickness from about 25 μm to about 125 μm, the element further comprising the glass layer, a first primary surface, and a second primary surface. The glass element is characterized by: (a) an absence of failure when the element is held at a bend radius from about 3 mm to about 20 mm for at least 60 minutes at about 25° C. and about 50% relative humidity; (b) a puncture resistance of greater than about 1.5 kgf when the second primary surface of the element is supported by (i) an approximately 25 μm thick pressure-sensitive adhesive having an elastic modulus of less than about 1 GPa and (ii) an approximately 50 μm thick polyethylene terephthalate layer having an elastic modulus of less than about 10 GPa, and the first primary surface of the element is loaded with a stainless steel pin having a flat bottom with a 200 μm diameter; and (c) a pencil hardness of greater than or equal to 8 H.

In some embodiments, the step of forming the first glass layer can comprise a forming process selected from the group consisting of fusion, slot drawing, rolling, redrawing and float processes, the forming process further configured to form the glass layer to the final thickness. Other forming processes can be employed depending on the final shape factor for the glass layer and/or intermediate dimensions of a glass precursor used for the final glass layer. The forming process can also include a material removal process configured to remove material from the glass layer to reach the final thickness.

According to some aspects of the method, the step of forming a compressive stress region extending from the first primary surface of the glass layer to a first depth in the glass layer comprises: providing a strengthening bath comprising a plurality of ion-exchanging metal ions having an atomic radius larger in size than the atomic radius of a plurality ion-exchangeable metal ions contained in the glass layer; and submersing the glass layer in the strengthening bath to exchange a portion of the plurality of ion-exchangeable metal ions in the glass layer with a portion of the plurality of the ion-exchanging metal ions in the strengthening bath to form a compressive stress region extending from the first primary surface to the first depth in the glass layer. In certain cases, the submersing step comprises submersing the glass layer in the strengthening bath at about 400° C. to about 450° C. for about 15 minutes to about 180 minutes.

In certain embodiments, the method can also include a step of removing about 1 μm to about 5 μm from the final thickness of the glass layer at the first primary surface after the compressive stress region is created. The removing step can be conducted such that the compressive stress region comprises a maximum flaw size of 5 μm or less at the first primary surface of the glass layer. The removing step can also be conducted such that the compressive stress region comprises a maximum flaw size of 2.5 μm or less, or even as low as 0.4 μm or less, at the first primary surface of the glass layer.

Additional features and advantages will be set forth in the detailed description which follows, and in part will be readily apparent to those skilled in the art from that description or recognized by practicing the embodiments as described herein, including the detailed description which follows, the claims, as well as the appended drawings.

It is to be understood that both the foregoing general description and the following detailed description are merely exemplary, and are intended to provide an overview or framework to understanding the nature and character of the claims. The accompanying drawings are included to provide a further understanding, and are incorporated in and constitute a part of this specification. The drawings illustrate one or more embodiments, and together with the description serve to explain principles and operation of the various embodiments. Directional terms as used herein—for example, up, down, right, left, front, back, top, bottom—are made only with reference to the figures as drawn and are not intended to imply absolute orientation.

DETAILED DESCRIPTION

Figure 1:
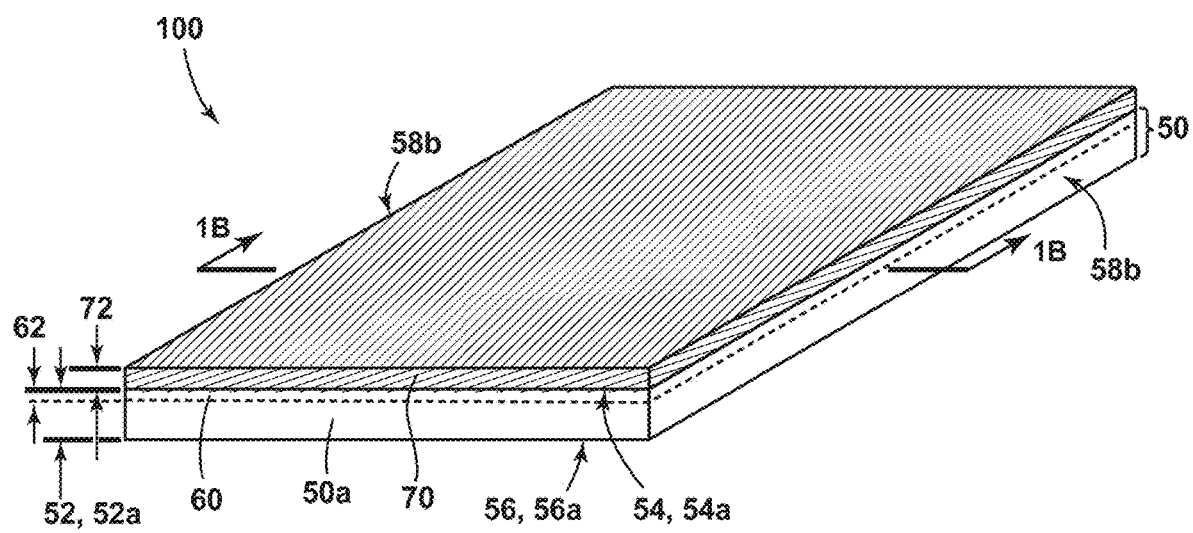
FIG. 1 is a perspective view of a stack assembly comprising a glass element with a glass layer according to an aspect of this disclosure.

Reference will now be made in detail to the present preferred embodiments, examples of which are illustrated in the accompanying drawings. Whenever possible, the same reference numerals will be used throughout the drawings to refer to the same or like parts. Ranges can be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

Among other features and benefits, the stack assemblies, glass elements and glass articles (and the methods of making them) of the present disclosure provide mechanical reliability (e.g., in static tension and fatigue) at small bend radii as well as high puncture resistance. The small bend radii and puncture resistance are beneficial when the stack assembly, glass element, and/or glass article, are used in a foldable display, for example, one wherein one part of the display is folded over on top of another portion of the display. For example, the stack assembly, glass element and/or glass article, may be used as one or more of: a cover on the user-facing portion of a foldable display, a location wherein puncture resistance is particularly important; a substrate, disposed internally within the device itself, on which electronic components are disposed; or elsewhere in a foldable display device. Alternatively, the stack assembly, glass element, and or glass article, may be used in a device not having a display, but one wherein a glass layer is used for its beneficial properties and is folded, in a similar manner as in a foldable display, to a tight bend radius. The puncture resistance is particularly beneficial when the stack assembly, glass element, and/or glass article, are used on the exterior of the device, wherein a user will interact with it.

Figure 1A:
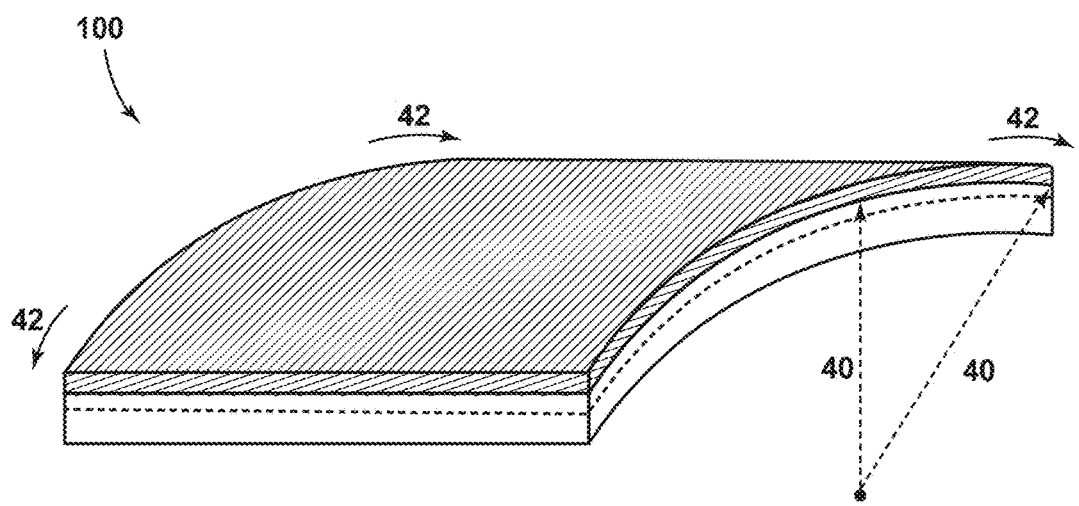
FIG. 1A is perspective view of the stack assembly depicted in FIG. 1 subjected to bending forces.
Figure 1B:
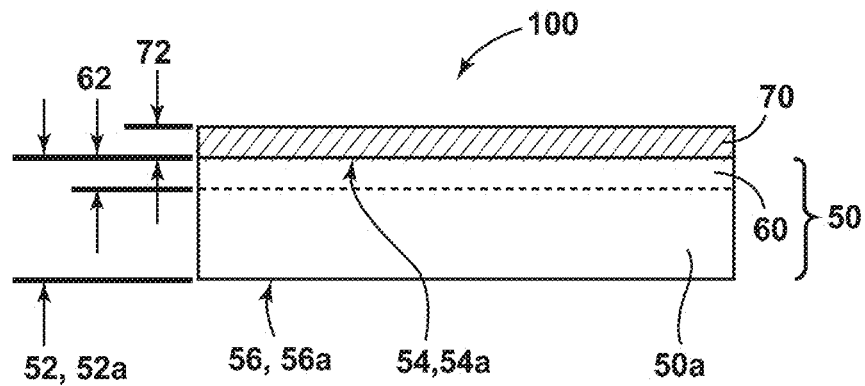
FIG. 1B is a cross-sectional view of the stack assembly depicted in FIG. 1.

Referring to FIGS. 1 and 1B, a stack assembly 100 is depicted that includes a glass element 50. Glass element 50 has a glass element thickness 52, a first primary surface 54 and a second primary surface 56. Thickness 52 can range from about 25 μm to about 125 μm in some aspects. In other aspects, thickness 52 can range from about 50 μm to about 100 μm, or about 60 μm to about 80 μm. Thickness 52 can also be set at other thicknesses between the foregoing ranges.

The glass element 50 includes a glass layer 50a with a glass layer first primary surface 54a and a glass layer second primary surface 56a. In addition, glass layer 50a also includes edges 58b, generally configured at right angles to the primary surfaces 54a and 56a. Glass layer 50a is further defined by a glass layer thickness 52a. In the aspect of stack assembly 100 depicted in FIGS. 1 and 1B, the glass element 50 includes one glass layer 50a. As a consequence, the glass layer thickness 52a is comparable to the glass element thickness 52 for stack assembly 100. In other aspects, glass element 50 can include two or more glass layers 50a (see, e.g., stack assembly 100c in FIG. 2 and the corresponding description). As such, the thickness 52a of glass layer 50a can range from about 1 μm to about 125 μm. For example, glass element 50 can include three glass layers 50a, each having a thickness 52a of about 8 μm. In this example, the thickness 52 of glass element 50 may be about 24 μm. It should also be understood, however, that glass element 50 could include other non-glass layers (e.g., compliant polymer layers) in addition to one or more glass layers 50a.

In FIGS. 1 and 1B, glass layer 50a can be fabricated from alkali-free aluminosilicate, borosilicate, boroaluminosilicate, and silicate glass compositions. Glass layer 50a can also be fabricated from alkali-containing aluminosilicate, borosilicate, boroaluminosilicate, and silicate glass compositions. In certain aspects, alkaline earth modifiers can be added to any of the foregoing compositions for glass layer 50a. In one exemplary aspect, glass compositions according to the following are suitable for the glass layer 50a: $SiO_2$ at 64 to 69% (by mol %); $Al_2O_3$ at 5 to 12%; $B_2O_3$ at 8 to 23%; MgO at 0.5 to 2.5%; CaO at 1 to 9%; SrO at 0 to 5%; BaO at 0 to 5%; $SnO_2$ at 0.1 to 0.4%; $ZrO_2$ at 0 to 0.1%; and $Na_2O$ at 0 to 1%. In another exemplary aspect, the following composition is suitable for the glass layer 50a: $SiO_2$ at ~67.4% (by mol %); $Al_2O_3$ at ~12.7%; $B_2O_3$ at ~3.7%; MgO at ~2.4%; CaO at 0%; SrO at 0%; $SnO_2$ at ~0.1%; and $Na_2O$ at ~13.7%. In a further exemplary aspect, the following composition is also suitable for the glass layer 50a: $SiO_2$ at 68.9% (by mol %); $Al_2O_3$ at 10.3%; $Na_2O$ at 15.2%; MgO at 5.4%; and $SnO_2$ at 0.2%. In some aspects, a composition for glass layer 50a is selected with a relatively low elastic modulus (compared to other alternative glasses). Lower elastic modulus in the glass layer 50a can reduce the tensile stress in the layer 50a during bending. Other criteria can be used to select the composition for glass layer 50a, including but not limited to ease of manufacturing to low thickness levels while minimizing the incorporation of flaws, ease of development of a compressive stress region to offset tensile stresses generated during bending, optical transparency, and corrosion resistance.

The glass element 50 and the glass layer 50a can adopt a variety of physical forms. From a cross-sectional perspective, the element 50 and the layer 50a (or layers 50a) can be flat or planar. In some aspects, element 50 and layer 50a can be fabricated in non-rectilinear, sheet-like forms depending on the final application. As an example, a mobile display device having an elliptical display and bezel could require a glass element 50 and layer 50a having a generally elliptical, sheet-like form.

Still referring to FIGS. 1 and 1B, the glass element 50 of the stack assembly 100 further includes a compressive stress region 60 that extends from the first primary surface 54a of the glass layer 50 to a first depth 62 in the glass layer 50. Among other advantages, the compressive stress region 60 can be employed within the glass layer 50a to offset tensile stresses generated in the glass layer 50a upon bending, particularly tensile stresses that reach a maximum near the first primary surface 54a. The compressive stress region 60 can include a compressive stress of at least about 100 MPa at the first primary surface of the layer 54a. In some aspects, the compressive stress at the first primary surface 54a is from about 600 MPa to about 1000 MPa. In other aspects, the compressive stress can exceed 1000 MPa at the first primary surface 54a, up to 2000 MPa, depending on the process employed to produce the compressive stress in the glass layer 50a. The compressive stress can also range from about 100 MPa to about 600 MPa at the first primary surface 54a in other aspects of this disclosure.

Within the compressive stress region 60, the compressive stress can stay constant, decrease or increase within the glass layer 50a as a function of depth from the first primary surface of the glass layer 54a down to the first depth 62. As such, various compressive stress profiles can be employed in compressive stress region 60. Further, the depth 62 can be set at approximately 15 μm or less from the first primary surface of the glass layer 54a. In other aspects, the depth 62 can be set such that it is approximately ⅓ of the thickness 52a of the glass layer 50a or less, or 20% of the thickness 52a of the glass layer 50a or less, from the first primary surface of the glass layer 54a.

Referring to FIGS. 1 and 1A, the glass element 50 is characterized by an absence of failure when the element is held at the bend radius 40 from about 3 mm to about 20 mm for at least 60 minutes at about 25° C. and about 50% relative humidity. As used herein, the terms "fail," "failure" and the like refer to breakage, destruction, delamination, crack propagation or other mechanisms that leave the stack assemblies, glass articles, and glass elements of this disclosure unsuitable for their intended purpose. When the glass element 50 is held at the bend radius 40 under these conditions, bending forces 42 are applied to the ends of the element 50. In general, tensile stresses are generated at the first primary surface 54 of the element 50 and compressive stresses are generated at the second primary surface 56 during the application of bending forces 42. In other aspects, glass element 50 can be configured to avoid failure for bend radii that range from about 3 mm to about 10 mm. In some aspects, the bend radius 40 can be set in a range from about 1 mm to about 5 mm. The bend radius 40 can also be set to a range from about 5 mm to 7 mm without causing a failure in the glass element 50 according to other aspects of stack assembly 100. The glass element 50 can be also characterized in some aspects by an absence of failure when the element is held at a bend radius 40 from about 3 mm to about 20 mm for at least 120 hours at about 25° C. and about 50% relative humidity. Bend testing results can vary under testing conditions with temperatures and/or humidity levels that differ from the foregoing. For example, a glass element 50 having a smaller bend radii 40 (e.g., <3 mm) may be characterized by an absence of failure in bend testing conducted at humidity levels significantly below 50% relative humidity.

The glass element 50 is also characterized by a puncture resistance of greater than about 1.5 kgf when the second primary surface 56 of the element 50 is supported by (i) an approximately 25 μm thick pressure-sensitive adhesive ("PSA") having an elastic modulus of less than about 1 GPa and (ii) an approximately 50 μm thick polyethylene terephthalate layer ("PET") having an elastic modulus of less than about 10 GPa, and the first primary surface 54 of the element 50 is loaded with a stainless steel pin having a flat bottom with a 200 μm diameter. Typically, puncture testing according to aspects of this disclosure is performed under displacement control at 0.5 mm/min cross-head speed. In certain aspects, the stainless steel pin is replaced with a new pin after a specified quantity of tests (e.g., 10 tests) to avoid bias that could result from deformation of the metal pin associated with the testing of materials possessing a higher elastic modulus (e.g., glass element 50). In some aspects, the glass element 50 is characterized by a puncture resistance of greater than about 1.5 kgf at a 5% or greater failure probability within a Weibull plot. The glass element 50 can also be characterized by a puncture resistance of greater than about 3 kgf at the Weibull characteristic strength (i.e., a 63.2% or greater). In certain aspects, the glass element 50 of the stack assembly 100 can resist puncture at about 2 kgf or greater, 2.5 kgf or greater, 3 kgf or greater, 3.5 kgf or greater, 4 kgf or greater, and even higher ranges. The glass element 50 is also characterized by a pencil hardness of greater than or equal to 8 H.

Referring again to FIGS. 1 and 1B, some aspects of the stack assembly 100 include a second layer 70 having a low coefficient of friction with a second layer coating thickness 72. In these configurations, the second layer 70 is disposed on the first primary surface 54 of the glass element 50. When employed in stack assembly 100 for certain applications, the second layer 70 can serve to decrease friction and/or reduce surface damage from abrasion. The second layer 70 can also provide a measure of safety in retaining pieces and shards of glass element 50 and/or layer 50*a* when the element and/or layer has been subjected to stresses in excess of its design limitations that cause failure. The thickness 72 of the second layer 70 can be set at 1 micrometer (μm) or less in some aspects. In other aspects, the second layer 70 can be set at 500 nm or less, or as low as 10 nm or less for certain compositions. Further, in some aspects of stack assembly 100, an additional layer 70 can be employed on the primary surface 56 to provide a safety benefit in retaining shards of glass element 50 and/or layer 50*a* that have resulted from stresses in excess of their design requirements.

Second layer 70 can employ various fluorocarbon materials that are known to have low surface energy, including thermoplastics for example, polytetrafluoroethylene ("PTFE"), fluorinated ethylene propylene ("FEP"), polyvinylidene fluoride ("PVDF"), and amorphous fluorocarbons (e.g., DuPont® Teflon® AF and Asahi® Cytop® coatings) which typically rely on mechanical interlocking mechanisms for adhesion. Second layer 70 can also be fabricated from silane-containing preparation for example, Dow Corning® 2634 coating or other fluoro- or perfluorosilanes (e.g., alkylsilanes) which can be deposited as a monolayer or a multilayer. In some aspects, second layer 70 can include silicone resins, waxes, polyethylene (oxided) used by themselves or in conjunction with a hot-end coating for example, tin oxide, or vapor-deposited coatings for example, parylene and diamond-like coatings ("DLCs"). Second layer 70 can also include zinc oxide, molybdenum disulfide, tungsten disulfide, hexagonal boron nitride, or aluminum magnesium boride that can be used either alone or as an additive in the foregoing coating compositions and preparations.

Alternatively or in addition to the above, the second layer 70 may include various other attributes, such as anti-microbial, anti-splinter, anti-smudge, and anti-fingerprint.

In some aspects, the stack assembly 100 can include a glass element 50 having a compressive stress region 60 with a maximum flaw size of 5 μm or less at the first primary surface 54*a* of the glass layer 50. The maximum flaw size can also be held to 2.5 μm or less, 2 μm or less, 1.5 μm or less, 0.5 μm or less, 0.4 μm or less, or even smaller flaw size ranges. Reducing the flaw size in the compressive stress region of the glass element 50, the layer 50*a* and/or the layers 50*a* can further reduce the propensity of these elements and/or layers to fail by crack propagation upon the application of tensile stresses by virtue of bending forces, for example, bending forces 42 (see FIG. 1A). In addition, some aspects of stack assembly 100 can include a surface region with a controlled flaw size distribution (e.g., flaw sizes of 0.5 μm or less at the first primary surface 54*a* of the glass layer 50*a*) that also lacks the superposition of a compressive stress region.

Referring again to FIG. 1A, bending forces 42 applied to the stack assembly 100 result in tensile stresses at the first primary surface 54 of the glass element 50. Tighter bending radii 40 lead to higher tensile stresses. Equation (1) below can be used to estimate the maximum tensile stresses in the stack assembly 100, particularly at the first primary surface 54 of the glass element 50, subjected to bending with a constant bend radius 40. Equation (1) is given by:

$$\sigma_{max} = \frac{E}{1-\nu^2} \frac{h}{2} \frac{1}{R} \qquad (1)$$

where E is the Young's modulus of the glass element 50, ν is the Poisson's ratio of the glass element 50 (typically ν is ~0.2-0.3 for most glass compositions), h is reflective of the thickness 52 of the glass element, and R is the bend radius of curvature (comparable to bend radius 40). Using Equation (1), it is apparent that maximum bending stresses are linearly dependent on the thickness 52 of the glass element and elastic modulus, and inversely dependent on the bend radius 40 of curvature of the glass element.

The bending forces 42 applied to the stack assembly 100 could also result in the potential for crack propagation leading to instantaneous or slower, fatigue failure mechanisms. The presence of flaws at the first primary surface 54, or just beneath the surface, of the element 50 can contribute to these potential failure modes. Using Equation (2) below, it is possible to estimate the stress intensity factor in a glass element 50 subjected to bending forces 42. Equation (2) is given by:

$$K = Y\sigma\sqrt{\pi a} = \frac{YE}{1-v^2}\frac{h}{2}\frac{1}{R}\sqrt{\pi a} \quad (2)$$

where a is the flaw size, Y is a geometry factor (generally assumed to be 1.12 for cracks emanating from a glass edge, a typical failure mode), and a is the bending stress associated with the bending forces 42 as estimated using Equation (1). Equation (2) assumes that the stress along the crack face is constant, which is a reasonable assumption when the flaw size is small (e.g., <1 μm). When the stress intensity factor K reaches the fracture toughness of the glass element 50, $K_{IC}$, instantaneous failure will occur. For most compositions suitable for use in glass element 50, $K_{IC}$ is ~0.7 MPa√m. Similarly, when K reaches a level at or above a fatigue threshold, $K_{threshold}$, failure can also occur via slow, cyclic fatigue loading conditions. A reasonable assumption for $K_{threshold}$ is ~0.2 MPa√m. However, $K_{threshold}$ can be experimentally determined and is dependent upon the overall application requirements (e.g., a higher fatigue life for a given application can increase $K_{threshold}$). In view of Equation (2), the stress intensity factor can be reduced by reducing the overall tensile stress level and/or the flaw size at the surface of the glass element 50.

According to some aspects of stack assembly 100, the tensile stress and stress intensity factor estimated through Equations (1) and (2) can be minimized through the control of the stress distribution at the first primary surface 54 of the glass element 50. In particular, a compressive stress profile (e.g., a compressive stress region 60) at and below the first primary surface 54 is subtracted from the bending stress calculated in Equation (1). As such, overall bending stress levels are reduced which, in turn, also reduces the stress intensity factors that can be estimated through Equation (2).

In some implementations, a foldable electronic device with a foldable feature can include the stack assembly 100. The foldable feature, for example, can be a display, printed circuit board, housing or other features associated with the electronic device. When the foldable feature is a display, for example, the stack assembly 100 can be substantially transparent. Further, the stack assembly 100 can have pencil hardness, bend radius and/or puncture resistance capabilities as described in the foregoing. In one exemplary implementation, the foldable electronic device is a wearable electronic device, such as a watch, wallet or bracelet, that includes or otherwise incorporates the stack assembly 100 described according to the foregoing. As defined herein, "foldable" includes complete folding, partial folding, bending, flexing, and multiple-fold capabilities.

Figure 1C:
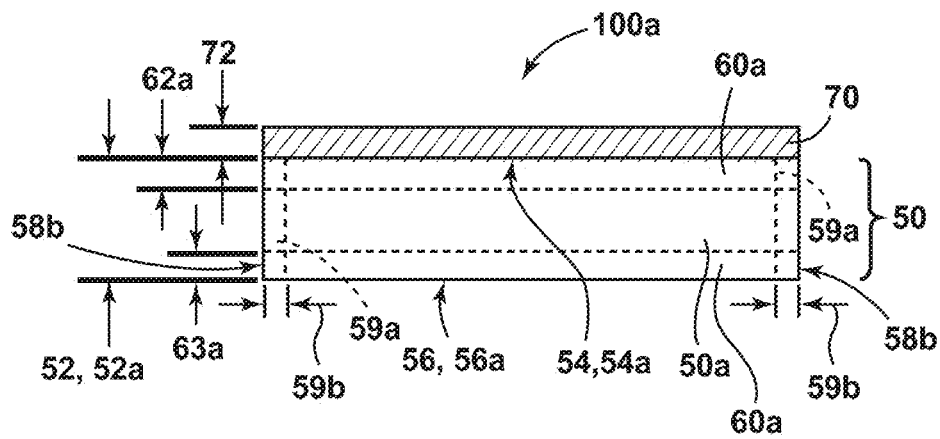
FIG. 1C is a cross-sectional view of a stack assembly comprising a glass element with compressive stress regions formed by an ion exchange process according to a further aspect of this disclosure.

Referring to FIG. 1C, a cross-section of a stack assembly 100*a* is depicted that relies on an ion exchange process to develop a compressive stress region 60*a*. Stack assembly 100*a* is similar to the stack assembly 100 depicted in FIGS. 1-1B, and like-numbered elements have comparable structure and function. In stack assembly 100*a*, however, the compressive stress region 60*a* of the glass element 50 can be developed through an ion exchange process. That is, the compressive stress region 60*a* can include a plurality of ion-exchangeable metal ions and a plurality of ion-exchanged metal ions, the ion-exchanged metal ions selected so as to produce compressive stress in the region 60*a*. In some aspects of stack assembly 100*a*, the ion-exchanged metal ions have an atomic radius larger than the atomic radius of the ion-exchangeable metal ions. The ion-exchangeable ions (e.g., $Na^+$ ions) are present in the glass element 50 and the layer 50*a* before being subjected to the ion exchange process. Ion-exchanging ions (e.g., $K^+$ ions) can be incorporated into the glass element 50 and layer 50*a*, replacing some of the ion-exchangeable ions. The incorporation of ion-exchanging ions, for example, $K^+$ ions, into the glass element 50 and the layer 50*a* can be effected by submersing the element or the layer in a molten salt bath containing ion-exchanging ions (e.g., molten $KNO_3$ salt). In this example, the $K^+$ ions have a larger atomic radius than the $Na^+$ ions and tend to generate local compressive stresses in the glass wherever present.

Depending on the ion-exchanging process conditions employed, the ion-exchanging ions can be imparted from the first primary surface 54*a* down to a first ion exchange depth 62*a*, establishing an ion exchange depth-of-layer ("DOL") for the compressive stress region 60*a*. Similarly, a second compressive stress region 60*a* can be developed from the second primary surface 56*a* down to a second ion exchange depth 63*a* as depicted in FIG. 1C. Compressive stress levels within the DOL that far exceed 100 MPa can be achieved with such ion exchange processes, up to as high as 2000 MPa. As noted earlier, the compressive stress levels in the compressive stress region 60*a* (and a second region 60*a* when present) can serve to offset the tensile stresses generated in the stack assembly 100*a*, glass element 50 and glass layer 50*a* generated from bending forces 42.

Referring again to FIG. 1C, some aspects of stack assembly 100*a* can include one or more edge compressive stress regions 59*a*, each defined by a compressive stress of at least 100 MPa. An edge compressive stress region 59*a* in the glass element 50 can be established from an edge 58*b* down to an edge depth 59*b*. Ion-exchanging processes similar in nature to those employed to generate the compressive stress region 60*a* can be deployed to generate an edge compressive stress region 59*a*. More specifically, the edge compressive stress region 59*a* can be used to offset tensile stresses generated at the edge 58*b* through, for example, bending of the glass element 50 across the face of the edge 58*b*. Alternatively, or as an addition thereto, without being bound by theory, the compress stress region 59*a* may offset adverse effects from an impact or abrasion event at or to the edge 58*b*.

Figure 1D:
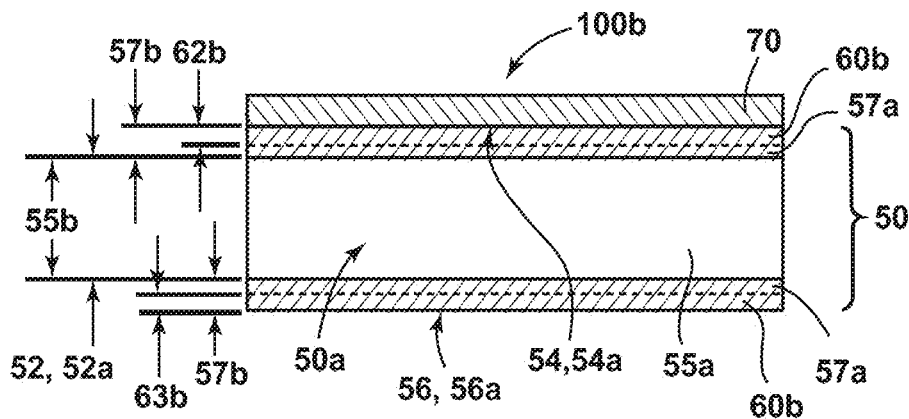
FIG. 1D is a cross-sectional view of a stack assembly comprising a glass element having a glass layer with a core region and two clad regions according to an aspect of this disclosure.

In FIG. 1D, a stack assembly 100*b* is depicted that relies on a mismatch in the coefficient of thermal expansion ("CTE") between regions of the glass layer 50*a* to develop compressive stress regions 60*b*. Stack assembly 100*b* is similar to the stack assembly 100 depicted in FIGS. 1-1B, and like-numbered elements have comparable structure and function. In stack assembly 100*b*, however, the compressive stress regions 60*b* of the glass element 50 can be developed via the tailored structure of glass layer 50*a* which relies on CTE differences within the layer 50*a* itself. In particular, the glass layer 50a includes a core region 55a and a first and a second clad region 57a disposed on the core region 55a. Notably, the CTE of the core region 55a is greater than the CTE of the clad regions 57a. After the glass layer 50a is cooled during fabrication, the CTE differences between the core region 55a and the clad regions 57a cause uneven volumetric contraction upon cooling, leading to the development of compressive stress regions 60b in the clad regions 57a, below the respective first and second primary surfaces 54a and 56a as shown in FIG. 1D. Put another way, the core region 55a and the clad regions 57a are brought into intimate contact with one another at high temperatures; and regions 55a and 57a are then cooled to a low temperature such that the greater volume change of the high CTE core region 55a relative to the low CTE clad regions 57a creates the compressive stress regions 60b in the clad regions 57a.

Referring again to FIG. 1D, the CTE-developed compressive stress regions 60b reach from the first primary surface of the glass layer 54a down to a CTE region depth 62b, and from the second primary surface 56a down to a CTE region depth 63b, thus establishing CTE-related DOLs. In some aspects, the compressive stress levels in the compressive stress regions 60b can exceed 150 MPa. Maximizing the difference in CTE values between the core region 55a and the clad regions 57a can increase the magnitude of the compressive stress developed in the compressive stress regions 60b upon cooling of the element 50 after fabrication.

In some aspects of stack assembly 100b, the core region 55a has a core region thickness 55b and the clad regions 57a have a clad thickness 57b as shown in FIG. 1D. In these aspects, it is preferable to set a thickness ratio of greater than or equal to 3 for the core region thickness 55b divided by the sum of the clad region thicknesses 57b. As such, maximizing the size of the core region 55a and/or its CTE relative to the size and/or CTE of the clad regions 57a can serve to increase the magnitude of the compressive stress levels observed in the compressive stress regions 60b of the stack assembly 100b.

Figure 2:
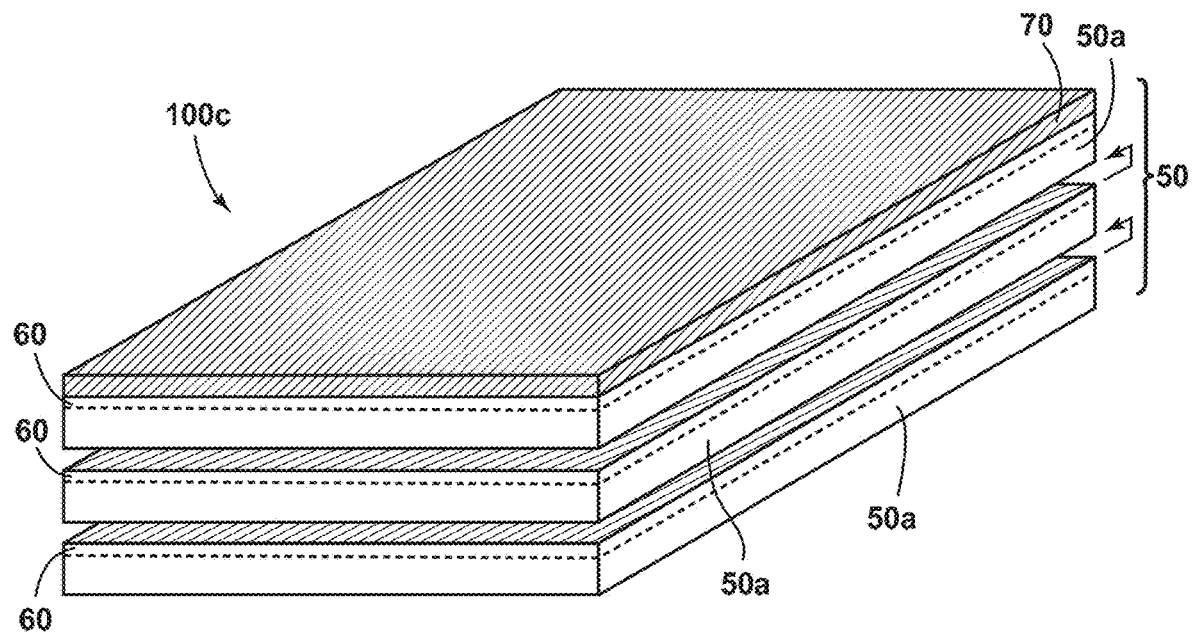
FIG. 2 is a perspective view of a stack assembly comprising a glass element with three glass layers according a further aspect of this disclosure.

According to another aspect, FIG. 2 depicts a stack assembly 100c with a glass element 50 having multiple glass layers 50a (e.g., two layers 50a, three layers 50a, four layers 50a, and so on). As shown in FIG. 2, the three glass layers 50a, stacked together, make up the glass element 50. A compressive stress region 60 can be present in each layer 50a as shown in FIG. 2. The layers 50a can be stacked directly together or, in some aspects, compliant interlayers can be disposed between them. Further, in some aspects of stack assembly 100c, a compressive stress region 60 is not required in all layers 50a within the glass element 50. Preferably, a compressive stress region 60 is present in the topmost layer 50a of the element 50. In addition, it is also preferable in some aspects to include edge compressive stress regions 59a (see FIG. 1C and the corresponding description), compressive stress regions 60a (see FIG. 1C and the corresponding description), and/or compressive stress regions 60b (see FIG. 1D and the corresponding description) in one or more layers 50a.

Figure 2A:
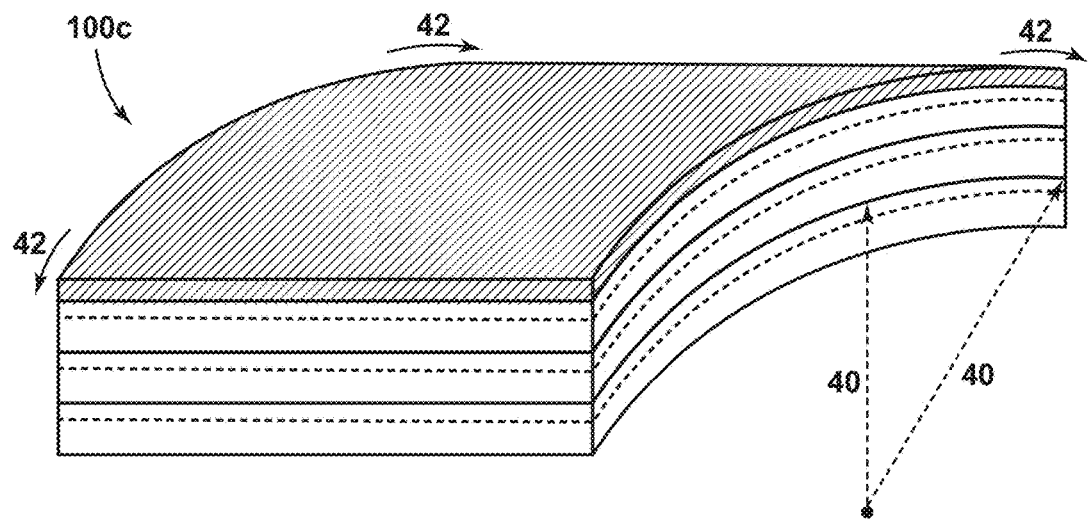
FIG. 2A is a perspective view of the stack assembly depicted in FIG. 2 subjected to bending forces.

In general, the layers 50a of the stack assembly 100c are configured to allow movement with respect to one another upon bending of the glass element 50 (see FIG. 2A); or the layers 50a are loosely coupled to one another. The collective thickness of the glass element 50 obtained through the stacking of layers 50a can increase the resistance of the element 50 to puncture, as each layer 50a supports the layer above it. Further, the ability of the glass layers 50a to move relative to one another during bending reduces the amount of tensile stress generated in each layer 50a upon bending to a bend radius 40. This is because the thickness of each layer 50a (rather than the thickness of element 50) is the contributing factor in generating the tensile stress, as estimated by Equation (1). Because each layer 50a is generally decoupled, in terms of generating bending stresses, from its adjacent layer 50a, some aspects of the stack assembly 100c incorporate a compressive stress region 60 within each layer 50a present in the stack assembly. In certain aspects of stack assembly 100c, a second layer 70 can be disposed on the first primary surface 54 of the glass element 50 (i.e., on the first primary surface of the top-most layer 50a). A second layer 70 employed for this purpose has a comparable structure and function to the second layer 70 outlined earlier in connection with the stack assembly 100. Alternatively, or as an addition thereto, a second layer 70 may be employed: on the second primary surface of the lower-most layer 50a; and/or on one or both primary surfaces of any layer 50a in the stack assembly 100c.

Figure 3:
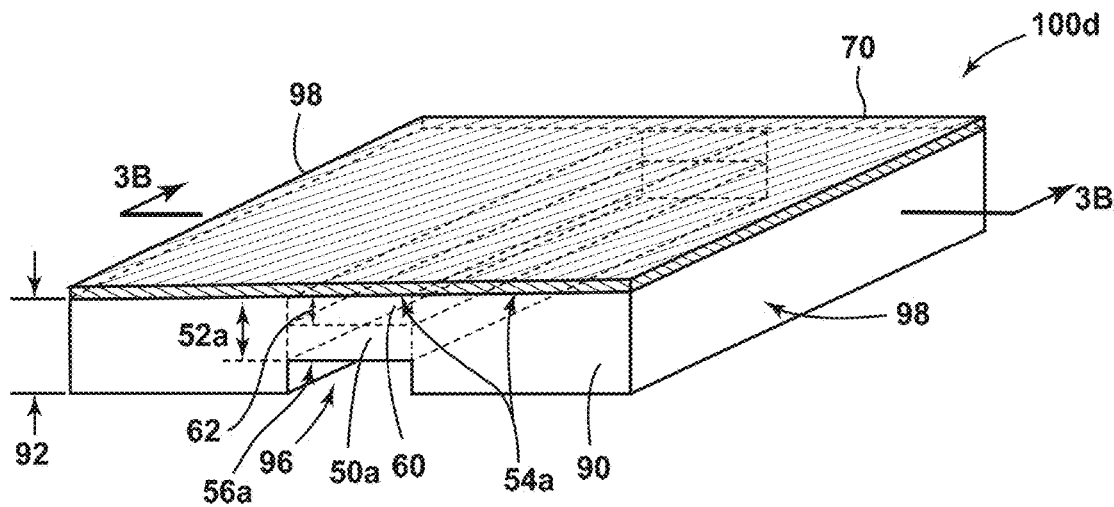
FIG. 3 is a perspective view of a stack assembly comprising a glass structure and a glass element according to an aspect of this disclosure.
Figure 3A:
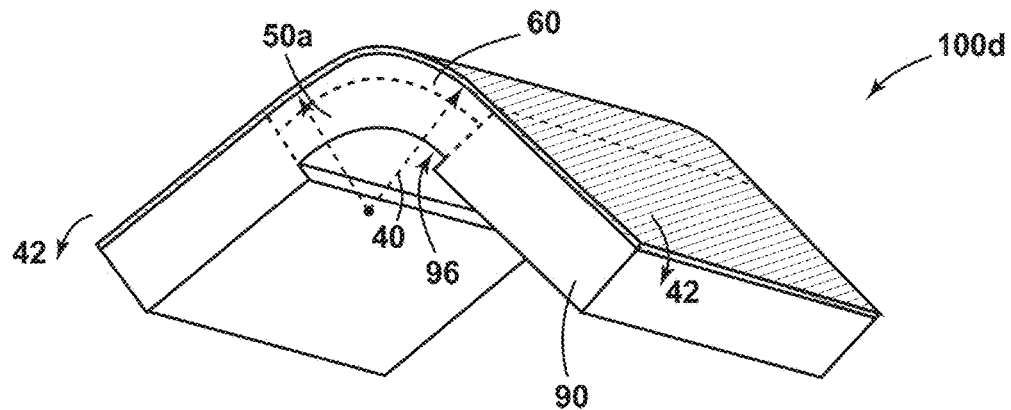
FIG. 3A is a perspective view of the stack assembly depicted in FIG. 3 subjected to bending forces.
Figure 3B:
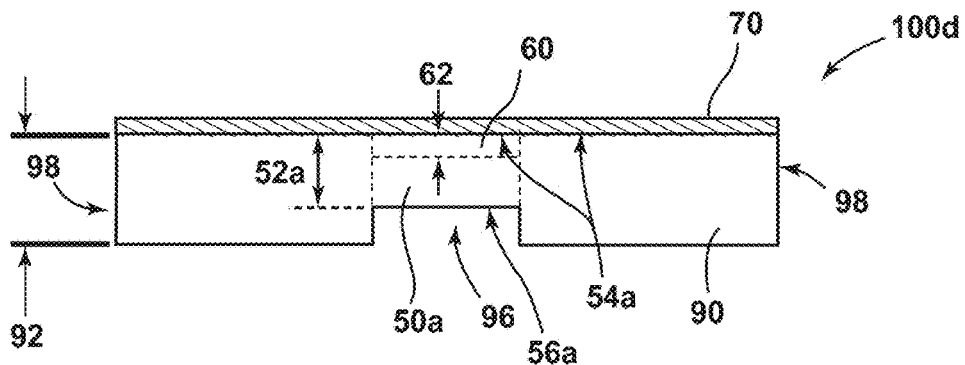
FIG. 3B is a cross-sectional view of the stack assembly depicted in FIG. 3.

Referring to FIGS. 3 and 3B, a stack assembly (or glass article) 100d is depicted according to an additional aspect of this disclosure. Stack assembly 100d includes a glass structure 90 having a thickness 92 that is greater than the thickness 52a of its glass layer 50a. Glass layer 50a includes a first primary surface 54a and a second primary surface 56a. The first primary surface 54a also can extend to the first primary surface of the glass structure 90 (see FIGS. 3 and 3B). In some aspects, the glass structure 90 has a thickness 92 that is greater than or equal to 125 μm. According to an exemplary embodiment, the thickness 52a of the glass layer can be set from about 20 μm to about 125 μm. In certain aspects of stack assembly 100d, a second layer 70 can be disposed on the first primary surface 54a of the glass layer 50a and glass structure 90. A second layer 70 employed for this purpose in the stack assembly 100d has a comparable structure and function to the second layer 70 outlined earlier in connection with the stack assembly 100.

As shown in FIGS. 3 and 3B, the glass structure 90 and the glass layer 50a of the stack assembly/glass article 100d are monolithic with regard to one another. However, in some aspects, the glass structure 90 can be a separate component that is bonded or otherwise joined to glass layer 50a. Further, in stack assembly 100d, the glass layer 50a is arranged in a central region 96 of the glass structure 90, between the substantially parallel edges 98 of the glass structure. In some aspects, and as depicted in FIGS. 3 and 3B, the glass layer 50a and central region 96 are spaced some distance from each of the parallel edges 98. In other aspects, the glass layer 50a and central region 96 can be spaced closer to one edge 98 than the other substantially parallel edge 98.

In the stack assembly (or glass article) 100d depicted in FIGS. 3 and 3B, the glass layer 50a, as incorporated into the glass structure 90, is essentially the same as the glass layer 50a described in the foregoing in connection with stack assemblies 100, 100a and 100b. As such, the glass layer 50a employed in stack assembly 100d includes a compressive stress region 60, 60a or 60b that spans from the first primary surface 54a of the glass layer 50a down to the first depth 62a. According to some aspects of the stack assembly 100d, the compressive stress region 60, 60a, or 60b within the glass layer 50a can also span laterally into the glass structure 90. While not required in all aspects, the inclusion of the compressive stress region 60, 60a or 60b throughout the glass layer 50a and the glass structure 90 can provide a manufacturability benefit. For example, an ion exchange process could be employed to develop the compressive stress region 60 or 60a in both the glass layer 50a and the glass structure 90 in one submersion step.

As shown in FIG. 3A, the stack assembly 100d (or glass article) can be subjected to bending forces 42 that bend the glass layer 50a upon a constant bend radius 40. Since the thickness 52a of the glass layer 50a is generally smaller than the thickness 92 of the glass structure 90, the bending forces 42 tend to cause bending displacements in the glass layer 50a and little or no bending in the adjacent sections of the glass structure 90. As such, the bending stress and stress intensity levels are reduced at the first primary surface 54a of the glass layer 50a by virtue of minimizing the thickness 52a to levels below the thickness 92 of the glass structure 90. Nevertheless, the increased thickness 92 of the glass structure 90 provides additional puncture resistance for the majority of the stack assembly 100d (i.e., beyond that in the central region 96 containing the glass layer 50a).

In some additional aspects of stack assembly 100d, the central region 96 beneath the glass layer 50a and second primary surface 56a can be further reinforced with a generally non-compliant, polymeric layer. This reinforcement can tend to offset any reduced puncture resistance in the glass layer 50a relative to the puncture resistance of the glass structure 90. Further, the compressive stress region 60, 60a or 60b employed in the glass layer 50a of the stack assembly 100d can be developed through the ion exchange processes and/or CTE mismatch concepts outlined earlier in connection with stack assemblies 100a and 100b (see FIGS. 1C and 1D and the corresponding description).

Figure 4:
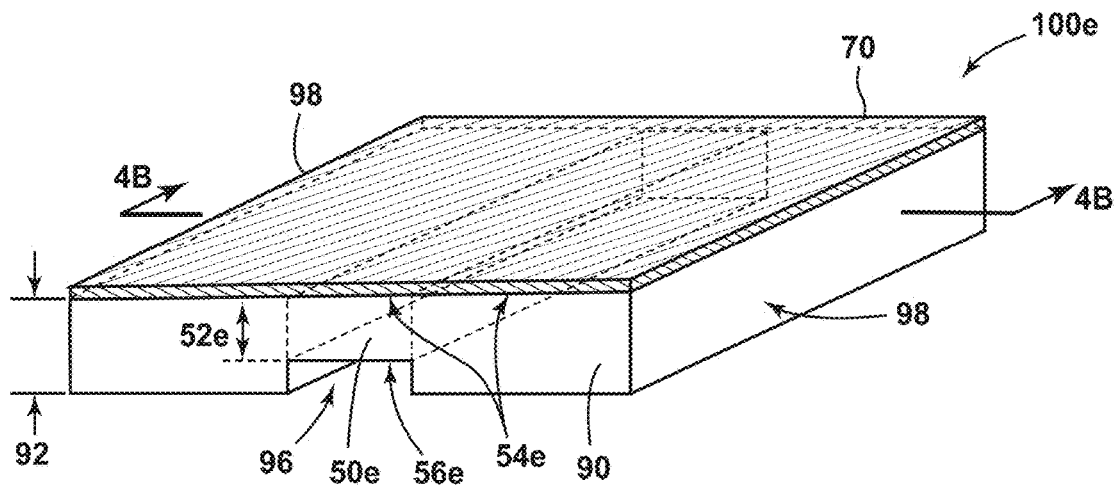
FIG. 4 is a perspective view of a stack assembly comprising a glass structure and a glass element according to an aspect of this disclosure.
Figure 4A:
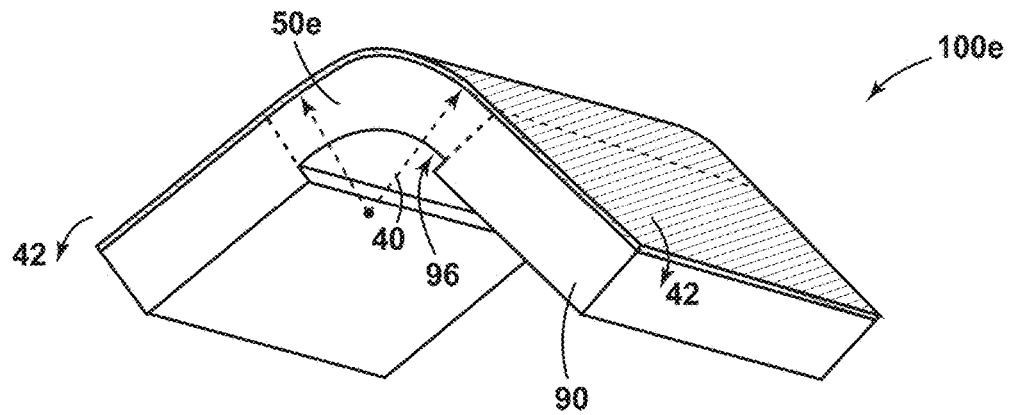
FIG. 4A is a perspective view of the stack assembly depicted in FIG. 4 subjected to bending forces.
Figure 4B:
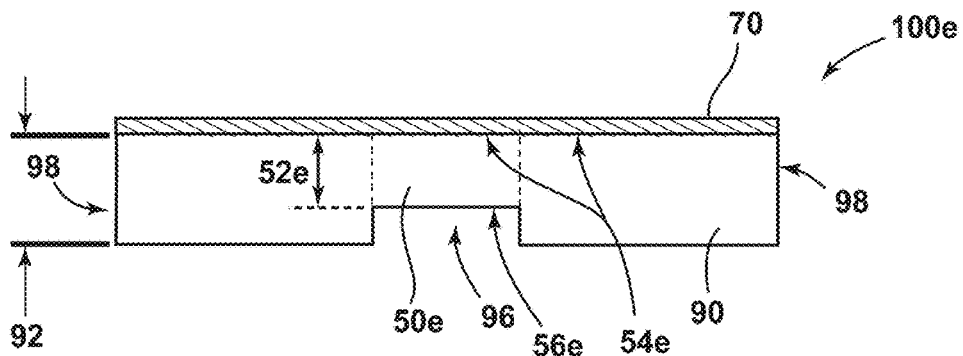
FIG. 4B is a cross-sectional view of the stack assembly depicted in FIG. 4.

As shown in FIGS. 4, 4A and 4B, a glass article or stack assembly 100e is provided that comprises: a glass layer 50e having a thickness 52e, a first primary surface 54e, and a second primary surface 56e. The first primary surface 54e also can extend to the first primary surface of the glass structure 90 (see FIGS. 4 and 4B). In some aspects, the glass structure 90 has a thickness 92 that is greater than or equal to 125 µm. According to an exemplary embodiment, the thickness 52e of the glass layer 50e can be set from about 20 µm to about 125 µm. In certain aspects of stack assembly 100e, a second layer 70 can be disposed on the first primary surface 54e of the glass layer 50e and/or on one or both primary surfaces of glass structure 90. A second layer 70 employed for this purpose in the stack assembly 100e has a comparable structure and function to the second layer 70 outlined earlier in connection with the stack assembly 100. A second layer 70 may also be disposed on the second primary surface 56e.

In the stack assembly (or glass article) 100e depicted in FIGS. 4 and 4B, the glass layer 50e, as incorporated into the glass structure 90, is essentially the same as the glass layer 50a described in the foregoing in connection with stack assemblies 100, 100a and 100b. Furthermore, the structure and arrangement of the stack assembly 100e is similar to the stack assembly 100d described earlier in connection with FIGS. 3, 3A and 3B. However, the glass layer 50e employed in stack assembly 100e does not include a compressive stress region 60.

As shown in FIG. 4A, the stack assembly 100e (or glass article) can be subjected to bending forces 42 that bend the glass layer 50e upon a constant bend radius 40. Since the thickness 52e of the glass layer 50e is generally smaller than the thickness 92 of the glass structure 90, the bending forces 42 tend to cause bending displacements in the glass layer 50e and little or no bending in the adjacent sections of the glass structure 90. As such, the bending stress and stress intensity levels are reduced at the first primary surface 54e of the glass layer 50e by virtue of minimizing the thickness 52e to levels below the thickness 92 of the glass structure 90.

In stack assembly 100e (or glass article), however, the increased thickness 92 of the glass structure 90 provides additional puncture resistance for the majority of the assembly (i.e., beyond that in the central region 96 containing the glass layer 50e). As demonstrated by the results depicted in FIG. 5, puncture resistance and glass thickness can be correlated. The results in FIG. 5 were generated by measuring the puncture resistance of various glass samples having thicknesses including 116, 102, 87, 71, 60, 49, 33 and 25 µm. These glass samples were prepared by etching 130 µm-thick glass samples to the foregoing thickness levels using an etching solution having 15 vol % HF and 15 vol % HCl. Puncture resistance testing was performed on each glass sample, as laminated to a 375 µm compliant layer stack to simulate the structure of a flexible display device. The 375 µm thick compliant layer stack consisted of the following layers: (a) a 50 µm thick PSA layer, (b) a 100 µm thick PET layer, and (c) a 100 µm thick PSA layer, and (d) a 125 µm thick PET layer. Once each glass sample (e.g., 116 µm thick glass, 102 µm thick glass, etc.) was laminated to the 375 µm thick compliant layer stack, a flat tip probe having a 200 µm diameter stainless steel tip was pushed into a primary surface of the glass sample opposite from the compliant layer stack. The tip was then advanced into the sample until failure (as verified by visual observation with an optical microscope) and the force at failure was measured (in units of kgf). The results from this testing were plotted in FIG. 5.

Figure 5:
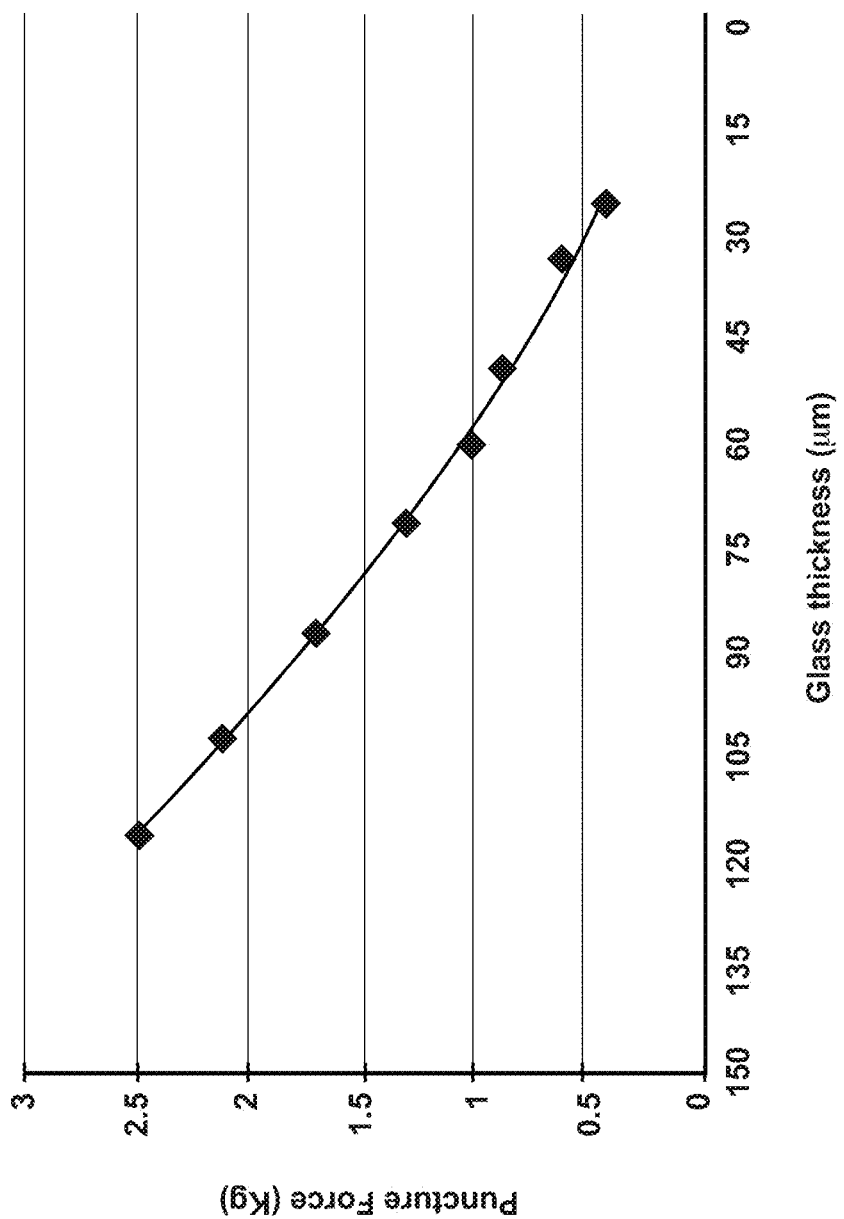
FIG. 5 is a plot of failure puncture load test data as a function of thickness of a glass layer according to an aspect of this disclosure.

As the results from FIG. 5 demonstrate, the puncture resistance of the glass samples decreased from about 2.5 kgf to about 0.4 kgf with decreasing glass layer thickness from about 116 µm to about 25 µm, respectively. Hence, the puncture resistance of these glass samples was highly dependent on glass thickness. In addition, FIG. 5 demonstrates that the puncture resistance for the tested glass substrate sample having a thickness of about 116 µm is about 2.5 kgf. It is evident through extrapolation that puncture resistance levels that can exceed 3 kgf can be obtained through the use of glass substrates having a thickness of 130 µm or greater. As such, one aspect of stack assembly 100e (see FIGS. 4, 4A and 4B) employs a glass structure 90 having a thickness of about 130 µm or greater to obtain a puncture resistance of 3 kgf (in the regions of stack assembly 100e beyond those in proximity to the central region 96 containing the thinner, glass layer 50e). In some additional aspects of the stack assembly 100e, the central region 96 beneath the glass layer 50e and second primary surface 56e can be further reinforced with a generally non-compliant, polymeric layer. This reinforcement can tend to offset any reduced puncture resistance in the glass layer 50e relative to the increased puncture resistance of the glass structure 90.

In stack assembly 100e, thickness 52e of the glass layer 50e is generally smaller than the thickness 92 of the glass structure 90. In one implementation of the stack assembly, a bend radius of ≤2 mm for the stack assembly 100e is feasible with a thickness 52e of approximately 20 to 25 µm. To obtain such thickness levels for thickness 52e, while holding the thickness 92 at a higher value to maintain puncture resistance, a selective etching process can be conducted on the stack assembly 100e.

In one example selective etching process, one step is to provide a glass structure with a substantially constant thickness equal to the thickness 92 for the glass structure 90. Coating materials are then applied on the second primary surface 56e of the glass structure 90 in regions adjacent to the intended central region 96 of the glass structure 90 (i.e., the region that will be etched to the thickness 52e) to protect or otherwise mask these regions during a subsequent etching step. For example, these materials may be a film or ink that can be coated on the glass structure 90 by lamination or screen printing processes. One of ordinary skill in the art would readily understand what type of coating materials would be suitable for a particular etchant composition selected for the selective etching process for stack assembly 100e. By applying these coating materials or the like adjacent to the central region 96, only the central region 96 will be exposed to the acid employed in a subsequent etching step. In the subsequent etching step or steps, etching solutions according to the foregoing (e.g., 15 vol % HF and 15 vol % HCl) can be applied to the masked, glass structure for an appropriate time to achieve the desired thickness 52e in the glass layer 50e. After the selective etching has been completed (including washing off the etching solution with deionized water, for example), the masking materials can be peeled or otherwise stripped using a suitable stripper solution depending on the particular masking materials employed in the selective etching process.

Referring again to the selective etching process employed to produce a stack assembly 100e, the edges 98 can be left uncoated during the etching step or steps. As a result, these edges 98 are subjected to a light etch as the glass layer 50e is formed with a thickness 52e. This light etch to edges 98 can beneficially improve their strength. In particular, cutting or singling processes employed to section the glass structure before the selective etching process is employed can leave flaws and other defects within the surface of the glass structure 90. These flaws and defects can propagate and cause glass breakage during the application of stresses to the stack assembly 100e from the application environment and usage. The selective acid etching process, by virtue of lightly etching these edges 98, can remove at least some of these flaws, thereby increasing the strength and/or fracture resistance of the edges of the stack assembly 100e.

In the stack assembly (or glass article) 100e, the glass layer 50e can be characterized by: (a) an absence of failure when the layer 50e is held at a bend radius from about 1 mm to about 5 mm for at least 60 minutes at about 25° C. and about 50% relative humidity; (b) a puncture resistance of greater than about 1.5 kgf when the second primary surface 56e of the layer 50e is supported by (i) an approximately 25 µm thick pressure-sensitive adhesive having an elastic modulus of less than about 1 GPa and (ii) an approximately 50 µm thick polyethylene terephthalate layer having an elastic modulus of less than about 10 GPa, and the first primary surface 54e of the layer 50e is loaded with a stainless steel pin having a flat bottom with a 200 µm diameter; and (c) a pencil hardness of greater than or equal to 8 H. In some aspects, the thickness 92 of the glass structure 90 may be equal to or greater than 125 µm. In an additional aspect, the thickness 52e of the glass layer 50e may be set from about 20 µm to about 125 µm to achieve the bend radius. According to an exemplary embodiment, the thickness 52e of the glass layer 50e can be set from about 20 µm to about 30 µm to achieve the bend radius from about 1 mm to about 5 mm. In some aspects, the thickness 52e of glass layer 50e (having an alkali-free alumino-borosilicate glass composition, for example) can be about 25 µm or less to obtain a bend radius of about 2 mm, and a bend radius of about 1 mm with some additional light etching.

The stack assemblies 100-100e depicted in FIGS. 1-4B can be fabricated according to a method that includes the steps: forming a first glass layer 50a, 50e having a first primary surface 54a, 54e, a compressive stress region 60, 60a, 60b extending from the first primary surface 54a of the glass layer 50a to a first depth 62, 62a, 62b in the glass layer 50a (i.e., for stack assemblies 100-100d), and a final thickness 52a, 52e. As it relates to stack assemblies 100-100d (see FIGS. 1-3B), the compressive stress region 60, 60a, 60b is defined by a compressive stress of at least about 100 MPa at the first primary surface 54a of the layer 50a.

The method for forming stack assemblies 100-100e depicted in FIGS. 1-4B can also include the step of forming a glass element 50 having a thickness 52 from about 25 µm to about 125 µm. Here, the element 50 further comprises the glass layer 50a, 50e a first primary surface 54, and a second primary surface 56. In these aspects, the glass element 50 or glass layer 50a, 50e can also characterized by: (a) an absence of failure when the element 50 or glass layer 50a, 50e is held at a bend radius 40 from about 3 mm to about 20 mm for at least 60 minutes at about 25° C. and about 50% relative humidity; (b) a puncture resistance of greater than about 1.5 kgf when the second primary surface 56 of the element 50 is supported by (i) an approximately 25 µm thick PSA having an elastic modulus of less than about 1 GPa and (ii) an approximately 50 µm thick PET layer having an elastic modulus of less than about 10 GPa, and the first primary surface 54, 54a, 54e of the element 50 or glass layer 50a, 50e is loaded with a stainless steel pin having a flat bottom with a 200 µm diameter; and (c) a pencil hardness of greater than or equal to 8 H. In other aspects of the method, glass element 50 or glass layer 50a, 50e can be configured to avoid failure for bend radii that range from about 3 mm to about 10 mm. In some aspects, the bend radius 40 can be set in a range from about 1 mm to about 5 mm. The bend radius 40 can also be set to a range from about 5 mm to 7 mm without causing a failure in the glass element 50 or glass layer 50a, 50e according to other aspects of the method.

In some aspects of the foregoing method, the step of forming the first glass layer 50a, 50e employs one or more of the following forming processes: fusion, slot drawing, rolling, redrawing or float. Other forming processes can be employed depending on the final shape factor for the glass layer 50a, 50e and/or the intermediate dimensions of a glass precursor used for the final glass layer 50a, 50e.

The forming process is further configured to form the glass layer 50a, 50e to the final thickness 52a, 52e and, as such, may include sub-process steps to obtain the final thickness 52a, 52e. The step of forming the first glass layer 50a, 50e can include a material removal process that is configured to remove material from the glass layer 50a, 50e to reach the final thickness 52a, 52e. Various known acid etching/acid thinning processes can be employed for this purpose as understood by those with ordinary skill in this field. For example, a suitable etching solution can comprise 15 vol % HF and 15 vol % HCl. By controlling etching time and/or etching solution concentration, a desired final thickness 52a, 52e can be obtained in the glass layer 50a, 50e. An example etching rate using this solution is about 1.1 µm per minute. In some aspects of the method, the material removal process employed to reach the final thickness 52a, 52e can be further configured to reduce the maximum flaw size in proximity to the first primary surface 54a—e.g., to 5 µm or less, 2.5 µm or less, 0.5 µm or less, or even lower.

According to a further aspect of the method of making the stack assemblies 100-100d depicted in FIGS. 1-3B, an ion exchange process can be employed to generate the compressive stress region 60a. As outlined earlier, the step of forming a compressive stress region 60a extending from the first primary surface 54a of the glass layer 50a to a first depth 62a can include the following additional sub-process steps: providing a strengthening bath comprising a plurality of ion-exchanging metal ions selected so as to produce compressive stress in the glass layer 50a containing ion-exchangeable metal ions; and submersing the glass layer 50a in the strengthening bath to exchange a portion of the plurality of ion-exchangeable metal ions in the glass layer 50a with a portion of the plurality of the ion-exchanging metal ions in the strengthening bath to form a compressive stress region 60a that extends from the first primary surface 54a to the first depth 62a in the glass layer 50a. In some aspects of the method, the ion-exchanging metal ions have an atomic radius that is larger than the atomic radius of the ion-exchangeable metal ions contained in the glass layer 50a. In other aspects of the method, the submersing step includes submersing the glass layer 50a in the strengthening bath at about 400° C. to about 450° C. for about 15 minutes to about 180 minutes to develop the compressive stress region 60a.

Figure 6A:
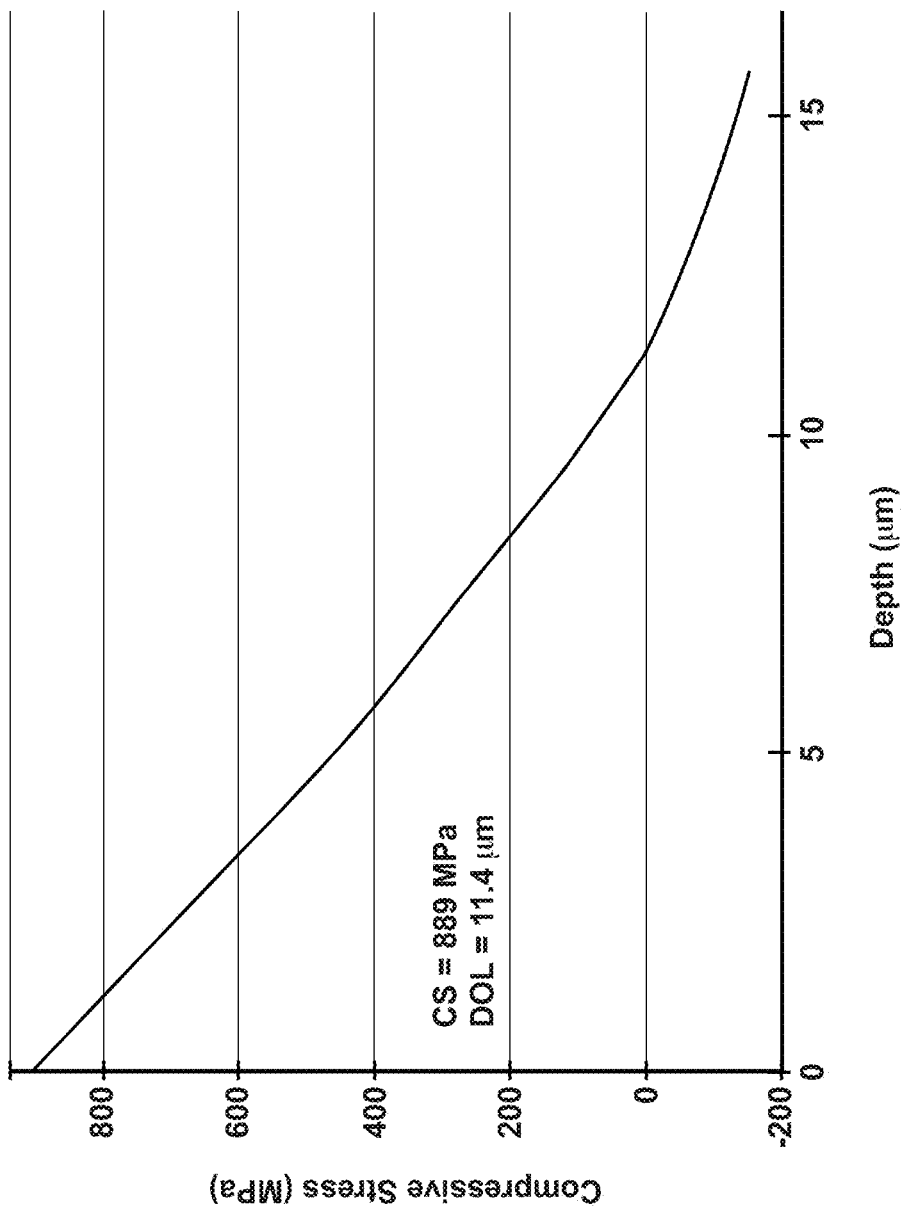
FIG. 6A is a plot of compressive stress vs. depth in a 75 μm thick glass sample after an ion exchange process step according to an aspect of this disclosure.

According to one aspect, 75 µm thick glass samples with a composition consistent with Corning® Gorilla Glass® 2.0 were subjected to an ion exchange process that included a $KNO_3$ bath submersion at 430° C. for 30 minutes. Compressive stress (MPa) as a function of glass layer depth (µm) was then measured and the results are depicted in FIG. 6A. As shown, this ion exchange process produced compressive stress of about 889 MPa at the surface of the glass and appreciable compressive stress levels were measured to a depth of about 11.4 µm (i.e., DOL=11.4 µm).

In some aspects of the method, a post-ion exchange process to remove material from the surface of the glass layer 50a can provide a benefit in terms of flaw size reduction. In particular, such a removing process can employ a light etching step to remove about 1 µm to about 5 µm from the final thickness of the glass layer 52a at the first primary surface 54a after formation of the compressive stress region 60a. For example, the removing step can employ a 950 ppm $F^-$ ion (e.g., an HF acid), 0.1M citric acid etching solution for ~128 minutes for this purpose. As outlined earlier in connection with Equation (2), a reduction in the maximum flaw size in the glass layer 50a and/or the glass element 50, particularly near their surfaces, can serve to reduce the stress intensity factor produced from bending the layer and/or the element.

Figure 6B:
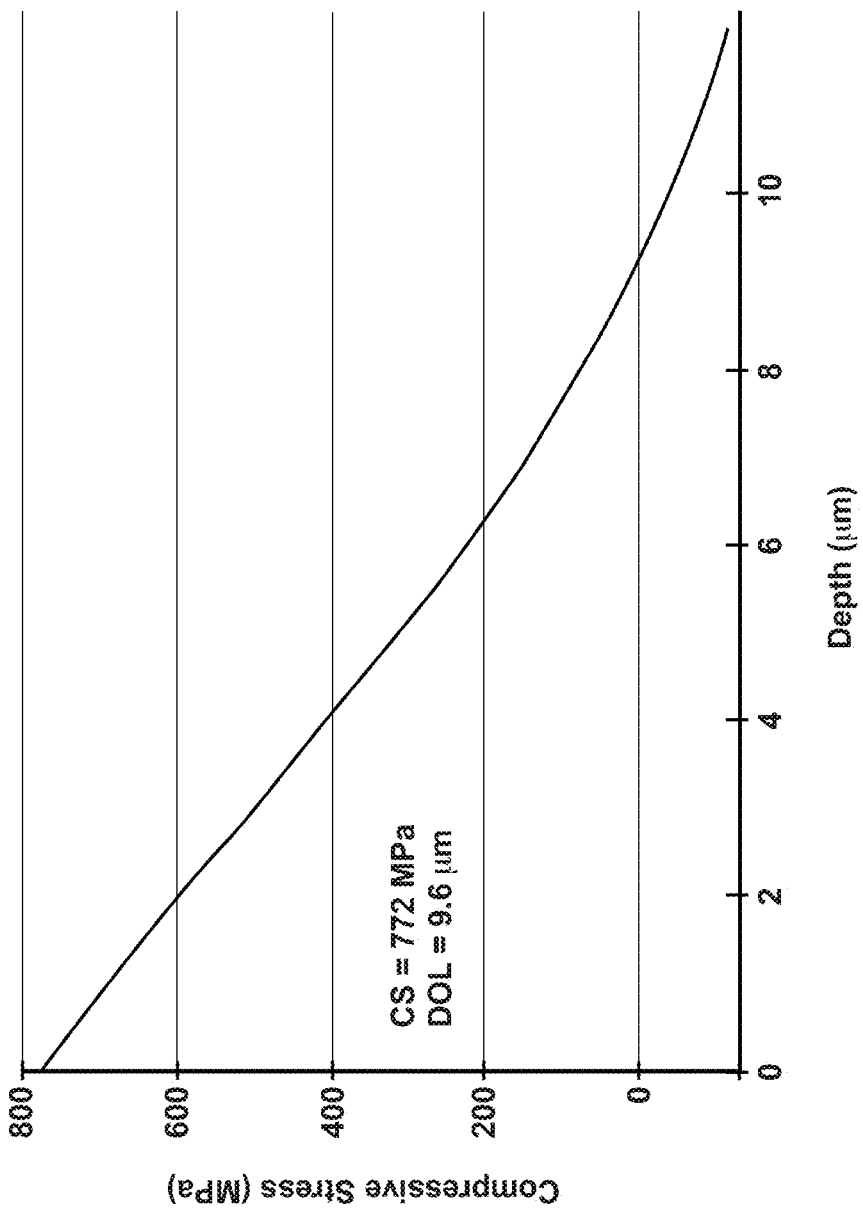
FIG. 6B is a plot of compressive stress vs. depth in a 75 μm thick glass sample after an ion exchange process step and a light etching step according to an aspect of this disclosure.

Referring to FIG. 6B, the effect on compressive stress in the glass layer subjected to both an ion exchange and post-ion exchange material removal process can be observed. In particular, FIG. 6B depicts compressive stress as a function of glass layer depth (µm) for glass layer samples prepared in accordance with those in FIG. 6A and additionally subjected to light etching process to remove about 1-2 µm of material from the surface. These samples were measured with a compressive stress of about 772 MPa at the surface of the glass and appreciable compressive stress levels were measured to a depth of about 9.6 µm (i.e., DOL=9.6 µm). In effect, FIG. 6B has a similar compressive stress as a function of depth relationship as shown in FIG. 6A; however, it is apparent that FIG. 6B is effectively a truncated version of FIG. 6A, with the first portion removed consistent with the actual removal of material from the light etching process. As such, the post-ion exchange material removal process can somewhat reduce the DOL and maximum compressive stress obtained from the ion exchange process, while at the same time providing a benefit in terms of flaw size reduction. To the extent that higher compressive stress levels and/or DOL levels are necessary for a given application, the ion exchange process can be tailored to produce compressive stress and DOL levels somewhat above the targeted levels, given the expected effect from the post-ion exchange material removal process.

According to some aspects, the removing process can be conducted to control the flaw distribution in the compressive stress regions 60, 60a and/or 60b to a maximum flaw size of 5 µm or less at the first primary surface 54a of the glass layer 50a. The removing step can also be conducted such that the compressive stress regions 60, 60a and/or 60b comprise a maximum flaw size of 2.5 µm or less, or even as low as 0.4 µm or less, at the first primary surface 54a of the glass layer 50a. According to some additional aspects of the method, the removing step can also be conducted to control the flaw size distribution within a region of the glass layer 50a that lacks the superposition of a compressive stress region 60, 60a or 60b. Further, variants of the removing process can be conducted at the edges 58b of the glass element 50 to control the flaw size distribution at the edges and within edge compressive stress regions 59a, when present (see, e.g., FIGS. 1 and 1C).

According to an embodiment, a method of making stack assemblies 100-100d is provided that comprises the steps: forming a first glass layer 50a having a first primary surface 54a, a compressive stress region 60 extending from the first primary surface 54a of the glass layer 50a to a first depth 62 in the glass layer 50a, and a final thickness 52a, wherein the region 60 is defined by a compressive stress of at least about 100 MPa at the first primary surface 54a of the layer 50a; and forming a glass element 50 having a thickness 52 from about 25 µm to about 125 µm, the element 50 further comprising the glass layer 50a, a first primary surface 54, and a second primary surface 56. In some aspects, the element 50 comprises one glass layer 50a.

In an exemplary embodiment, the steps of forming the first glass layer 50a and element 50 can include a step of forming an interim thickness (e.g., about 200 µm) that exceeds the final thickness 52a of the glass layer 50a (and thickness 52 of the element 50) using fusion, slot drawing, rolling, redrawing, float or other direct glass forming processes. The interim glass layer 50a (and element 50) can then be separated, cut and/or otherwise shaped into near-final part dimensions using known cutting processes (e.g., water cutting, laser cutting, etc.). At this point, the interim glass layer 50a (and element 50) can then be etched to a final thickness 52a (e.g., about 75 µm) according to the foregoing process steps. Etching to a final thickness at this stage in the process can provide a benefit in removing flaws and other defects introduced from the prior glass forming and separation/cutting steps. Next, the glass layer 50a and element 50 can be subjected to process steps for forming the compressive stress region 60 including but not limited to the foregoing ion exchange process. A final, light etch can then be performed on the glass layer 50a and element 50 containing the compressive stress region 60 according to the prior-described process. This final, light etch can then remove any appreciable flaws and defects in the surface of the glass layer 50a and element 50 that resulted from the prior ion exchange process. The glass element 50 or glass layer 50a produced according to the method can be characterized by: (a) an absence of failure when the element 50 or glass layer 50a is held at a bend radius from about 3 mm to about 20 mm for at least 60 minutes at about 25° C. and about 50% relative humidity; (b) a puncture resistance of greater than about 1.5 kgf when the second primary surface 56, 56a of the element 50 or layer 50a is supported by (i) an approximately 25 µm thick pressure-sensitive adhesive having an elastic modulus of less than about 1 GPa and (ii) an approximately 50 µm thick polyethylene terephthalate layer having an elastic modulus of less than about 10 GPa, and the first primary surface 54, 54*a* of the element 50 or layer 50*a* is loaded with a stainless steel pin having a flat bottom with a 200 μm diameter; and (c) a pencil hardness of greater than or equal to 8 H.

In a further exemplary embodiment, the steps of forming the first glass layer 50*a* and element 50 to the final thickness 52*a* and thickness 52, respectively, can be conducted by employing fusion, slot drawing, rolling, redrawing, float or other direct glass forming processes. The glass layer 50*a* (and element 50) can then be separated, cut and/or otherwise shaped into near-final part dimensions using known cutting processes (e.g., water cutting, laser cutting, etc.). At this point, the glass layer 50*a* (and element 50) can then be subjected to process steps for forming the compressive stress region 60 including but not limited to the foregoing ion exchange process. A final, light etch can then be performed on the glass layer 50*a* and element 50 containing the compressive stress region 60 according to the prior-described process. This final, light etch can then remove any appreciable flaws and defects in the surface of the glass layer 50*a* and element 50 that resulted from the prior ion exchange process.

The glass element 50 or glass layer 50*a* produced according to the method can be characterized by: (a) an absence of failure when the element 50 or glass layer 50*a* is held at a bend radius from about 3 mm to about 20 mm for at least 60 minutes at about 25° C. and about 50% relative humidity; (b) a puncture resistance of greater than about 1.5 kgf when the second primary surface 56, 56*a* of the element 50 or layer 50*a* is supported by (i) an approximately 25 μm thick pressure-sensitive adhesive having an elastic modulus of less than about 1 GPa and (ii) an approximately 50 μm thick polyethylene terephthalate layer having an elastic modulus of less than about 10 GPa, and the first primary surface 54, 54*a* of the element 50 or layer 50*a* is loaded with a stainless steel pin having a flat bottom with a 200 μm diameter; and (c) a pencil hardness of greater than or equal to 8 H.

Figure 7A:
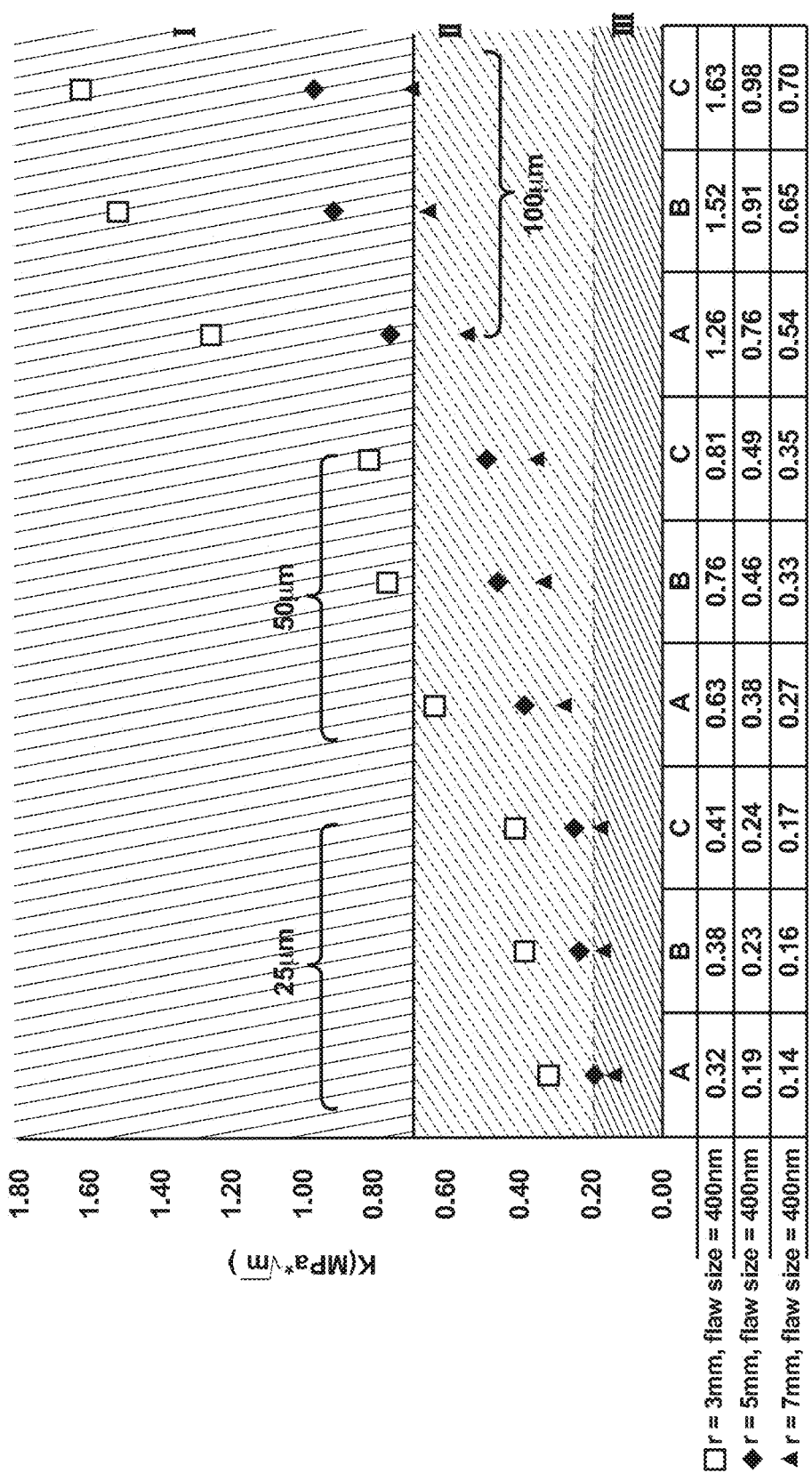
FIG. 7A is a schematic plot of estimated stress intensity factors for glass layers of three compositions having a thickness of 25, 50 and 100 μm and a bend radius of 3, 5 and 7 mm.

Referring to FIG. 7A, a schematic plot of estimated stress intensity factors is provided for glass layers of three compositions, "A," "B" and "C." The composition of the A group is: $SiO_2$ at 67.1% (by mol %); $Al_2O_3$ at 6.3%; $B_2O_3$ at 19.9%; MgO at 0.5%; CaO at 4.8%; SrO at 0.5%; $SnO_2$ at 0%; and $Na_2O$ at 0.9%. The composition of the B group is: $SiO_2$ at 66.7% (by mol %); $Al_2O_3$ at 10.9%; $B_2O_3$ at 9.7%; MgO at 2.2%; CaO at 9.1%; SrO at 0.5%; $SnO_2$ at 0.1%; and $Na_2O$ at 0%. The composition of the C group is: $SiO_2$ at 67.4% (by mol %); $Al_2O_3$ at 12.7%; $B_2O_3$ at 3.7%; MgO at 2.4%; CaO at 0%; SrO at 0%; $SnO_2$ at 0.1%; and $Na_2O$ at 13.7%. Equation (2) was employed to generate the estimates depicted in FIG. 7A. Glass layers "A," "B" and "C" have elastic moduli of 57.4, 69.3 and 73.6 GPa, respectively. Further, glass layers "A," "B" and "C" have a Poisson's ratio of 0.22, 0.22 and 0.23, respectively. In addition, stress intensity factor estimates were performed for the glass layers "A," "B" and "C" having a thickness of 25, 50 and 100 μm and a bend radius of 3, 5 and 7 mm. A flaw size of 400 nanometers (nm) was assumed for all cases, as it is a typical maximum flaw size for a fusion-formed glass surface. No compressive stress region was assumed to be present in any of these glass layers.

In FIG. 7A, regions I, II and III refer to instantaneous failure, slow fatigue failure and no-failure regions, respectively. As the estimates indicate, increasing the bend radius and decreasing the thickness of the glass layer are steps that each tend to reduce the stress intensity factors. If the bend radius is held to no lower than 5 mm and the thickness of the glass layer to 25 μm or less, the estimated stress intensity factors in FIG. 7A suggest that no failures would occur in static tension or fatigue (e.g., K at <0.2 MPa√m for region III). These particular glass layers depicted in FIG. 7A (i.e., glass layers with a bend radius equal to or greater than 5 mm and a thickness of 25 μm or less) could be suitable for use in stack assemblies and glass articles with relatively modest puncture resistance requirements according to certain aspects of the disclosure.

Figure 7B:
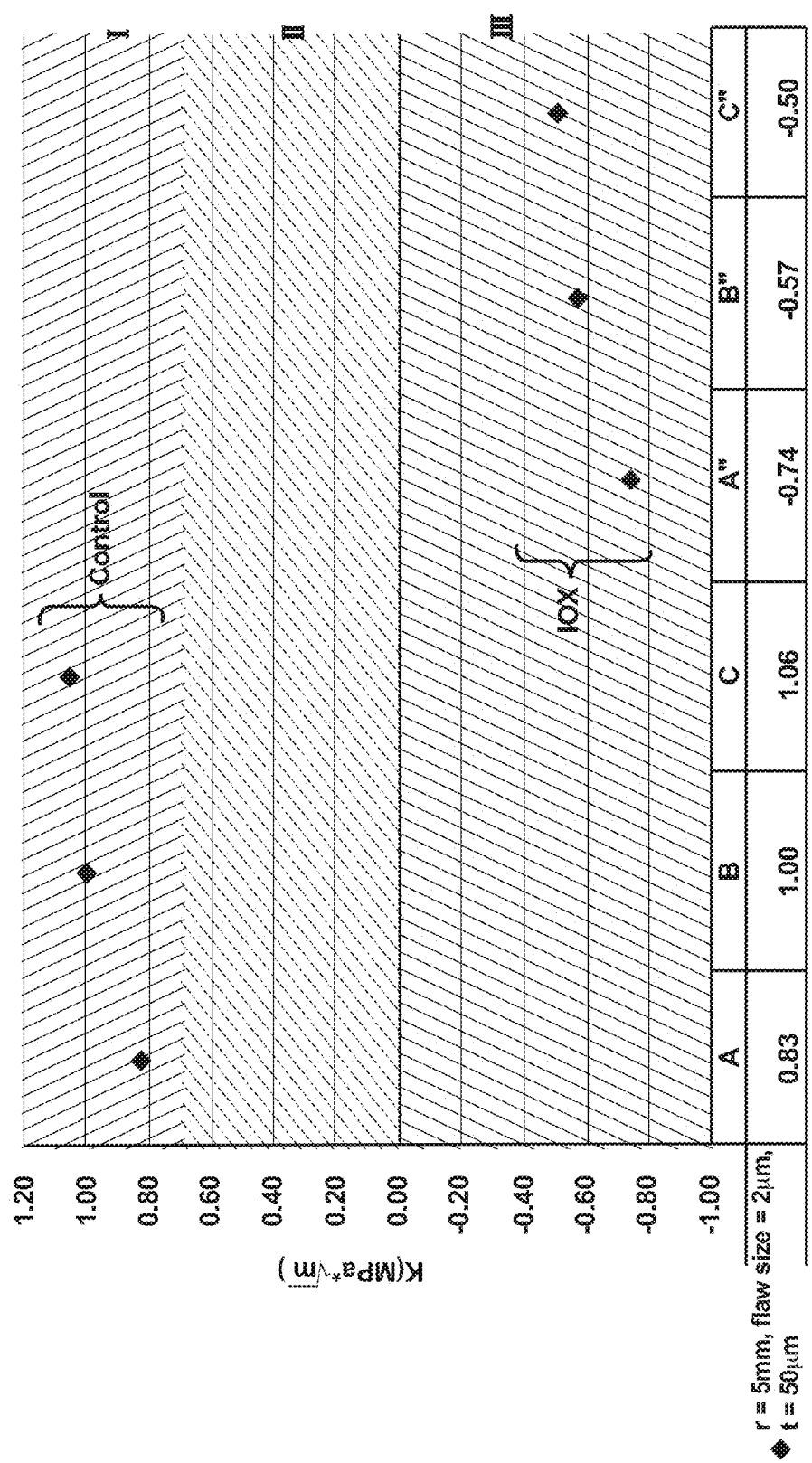
FIG. 7B is a schematic plot of estimated stress intensity factors for glass layers of three compositions having a thickness of 50 μm and a bend radius of 5 mm, with and without a compressive stress region, according to an aspect of this disclosure.

Referring to FIG. 7B, a schematic plot of estimated stress intensity factors is provided for glass layers of three compositions, "A," "B" and "C" (i.e., the same compositions as employed for the glass layers depicted in FIG. 7A). Each of the glass layers employed in the estimates depicted in FIG. 7B was assumed to have a thickness of 50 μm and a bend radius of 5 mm. Further, the "Control" (also denoted by A, B and C) group was assumed to lack a superimposed compressive stress region, and the "IOX" group (also denoted by A", B" and C") was assumed to possess a compressive stress region developed through an ion exchange process having about 700 MPa of surface compression, according to an aspect of this disclosure. A more conservative flaw size of 2000 nm (2 μm) was assumed for the purpose of generating these estimates, reflecting a worst-case scenario of a large flaw introduced at the application-use stage by a customer well after fabrication of the device containing the stack assembly, glass element or glass article according to an aspect of this disclosure.

As the estimates in FIG. 7B indicate, a compressive stress region developed in a glass layer with an ion exchange process can significantly offset the stress intensity levels in the glass layers observed upon bending. Stress intensity levels well below the region III threshold (e.g., K at <0 MPa√m for region III) were observed for the "IOX" glass layers having a 50 μm thickness and a bend radius of 5 mm, by virtue of the additional compressive stress superimposed on the tensile stresses developed during bending. In contrast, the Control group, without a compressive stress region, was estimated to have stress intensity levels within region I.

Figure 8:
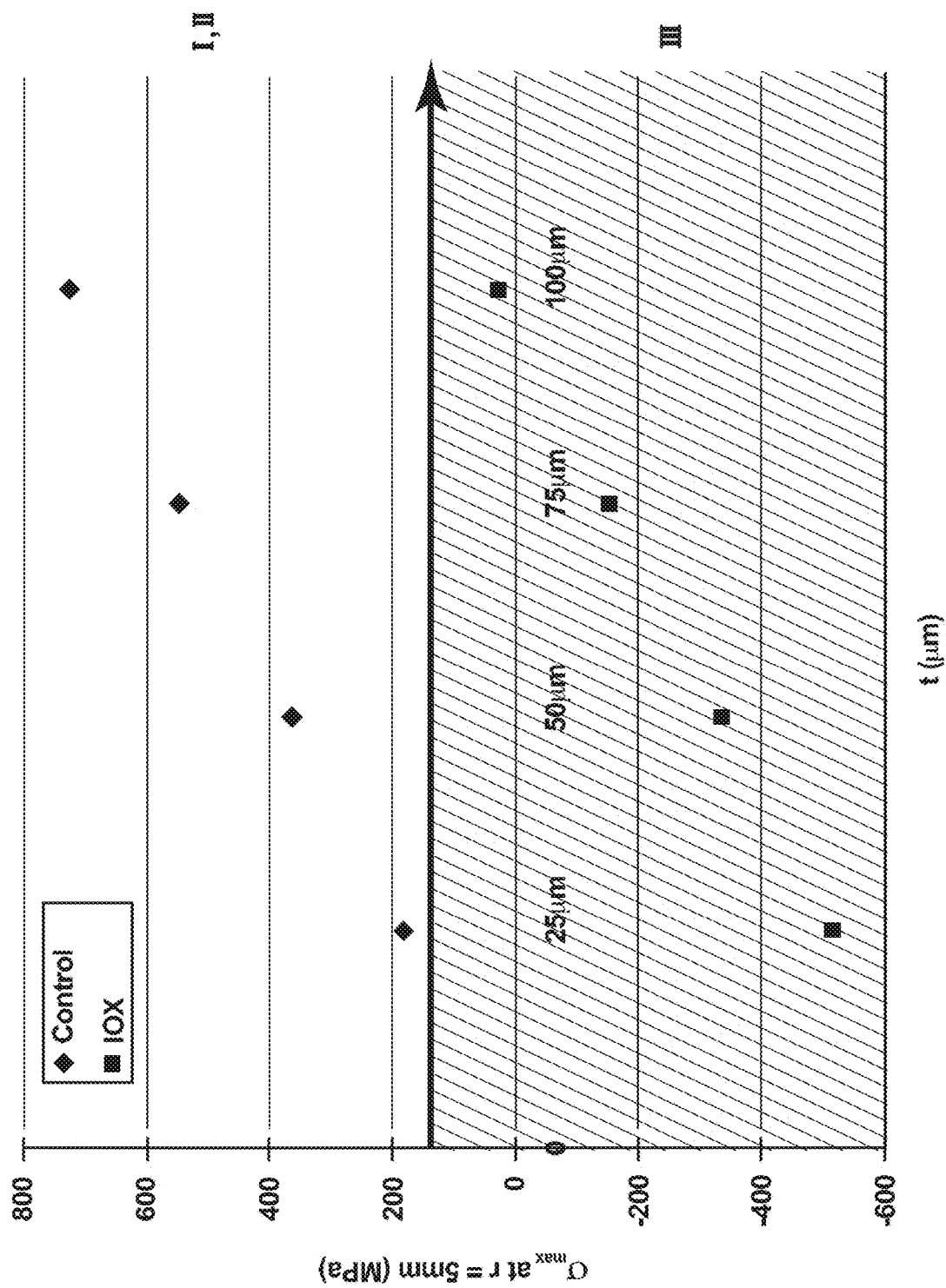
FIG. 8 is a schematic plot of estimated maximum stress levels at the surface of glass layers of one composition having thickness of 25, 50, 75 and 100 μm and a bend radius of 5 mm, with and without a compressive stress region developed through an ion exchange process, according to a further aspect of this disclosure.

Referring to FIG. 8, a schematic plot is provided of estimated stress levels at the surface of glass layers of one particular composition, a glass composition comparable to the composition of the C group depicted in FIGS. 7A and 7B. Each of the glass layers employed to generate the stress estimates depicted in FIG. 8 was assumed to have a thickness of 25, 50, 75 and 100 μm and a bend radius of 5 mm. Further, some of these glass layers were assumed to lack a compressive stress region (i.e., the "Control" group) and the remaining glass layers were assumed to possess a compressive stress region having about 700 MPa of surface compression, e.g., as developed through an ion exchange process (i.e., the "IOX" group) according to a further aspect of this disclosure. A flaw size of 400 nm was assumed for all cases, as it is a typical maximum flaw size for a fusion-formed glass surface. Further, the safety zone (i.e., region III) was set at stress intensity safety factor of K<0.2 MPa√m.

As the estimates in FIG. 8 indicate, a compressive stress region developed in a glass layer with an ion exchange process can significantly reduce the stress intensity levels in the glass layers observed upon bending. Stress intensity levels well below the region III threshold (e.g., K at <0.2 MPa√m for region III) were observed for all of the "IOX" glass layers having a thickness of 25, 50, 75 and 100 μm and a bend radius of 5 mm, by virtue of the additional compressive stress superimposed on the tensile stresses developed during bending. In contrast, the Control group, without a compressive stress region, was estimated to have stress intensity levels in region I for all thicknesses.

Figure 9:
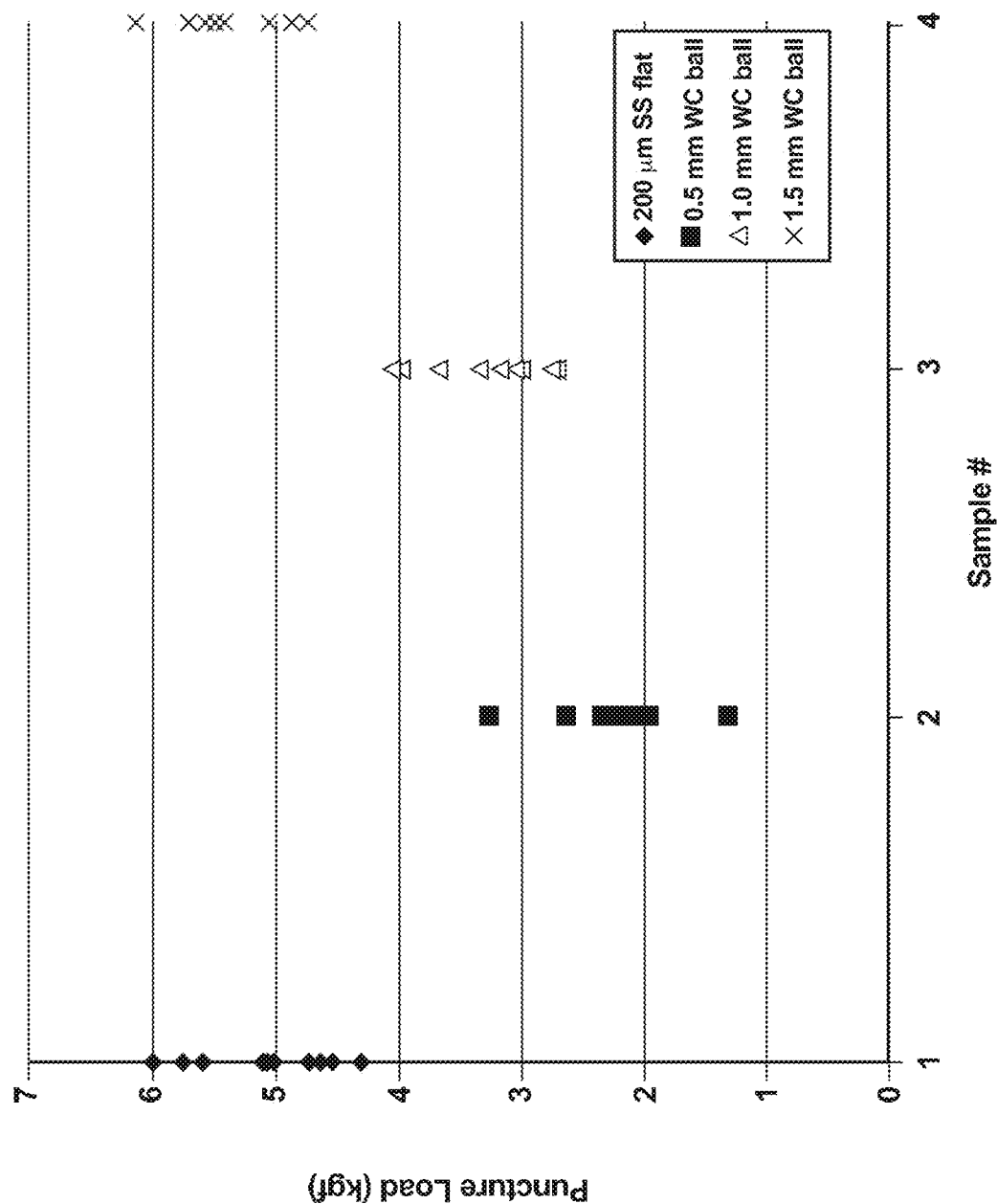
FIG. 9 is a plot of failure puncture load test data for glass layers of one composition having a thickness of 75 μm and a compressive stress region developed through an ion exchange process, according to an aspect of this disclosure.

Referring to FIG. 9, a plot of failure puncture load data for glass layers of one composition having a thickness of 75 μm and a compressive stress region developed through an ion exchange process is provided according to an aspect of this disclosure. In particular, the glass composition for the samples tested in FIG. 9 was: $SiO_2$ at 68.9% (by mol %); $Al_2O_3$ at 10.3%; $Na_2O$ at 15.2%; MgO at 5.4%; and $SnO_2$ at 0.2%. All of the glass layers tested in the experiment used to generate the data of FIG. 9 were subjected to an ion-exchange process to produce a compressive stress region with a compressive stress at the surface of about 772 MPa and a DOL of 9.6 μm. For purposes of testing, the glass layers were laminated to a 50 μm PET layer (having an elastic modulus of less than about 10 GPa) with a 25 μm PSA layer (having an elastic modulus of less than about 1 GPa). Puncture testing was performed on the outer glass surface.

As shown in FIG. 9, four groups of samples were tested to develop the puncture test data. Each group corresponded to a different puncture device: a 200 μm diameter, flat bottom stainless steel punch; a 0.5 mm tungsten carbide ball; a 1.0 mm tungsten carbide ball; and a 1.5 mm tungsten carbide ball. The data in FIG. 9 demonstrate the sensitivity of the puncture failure load data to the particular puncture device employed in the testing. Generally, the variability in results appears to be similar for each of the devices employed. As indicated in FIG. 9, the glass layers having a thickness of 75 μm with a compressive stress region developed through ion-exchange processing had puncture failure loads well in excess of 4 kgf when tested with a 200 μm diameter, flat bottom stainless steel punch.

In another example, a glass layer with a composition that was comparable to the glass layers tested in FIG. 9 was prepared according to an aspect of this disclosure with a compressive stress region generated through an ion exchange process was subjected to a 2-point, static fatigue bend test. In particular, the glass layer tested had a thickness of 75 μm and its compressive stress region was developed by submersion in a $KNO_3$ molten salt bath at 430° C. for 30 minutes. Further, the glass layer was subjected to a post-ion exchange material removal process involving an acid etch in a 950 ppm $F^-$ ion, 0.1M citric acid etching solution for about 128 minutes. Upon testing, the glass layer did not fail after being subjected to a bend radius of ~5 mm for 120 hours.

In a further example, 75 μm thick glass layer samples were prepared in accordance with the composition and ion exchange process steps of the samples tested in FIG. 9. These samples were not laminated with any compliant layers. As-prepared, these samples were 105×20×0.075 mm. 10 samples were then arranged in a bent configuration within a static test fixture with a 10 mm plate separation (plates fabricated from Teflon® material). The samples were then held within the fixture at 85° C. under 85% relative humidity. 9 of the 10 samples have not experienced any failure modes after over two months of testing in the fixture. One sample failed during the first day of testing. Given these results and other analyses, it is believed that any samples with failure-inducing surface flaws remaining after processing can be removed through proof testing.

In an additional example, 75 μm thick glass layer samples were prepared in accordance with the composition and ion exchange process steps of the samples tested in FIG. 9, including lamination to a 50 μm PET layer with a 25 μm PSA layer. As-prepared, these samples were 105×20×0.075 mm (not including the PET/PSA layers). Five samples were then subjected to a clamshell cyclic fatigue test. The clamshell cyclic fatigue test fixture held the samples with a 10 mm plate separation under ambient temperature and humidity conditions. Each cycle involved closing the clamshell fixture while retaining the 10 mm plate separation and then fully opening the fixture such that the sample was uniform with no bend. Each of the five samples has survived over 45,000 of such cycles.

Figure 10:
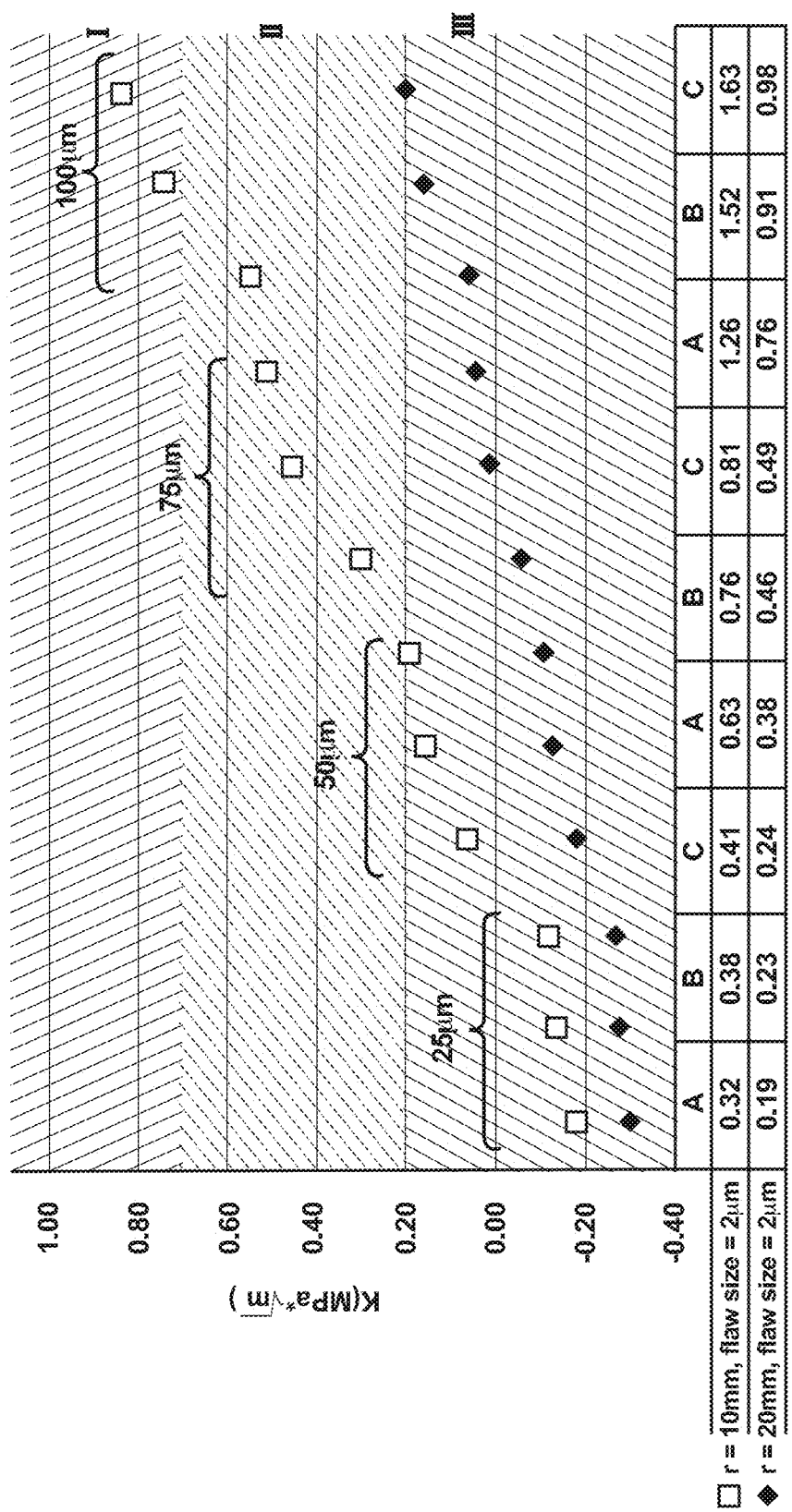
FIG. 10 is a schematic plot of estimated stress intensity factors for glass layers of three compositions having a thickness of 25, 50, 75 and 100 μm, a bend radius of 10 and 20 mm, and a compressive stress region developed through a mismatch in the coefficient of thermal expansion between core and cladding regions of the glass layers, according to a further aspect of this disclosure.

Referring now to FIG. 10, a schematic plot of estimated stress intensity factors for glass layers of three compositions, groups "A," "B" and "C" having the same composition as the groups of samples employed for the estimates given in FIGS. 7A and 7B, is provided according to a further aspect of the disclosure. Each of the samples employed for the estimates in FIG. 10 had a thickness of 25, 50, 75 or 100 μm, and a bend radius of 10 or 20 mm. Here, each tested sample possessed compressive stress regions that were developed through heating, and subsequently cooling, core and cladding regions of the glass layers in intimate contact, the core region having a CTE greater than the CTE of the clad regions. The estimates employed in FIG. 10 assumed a flaw size of about 2 μm in the surface of the glass layer for each sample. Further, it was assumed that about 150 MPa of compressive stress was developed in the compressive stress region of these glass layers through CTE mismatch between the core and cladding regions.

As the estimates in FIG. 10 indicate, a compressive stress region developed in a glass layer with a CTE mismatch between its core and cladding regions can significantly reduce the stress intensity levels in the glass layers observed upon bending. Stress intensity levels well below the region III threshold (e.g., K at <0.2 MPa√m for region III) were observed for all of the glass layers having a thickness of 25, 50, 75 and 100 μm and a bend radius of 20 mm, by virtue of the additional compressive stress superimposed on the tensile stresses developed during bending. In addition, glass layers having a thickness of 25 and 50 μm and a bend radius of 10 mm also possessed stress intensity levels below the region III threshold. As such, these particular glass layers employing a CTE mismatch approach can be employed according to aspects of the disclosure within stack assemblies and glass articles having bend radii requirements of 10 mm or more (see, e.g., stack assembly 100b in FIG. 1D and the corresponding description).

Figure 11:
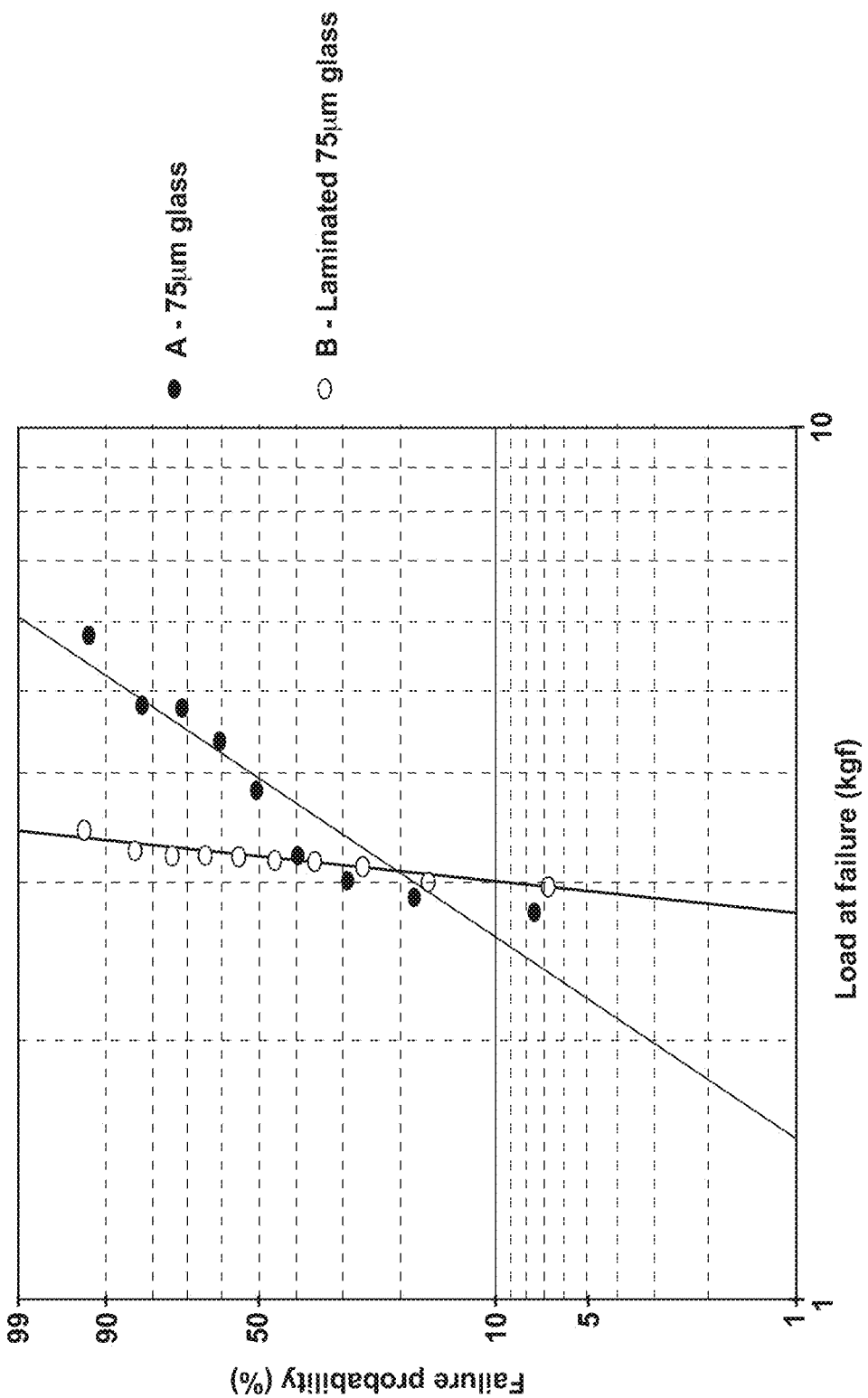
FIG. 11 is a Weibull plot of failure probability vs. load at failure for two groups of glass samples according to an aspect of this disclosure.

In FIG. 11, a Weibull plot of failure probability vs. puncture load data for glass layers of one composition having a thickness of 75 μm and a compressive stress region developed through an ion exchange process is provided according to an aspect of this disclosure. In particular, the glass composition for the samples tested was comparable to those tested in FIG. 9. All of the glass layers tested in the experiment used to generate the data of FIG. 11 were subjected to an ion-exchange process to produce a compressive stress region with a compressive stress at the surface of about 772 MPa and a DOL of 9.6 μm. The "B" group of glass layers, as denoted by open circle symbols in FIG. 11, consisted of glass samples laminated to a 50 μm PET layer with a 25 μm PSA layer. All puncture testing was performed on the outer glass surface of these samples, away from the PET/PSA layer stack. An "A" group of glass layers, as denoted by closed circle symbols in FIG. 11, consisted of glass samples that were not laminated to a PET/PSA layer stack. The puncture test results shown in FIG. 11 were generated using a 200 μm diameter, flat bottom stainless steel punch.

As shown in FIG. 11, the non-laminated "A" group and laminated "B" group of samples exhibited Weibull characteristic strength values (i.e., at a failure probability of 63.2% or greater) of 4.3 kgf and 3.3 kgf, respectively. Further, all samples from both groups failed at 5.5 kgf or greater. The Weibull modulus of the laminated "B" group is higher than the Weibull modulus of the non-laminated "A" group, indicating that variability in failure performance can be reduced by virtue of laminating the samples. On the other hand, the non-laminated "A" group demonstrated a higher average puncture failure load and Weibull characteristic strength compared to the laminated "B" group, suggesting that lamination can somewhat reduce puncture test performance, likely caused by increased local stress concentrations associated with the compliant layers in vicinity to the glass near the puncture testing tip. As such, the choices and options associated with laminating stack assemblies according to aspects of this disclosure can be mindful of the potential optimization of puncture resistance variability and overall maximization of puncture resistance.

Overall Stress Profile

Tensile stress in glass tends to make flaws propagate, whereas compressive stress in glass tends to suppress the propagation of flaws. Flaws may be present in the glass from the nature in which it was made, handled, or processed. Accordingly, it is desirable to have the portions of the glass that are likely to have or receive flaws (i.e., the primary surfaces, and from those surfaces to a depth to which cracks may penetrate) in compression. For a bent piece of glass, the stress profile is comprised of two main components, the first $\sigma I$ being that inherently in the glass from the way it was made and/or processed, and the second $\sigma B$ being that induced from a bend in the glass.

Figure 12:
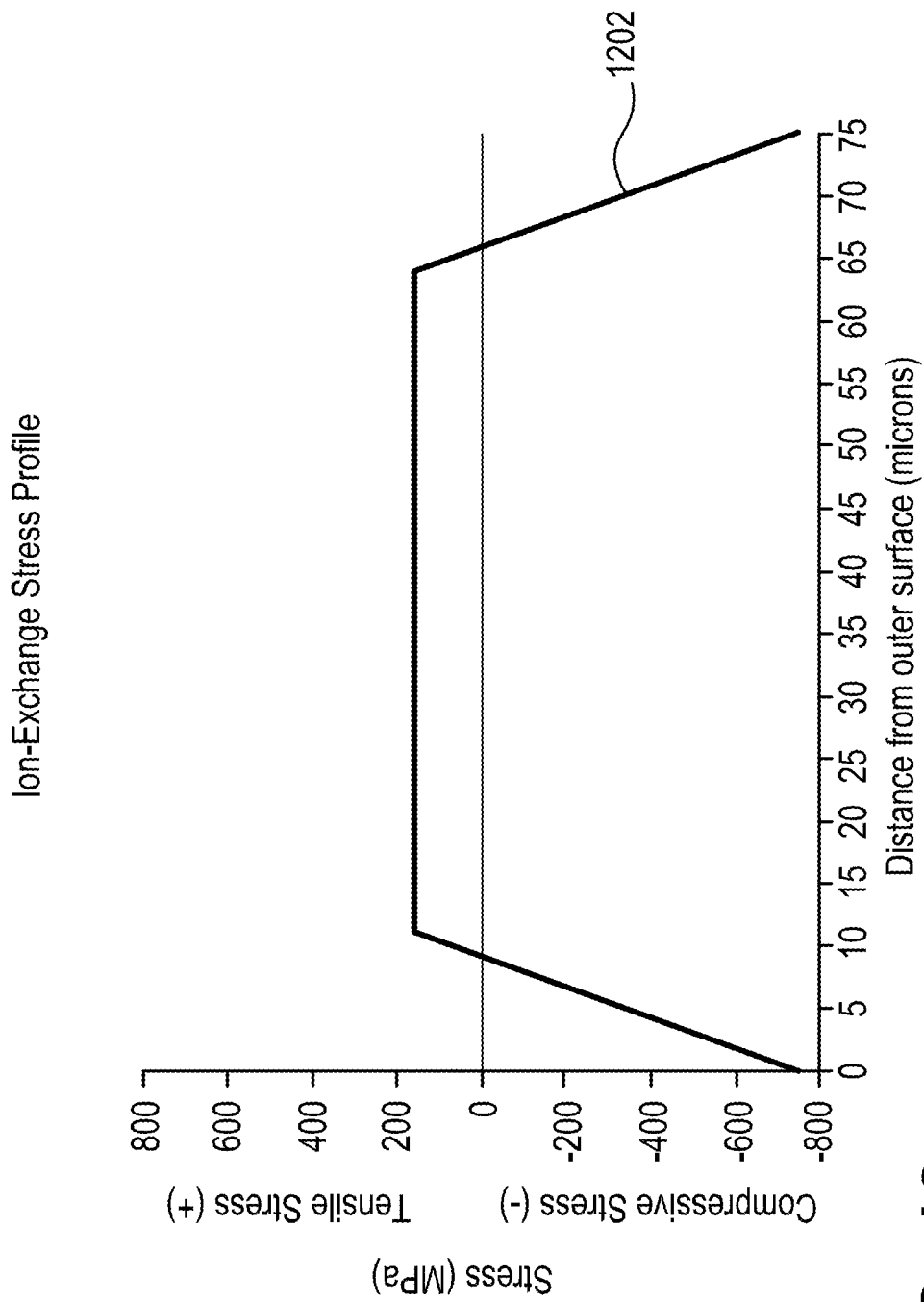
FIG. 12 is a stress profile for a glass element according to aspects of the disclosure when compressive stress results from metal ion exchange between salt and glass.

One example of the first component $\sigma I$, stress inherently in the glass itself, is shown in FIG. 12. Line 1202 is a stress profile for a 75 micron thick glass element made of Corning Code 2319 (Gorilla® Glass 2) having a compressive stress of 756 MPa and a DOL of 9.1 microns. As used herein, a positive stress is tensile, and a compressive stress is negative. The inherent stress profile in the glass may vary based on different IOX conditions, glass compositions, and/or differing processing conditions when making the glass (as in the case of glass laminates described above, which may impart a compressive stress in the outer layer of the glass). In any event, the glass itself will have an inherent stress profile.

Figure 13:
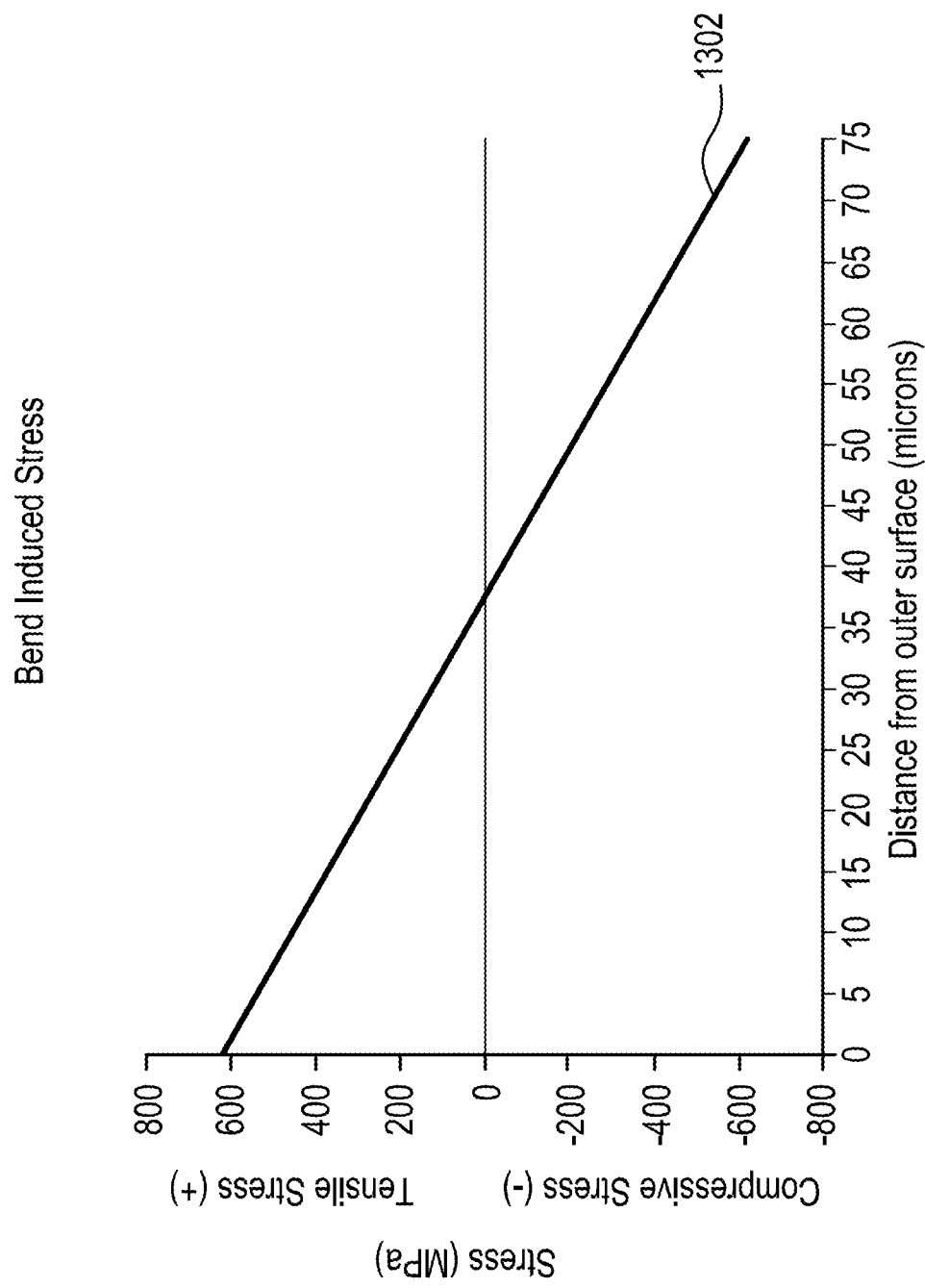
FIG. 13 is a stress profile for a glass element according to aspects of the disclosure when subject to a bending stress.

When the glass element 50 is bent, the bend induces a second stress component $\sigma B$ to the stress profile within the glass. For example, when glass element 50 is bent in the direction shown in FIG. 1A, tensile stress induced by the act of bending is given by Equation (1) above, and will be the maximum at the outer surface, for example first primary surface 54 of glass element 50. The second primary surface 56 will be in compression. An example of bend induced stress is shown in FIG. 13. as line 1302. Line 1302 is a bend stress plot for a 75 micron thick glass element made of Corning Code 2319 (Gorilla® Glass 2) but, for the moment, ignoring the inherent stress profile in the glass due to IOX. The parameters for Equation (1), for this type of glass, as plotted, are modulus E=71.3 GPa, poissons ratio v=0.205, thickness=75 microns, and bend radius=4.5 mm.

Figure 14:
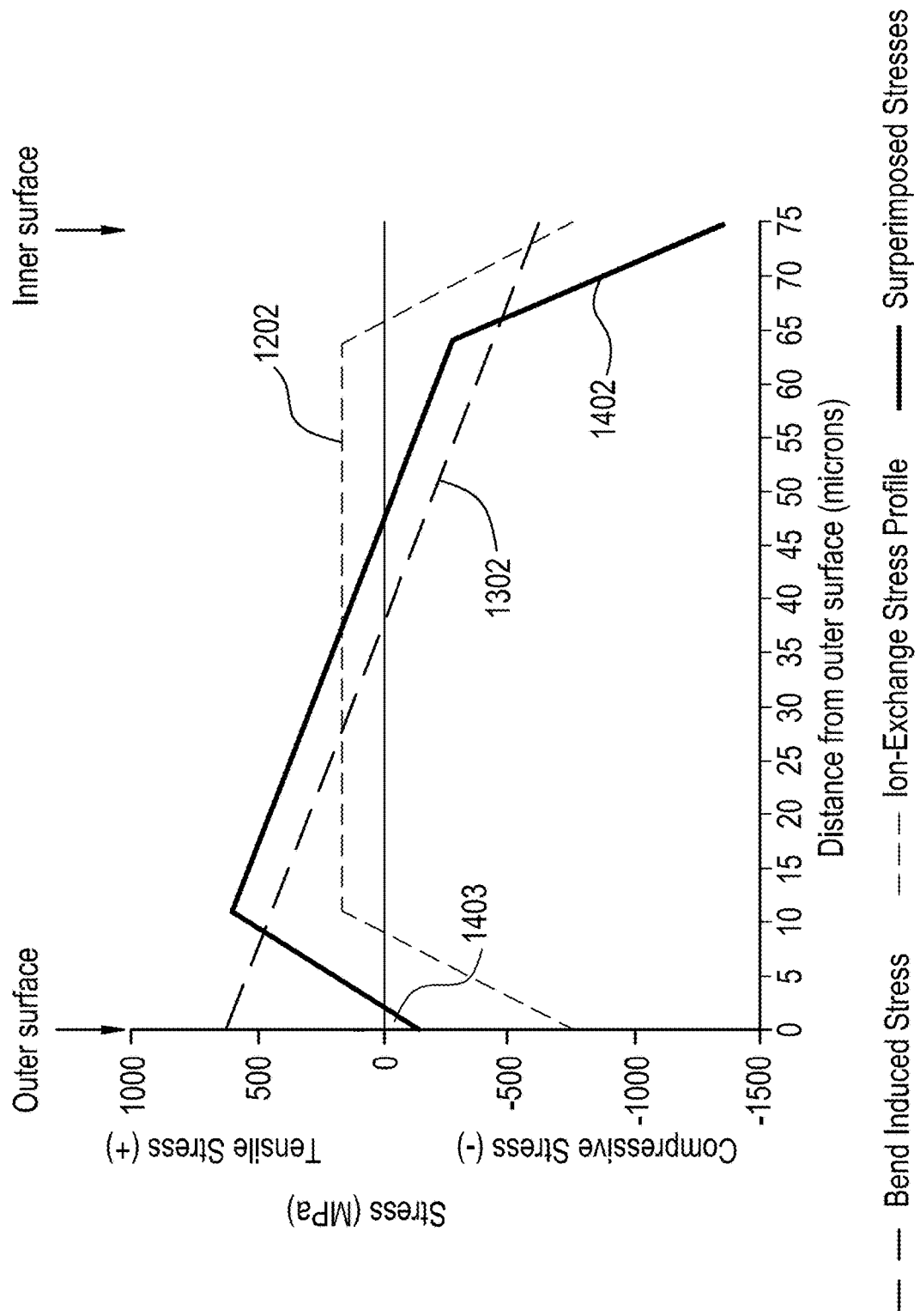
FIG. 14 is a resultant stress profile showing the stress profiles of FIG. 12 and FIG. 13 added together.

Thus, the overall stress profile in the glass will be, again, the sum of the two above-described components, or $\sigma I + \sigma B$. The overall stress is shown in FIG. 14 as solid line 1402, which is the sum of line 1202 inherent stress, $\sigma I$, shown in short dashes, and line 1302 bend induced stress $\sigma B$ shown in long dashes. The stress at the outer surface of the glass element 50, for example primary surface 54 as shown in FIG. 1A, is shown at the left side of the plot, whereas the stress at the inner primary surface 56 is shown at the right side of the plot. As can be seen from line 1402, the stress at the inner second primary surface 56 is compressive and will limit the propagation of flaws. Also, at the stress at the outer or first primary surface 54 is also compressive and will limit the propagation of flaws. As shown, for the conditions noted above, the compressive stress extends from the first primary surface 54 to a depth of a few microns. The amount of compressive stress at outer primary surface, and the depth below the outer primary surface to which the compressive stress extends, can be increased in a number of ways. First, the bend induced tensile stress may be made smaller. As can be seen from Equation (1) the bend induced stress $\sigma B$ can be made smaller by using a thinner glass, and/or a larger bend radius, and/or a glass with a lower modulus E, and/or a glass with a higher poissons ratio v. Second, the amount of compressive stress at the outer primary surface can be increased by choosing a glass with a greater inherent compressive stress $\sigma I$ at the desired location as by, for example, using different IOX conditions, glass compositions, and/or differing processing conditions, as noted above in connection with the discussion on FIG. 12.

An important aspect of the disclosure is that at the outer primary surface, i.e., the primary surface at the outside of a bent portion of glass element 50, for example first primary surface 54 as shown in FIG. 1A, for a foldable or rollable display wherein the bend radius is ≤20 mm, the sum of the inherent stress $\sigma I$ and the bend stress $\sigma B$ is less than 0 as shown by Equation (3) below.

$$\sigma I + \sigma B < 0 \qquad \text{Equation (3)}$$

Additionally, it is further beneficial to define the stress profile in the glass element so that Equation (3) is satisfied to a depth of at least 1 micron below the primary surface 54 in some examples, to a depth of at least 2 microns below the primary surface 54 in other examples, and to a depth of at least 3 microns below the primary surface 54 in still other examples. The deeper below the primary surface that Equation (3) holds, the more durable the device will be. That is, if a flaw (a scratch from handling the device during manufacturing or use, for example) extends below the primary surface to a greater degree than the relationship in Equation (3) holds, then the flaw will propagate over time and the glass element will fail. Stated another way, the IOX profile should be managed so that the stress induced from bending plus the inherent stress produces a region 1403, i.e., line 1402 intercepts the Y axis at zero or less, to minimize failure. Additionally, in further examples, the flaw population should be managed so that flaws are contained in the region 1403, i.e., the maximum flaw depth from the glass surface does not exceed the point at which the line 1402 intercepts the X axis whereby the flaw is contained in the compressive region in the glass and will not propagate. Thus, by maximizing the area 1403, smaller bend radii and deeper flaws may be tolerated while failure is minimized.

The outer primary surface was shown as first primary surface 54 in the foregoing discussion, but in some examples the second primary surface 56 may be the outer primary surface instead of first primary surface 54. In other examples, for example in a tri-fold arrangement, both the first primary surface 54 and the second primary surface 56, may have portions that are an outer primary surface, i.e., are on the outside of a bent portion of the glass element 50.

Benefit of Light Etch Step After IOX

Figure 15:
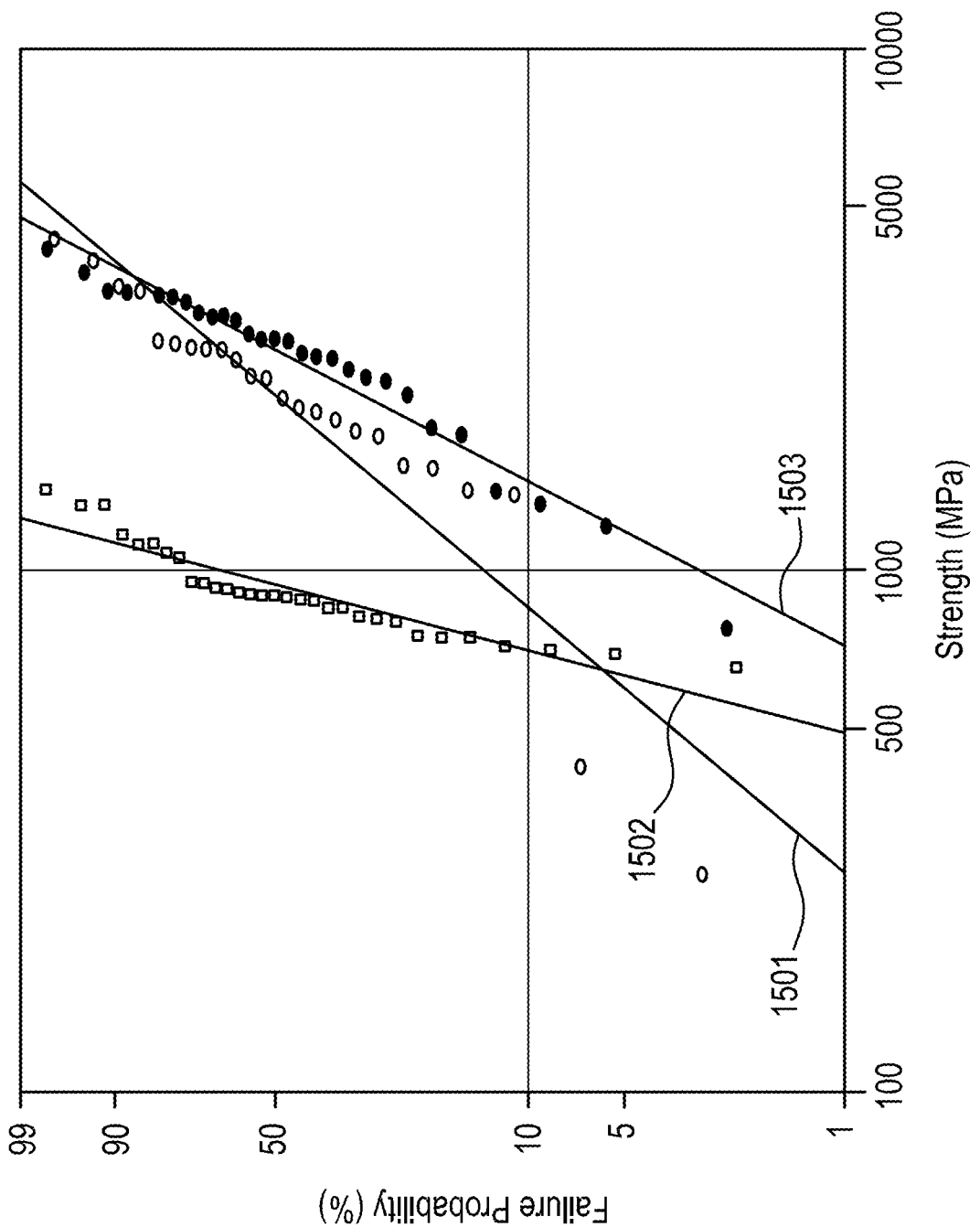
FIG. 15 is a Weibull plot of failure probability vs. strength under two point bending of various different glass samples.
Figure 16:
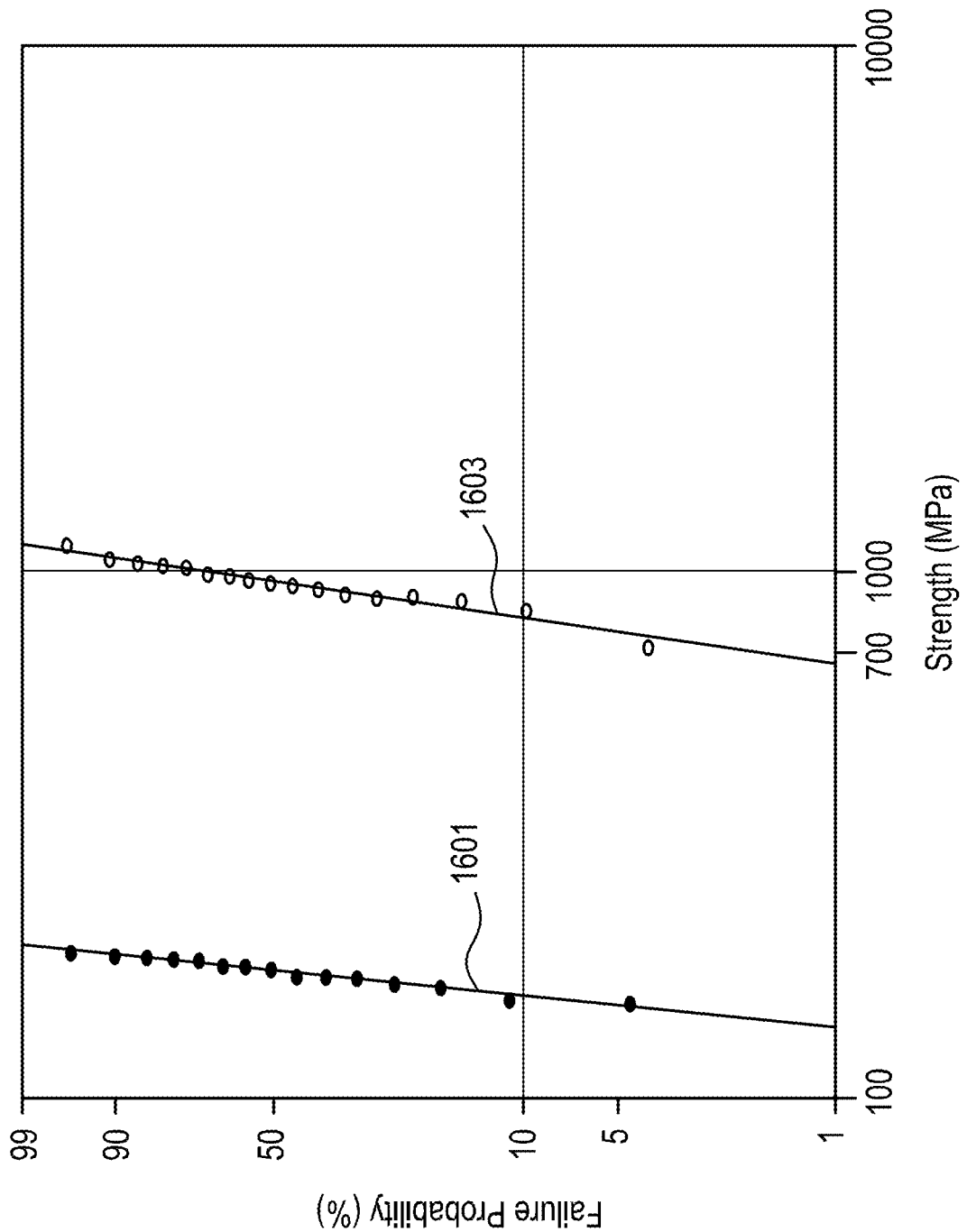
FIG. 16 is a Weibull plot of failure probability vs. strength under two point bending of various different glass samples after cube corner contact.

The benefit of performing an etching step after an IOX strengthening step is shown in FIGS. 15 and 16, which show various two point bend strength distributions. The two point bend values in these figures were measured by testing the samples as follows. The samples were stressed at a constant rate of 250 MPa/sec. For the two point bending protocol, see S. T. Gulati, J. Westbrook, S. Carley, H. Vepakomma, and T. Ono, "45.2: Two point bending of thin glass substrates," in SID Conf., 2011, pp. 652-654. The environment was controlled at 50% relative humidity and 25° C. The data sets show the maximum stress at failure, and assume that the failure occurs at the minimum radius location. Line 1501 shows a Weibull distribution for strength of glass samples that were deep etched from 200 microns thick to 75 microns thick (no IOX or subsequent etching were performed on these samples). This set of samples shows a strength of about 850 MPa at a B10 failure probability. Line 1502 shows a Weibull distribution of strength of glass samples that were deep etched from 200 microns thick to 75 microns thick and then subject to IOX (but no subsequent etching). These samples show a slightly decreased strength, of about 700 MPa at a B10 failure probability, from the values for the deep-etched-only samples of Line 1501. Not wishing to be bound by theory, it appears that the IOX process reduces strength by extending flaws. Line 1503 then shows a Weibull distribution of strength of glass samples that were deep etched from 200 microns thick to 75 microns thick, subject to IOX under the same conditions as the samples of Line 1502, and then given a subsequent light etching to remove <2 microns of thickness from each surface. These samples show an increased strength, of about 1500 MPa at a B10 failure probability, with respect to each of the sample sets of Line 1501 and 1502. FIG. 15 thus shows the benefits of performing a light etch after the IOX. Again, not wishing to be bound by theory, it is believed that the light etch after IOX reduces flaw depth and blunts crack tips introduced by the IOX process itself and, thus, increases the strength of the samples.

Although IOX appears to reduce the strength in deep-etched samples (as seen in FIG. 15), FIG. 16 shows another benefit (in addition to that discussed above in connection with FIGS. 12-14) of strengthening the primary surfaces of the glass for foldable and/or rollable displays. In particular, non-IOXed glass is subject to fatigue by not having its outer surface (of a bend) in compression. Accordingly, non-IOXed glass samples are more likely to see time delayed failure. Line 1601 shows a Weibull distribution of strength of glass samples that were only deep etched from 200 microns thickness to 75 microns thickness (these were not IOXed), and that were subject to 2 point bend strength testing following a very low load 10 gf contact with a cube corner diamond indenter. The cube corner test was performed on a Mitutoyo HM-200 Hardness Testing Machine with a cube corner diamond indenter tip. The test was performed on bare glass placed on the sample stage of the apparatus. The load of 10 grams force (gf) was applied and held for a dwell time of 10 seconds. The indentation was performed in 50% relative humidity and 25° C. The indent is centered in the testing sample, so that this will be the location of maximum stress (minimum radius) when testing by two point bend test. Following indentation, the samples were held in the same environment for 24 hours prior to the two point bend test as described above. The line 1601 shows a strength of about 150 MPa at a B10 failure probability. Line 1603 shows a Weibull distribution of strength of glass samples that were deep etched from 200 microns thickness to 75 microns thickness, were IOXed, subsequently etched to remove 2 microns thickness from each side, and then were subject to 2 point bend strength testing following a very low load 10 gf contact with a cube corner diamond indenter. The line 1603 shows as strength of about 800 MPa at a B10 failure probability. By comparing line 1601 with Line 1501, and by comparing Line 1603 with line 1503, it is seen that any contact will greatly reduce the strength of a non-strengthened part. However, by comparing Line 1603 with Line 1601, it is seen that the damage is contained within the compression depth for the IOXed part, giving greater strengths for the strengthened parts of Line 1603 than for the non-strengthened parts of Line 1601. Accordingly, strengthening, by IOX for example, is s beneficial manner of reducing the effects of contact damage, even contact damage caused by relatively low loads of 10 gf.

Vickers Crack Initiation

Figure 17:
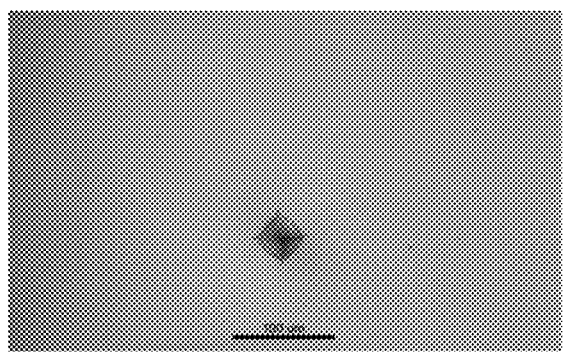
FIG. 17 is a sample glass according to aspects of the disclosure after indentation with Vickers indenter under 1 kgf load.
Figure 18:
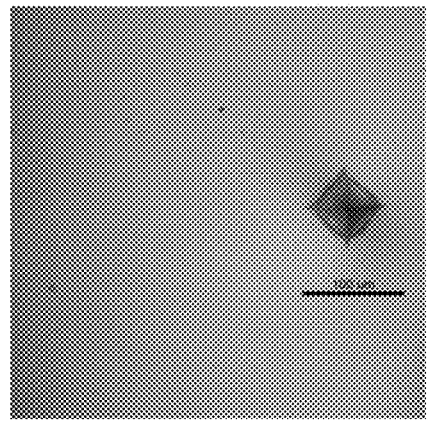
FIG. 18 is a sample glass according to aspects of the disclosure after indentation with a Vickers indenter under 2 kgf load.
Figure 19:
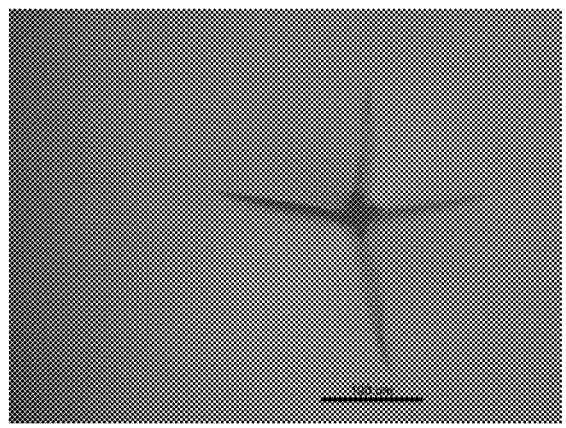
FIG. 19 is a comparative glass after indentation with Vickers indenter under 1 kgf load.
Figure 20:
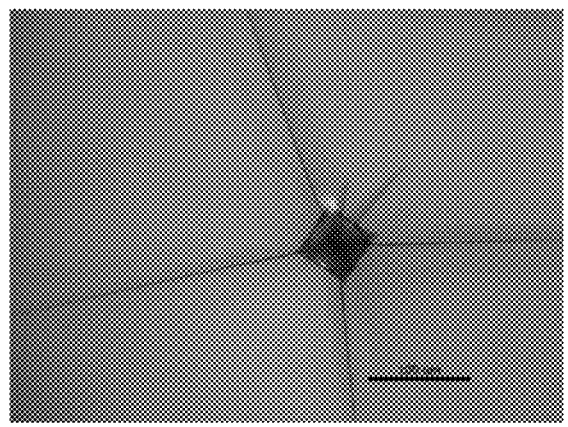
FIG. 20 is a comparative glass after indentation with a Vickers indenter under 2 kgf load.

Examples of glass elements according to the present disclosure are also capable of providing resistance to the formation of strength limiting flaws. This is beneficial when the glass element is used as a cover glass and subject to contact as from a user, or other contact event. Although not wishing to be bound by theory, IOX also provides resistance to the formation of strength-limiting flaws. A force of greater than 2 kgf is necessary to produce/initiate a crack of >100 microns in samples of glass that have been deep-etched, IOXed, and then light etched, as discussed above. FIGS. 17-20 show a comparison between samples FIGS. 17 and 18 that were IOXed (subject to deep-etch, IOX, and then light etch as discussed above) and those in FIGS. 19 and 20 that were not IOXed (but were simply deep etched). FIG. 17 shows an IOXed sample that was subject to a 1 kgf load with a Vickers diamond indenter. The Vickers crack initiation test was performed on a Leco Vickers Hardness Tester LV800AT. The test was performed on bare glass placed on the sample stage of the indentation apparatus. The glass was indented at increasing load until more than 50% of ten indents made at a given load showed the presence of strength limiting flaws. The indentation was performed under ambient conditions with an indent dwell time of 10 seconds. As seen in FIG. 17, the indenter produced a flaw of less than 100 microns. FIG. 18 shows an IOXed sample that was subject to a 2 kgf load with a Vickers indenter. Similarly to FIG. 17, the indenter produced a flaw of less than 100 microns. Accordingly, it is seen that examples of the present disclosure can withstand a 2 kgf load without incurring a strength limiting flaw, i.e., a flaw of greater than 100 microns. FIG. 19 shows a non-IOXed glass sample that was subject to a 1 kgf load with a Vickers indenter. As seen in FIG. 19, the indenter produced a flaw of greater than 100 microns. FIG. 20 shows a non-IOXed glass sample that was subject to a 2 kgf load with a Vickers indenter. As seen in FIG. 20, the indenter produced a flaw of much greater than 100 microns. A comparison of FIG. 17 with FIG. 19, and a comparison of FIG. 18 with FIG. 20, shows that the IOXed glass parts are able to provide resistance to the formation of strength limiting flaws, i.e., of flaws greater than 100 microns. As can be seen by a comparison of FIGS. 18 and 20, a very small increase of force on the Vickers indenter (i.e., from 1 kgf to 2 kgf) produces a much larger flaw in the non-strengthened part. Although not wishing to be bound by theory, it is thought that the Vickers indenter requires much more force (than does the cube corner) to produce strength-limiting flaws because the Vickers indenter has a much wider angle than does the cube corner indenter.

Vickers Hardness

The glass element has a Vickers Hardness of from 550 to 650 kgf/mm2. The Vickers hardness was measured on a Mitutoyo HM-114 Hardness Testing Machine. The hardness was measured by indenting at 200 grams force (gf) and measuring the average of the two major diagonal lengths of the resulting impression. The hardness was calculated by the following equation: VHN=(P*1.8544)/d2, where VHN is Vickers hardness number, P is the applied load of 200 gf, and d is the average major diagonal length. Typically ten VHN measurements are taken to determine the average VHN. Indentation is performed in 50% relative humidity and 25° C. The test is performed on bare glass placed on the sample stage of the indentation apparatus. The dwell time of the indentation is 10 seconds. Hardness, including Vickers Hardness, is a measure of permanent deformation in a material. The harder a material, as evidenced by a higher Vickers Hardness number, the less the permanent deformation in the material. Accordingly, hardness is a measure of scratch and other damage resistance of the material to, for example, keys, and things of similar or lesser hardness that may come into contact with the material. A Vickers Hardness of from 550 to 650 kgf/mm2 provides suitable scratch and other damage resistance of a device cover to keys and other objects that may be found in a user's pocket or backpack, for example, together with the device cover.

Closing Force

Another consideration in a foldable or bendable display is the force to get the device to fold or bend. The force necessary to close the device should not be so high as to make the user uncomfortable when closing it. Additionally, the force should not be so high as to tend to make the device want to open when it is intended to stay closed. Accordingly, the two point bend closing force should be limited. However, because the two point bend closing force also depends upon the dimension of the glass element extending along the direction of the fold line, herein called width, the forces should be normalized based on width. The two point bend closing force is given by Equation (4) below, which assumes that the glass will behave as if it were disposed between two parallel plates, i.e., so that it does not have a constant bending radius. The $(1-v^2)$ term under the modulus takes into account that for a material such as glass, a stress/bend in one direction will produce a shrinking in another direction. This is typically the case for plate-shaped objects.

$$F = \left(\frac{wt}{6}\right)\left(\frac{\sigma_{max}^2}{\left(\frac{E}{1-v^2}\right)}\right) \qquad \text{Equation (4)}$$

wherein t is the thickness of the sample in mm, w is the width in mm of the glass element along the fold line, E is the modulus of the glass material in GPa, v is the poissons ratio of the material, and wherein σmax is given by the following equation (5) when using the parallel plate two point bend method.

$$\sigma_{max} = 1.198 \frac{E}{1-v^2}\left[\frac{t}{(D-t)}\right] \qquad \text{Equation (5)}$$

wherein E is the modulus of the material in GPa, v is the poissons ratio of the material, t is the thickness of the material in mm, and D is the separation distance (in mm) between the parallel plates. Equation (5) is the maximum stress in a parallel plate bend apparatus, and is different from that in Equation (1) because it accounts for the fact that the sample will not achieve a uniform constant bend radius (as was assumed for Equation (1)) in the test apparatus, but will have a smaller minimum radius. The minimum radius (R) is defined as D−h=2.396 R, wherein h is the glass thickness in mm and is the same as t. The minimum radius R, determined for a given plate separation can be used in Equation (1) to determine maximum stress.

Dividing each side of equation (4) by w, width of the glass element along the fold line, leads to a value for F/w. Plugging in values for the glass samples found by the inventors to have particularly beneficial closing force— thickness t=0.075 mm, a plate separation distance D=10 mm (wherein plate separation distance is that in a two point bend method via parallel plates as discussed below in connection with the cycle testing), a modulus E of 71 GPa, a poissons ratio v of 0.205—the inventors have found that a value of F/w of 0.076 N/mm or less leads to an acceptable closing force, i.e., one that is not uncomfortable to a user, and one that does not tend to make the device open when in its folded state. By way of example, the inventors found that with a width of 105.2 mm, a closing force of 7.99N was acceptable. And with a width of 20 mm, a force of 1.52 N was acceptable. Thus, again, normalizing for width, a value F/w=0.076 N/mm or less was found to be acceptable.

Cycle Test

Figure 21:
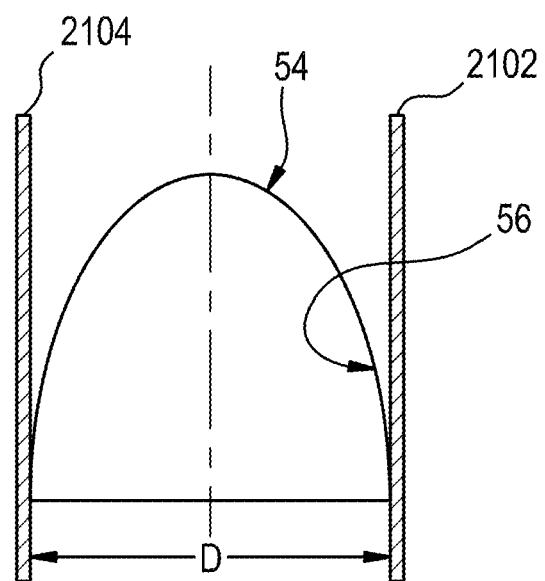
FIG. 21 is a two point bend test configuration.

During use in a display or other device, the glass element 50 may be subject to repeated bending cycles. For example, the display device may be repeatedly folded and unfolded. Thus, to determine a suitable lifetime of the device, it is beneficial to characterize the number of cycles that the glass element may be folded and unfolded. To test the cyclic bending durability of glass element 50, the glass element 50 was disposed in a curved shape between two parallel plates 2102 and 2104 (See FIG. 21) having an initial separation distance D of 30 mm. The plates were then moved, while remaining parallel, so as to decrease the separation distance to a target distance, held at that target distance for about a second, and then returned to the initial separation distance of 30 mm, held at the initial separation distance for about a second, thus ending a cycle. The plates were moved at a rate of 38 mm/s. The cycle is then repeated. The number of cycles may then be counted until the glass element fails. Although an initial separation distance D of 30 mm was chosen, in other tests, the initial separation distance may be greater or less than 30 mm. The value of 30 mm was chosen as a distance at which there would not be significant load on the glass element 50. The target distance can be varied so as to achieve a target bend radius that one desires to test. The target bend radius (being the tightest radius achieved by the glass element being tested) is equal to 0.414 times the separation distance D of the parallel plates 2102, 2104. This is a simplified calculation that essentially ignores the glass thickness h (or t) from the calculation of minimum bending radius R in the discussion following Equation (5) because the glass thickness of interest will typically be much less than the plate separation distance D. However, to the extent necessary, the glass thickness can be accounted for by using the calculation for minimum bending radius R in the discussion following Equation (5) above. The bend radius is not simply half of D because the glass element does not form a perfect semicircle in the test apparatus. Thus, to test different target bend radii, different parallel plate distances can be suitably calculated. As shown, first primary surface 54 makes the outer surface of the bend and contacts with the inner surfaces of the parallel plates, whereas second primary surface 56 forms the inner surface of the bend. When a second layer 70 is present on first primary surface 54, such would be in contact with the parallel plates. Because the thickness of second layer 70 is typically minimal (on the order of 1 micron or less) its thickness may be ignored when calculating bend radius (for first primary surface 54, as shown in FIG. 21) from plate separation distance D. However, to the extent that second layer 70 has any significant thickness, the plate separation distance D may be increased by twice the second layer thickness in order to achieve a desired target bend radius at the primary surface being tested (as shown in FIG. 21, first primary surface 54). Although first primary surface 54 is shown as being the outer primary surface of the bent configuration of element 50, a similar method may be used to test bend radius and cycling with second primary surface 56 as the outer surface of the bend, as appropriate to the configuration which glass element 50 will take in an end device.

A glass element according to one example of the present disclosure was 75 microns thick, had an IOX compressive stress of 775 MPa, and a DOL of 10 microns, and withstood over 200,000 bending cycles at a target plate separation distance D of 9 mm, as described above. Another glass element according to another example of the present disclosure was 75 microns thick, had an IOX compressive stress of 775 MPa, and a DOL of 10 microns, and withstood over 200,000 bending cycles at a target plate separation distance D of 8 mm, as described above. For a typical display device, passing 200,000 bending cycles is considered a suitable lifetime.

Still further, although a dynamic bending test is described above, a similar parallel plate test apparatus may be used to test a static bend radius. In this case, the parallel plates 2102, 2104 are set to a desired separation distance D so that 0.414 times the plate separation distance equals the desired static bend radius to be tested. Once the parallel plates 2102, 2104 are set at the necessary separation distance D, the glass element is placed between the parallel plates so as to achieve a bent configuration as shown in FIG. 21.

Conclusion

It will be apparent to those skilled in the art that various modifications and variations can be made without departing from the spirit or scope of the claims. For example, although a compressive stress region 60 in the stack assembly 100 (see FIGS. 1, 1A) was shown and described as extending from the first primary surface 54a into the glass layer 50a, a similar compressive stress region may be included extending from the second primary surface 56a into the glass layer 50a. Also, for example, although the center of a bend radius was shown as being on the same side of the stack assembly 100 as the second primary surface 56a, such need not be the case. Instead, or in addition thereto, the center of a bend radius may be disposed on the same side of the stack assembly 100 as the first primary surface 54a. A center of a bend radius may be disposed on each side of the stack assembly 100 as when, for example, the stack is put in a tri-fold configuration. Further, for example, there may be disposed more than one center of a bend radius disposed on one side of the stack assembly according to other manners of folding the stack assembly. Still further, for example, although only one bend radius was shown in any one particular example, any suitable and/or practical number of bend radii may be present in the stack assembly.

According to a first exemplary aspect, a stack assembly is provided that comprises: a glass element having a thickness from about 25 µm to about 125 µm, a first primary surface, and a second primary surface, the glass element further comprising: (a) a first glass layer having a first primary surface; and (b) a compressive stress region extending from the first primary surface of the glass layer to a first depth in the glass layer, the region defined by a compressive stress of at least about 100 MPa at the first primary surface of the layer. The glass element is characterized by: (a) an absence of failure when the element is held at a bend radius from about 3 mm to about 20 mm for at least 60 minutes at about 25° C. and about 50% relative humidity; (b) a puncture resistance of greater than about 1.5 kgf when the second primary surface of the element is supported by (i) an approximately 25 µm thick pressure-sensitive adhesive having an elastic modulus of less than about 1 GPa and (ii) an approximately 50 µm thick polyethylene terephthalate layer having an elastic modulus of less than about 10 GPa, and the first primary surface of the element is loaded with a stainless steel pin having a flat bottom with a 200 µm diameter; and (c) a pencil hardness of greater than 8 H.

The assembly of the first exemplary aspect, wherein the glass layer comprises an alkali-free or alkali-containing aluminosilicate, borosilicate, boroaluminosilicate, or silicate glass composition.

The assembly of any one of the preceding first exemplary aspects, wherein the thickness of the element is from about 50 µm to about 100 µm.

The assembly of any one of the preceding first exemplary aspects, wherein the thickness of the element is from about 60 µm to about 80 µm.

The assembly of any one of the preceding first exemplary aspects, wherein the bend radius of the element is from about 3 mm to about 10 mm.

The assembly of any one of the preceding first exemplary aspects, wherein the bend radius of the element is from about 5 mm to about 7 mm.

The assembly of any one of the preceding first exemplary aspects, wherein the compressive stress at the first primary surface of the glass layer is from about 600 MPa to 1000 MPa.

The assembly of any one of the preceding first exemplary aspects, wherein the first depth is set at approximately one third of the thickness of the glass layer or less from the first primary surface of the glass layer.

The assembly of any one of the preceding first exemplary aspects, wherein the first depth is set at approximately 20% of the thickness of the glass layer or less from the first primary surface of the glass layer.

According to a second exemplary aspect, a stack assembly is provided according to the first exemplary aspect, further comprising: a second layer having a low coefficient of friction disposed on the first primary surface of the glass element.

The assembly according to the second exemplary aspect, wherein the second layer is a coating comprising a fluorocarbon material selected from the group consisting of thermoplastics and amorphous fluorocarbons.

The assembly according to the second exemplary aspect, wherein the second layer is a coating comprising one or more of the group consisting of a silicone, a wax, a polyethylene, a hot-end, a parylene, and a diamond-like coating preparation.

The assembly according to the second exemplary aspect, wherein the second layer is a coating comprising a material selected from the group consisting of zinc oxide, molybdenum disulfide, tungsten disulfide, hexagonal boron nitride, and aluminum magnesium boride.

The assembly according to the second exemplary aspect, wherein the second layer is a coating comprising an additive selected from the group consisting of zinc oxide, molybdenum disulfide, tungsten disulfide, hexagonal boron nitride, and aluminum magnesium boride.

The assembly of any one of the preceding first exemplary aspects, wherein the compressive stress region comprises a maximum flaw size of 5 μm or less at the first primary surface of the glass layer.

The assembly of any one of the preceding first exemplary aspects, wherein the compressive stress region comprises a maximum flaw size of 2.5 μm or less at the first primary surface of the glass layer.

The assembly of any one of the preceding first exemplary aspects, wherein the compressive stress region comprises a maximum flaw size of 0.4 μm or less at the first primary surface of the glass layer.

The assembly of any one of the preceding first exemplary aspects, wherein the glass element is further characterized by an absence of failure when the element is held at a bend radius from about 3 mm to about 20 mm for at least 120 hours at about 25° C. and about 50% relative humidity.

The assembly of any one of the preceding first and second exemplary aspects, wherein the glass element and the second layer having a low coefficient of friction are configured for use in a display device.

The assembly of any one of the preceding first exemplary aspects, wherein the compressive stress region comprises a plurality of ion-exchangeable metal ions and a plurality of ion-exchanged metal ions, the ion-exchanged metal ions having an atomic radius larger than the atomic radius of the ion-exchangeable metal ions.

The assembly of any one of the preceding first exemplary aspects, wherein the glass layer further comprises an edge, and the glass element further comprises an edge compressive stress region extending from the edge to an edge depth in the glass layer, the edge compressive stress region defined by a compressive stress of at least about 100 MPa at the edge.

According to a third exemplary aspect, a stack assembly is provided according to the first exemplary aspect, wherein the glass layer further comprises a core region, and a first and a second clad region disposed on the core region, and further wherein the coefficient of thermal expansion for the core region is greater than the coefficient of thermal expansion for the clad regions.

The assembly according to the third exemplary aspect, wherein the core region has a core thickness, the first and second clad regions have a first and a second clad thickness, and a thickness ratio is given by the core thickness divided by the sum of the first and the second clad thickness, and further wherein the thickness ratio is greater than or equal to three.

The assembly of any one of the preceding first exemplary aspects, wherein the glass element further comprises one or more additional glass layers disposed beneath the first glass layer.

The assembly of any one of the preceding first exemplary aspects, wherein the glass element further comprises two additional glass layers disposed beneath the first glass layer.

According to a fourth exemplary aspect, a stack assembly is provided according to the first exemplary aspect, further comprising: a glass structure having a thickness greater than the thickness of the glass element and two substantially parallel edge surfaces, the structure comprising the glass element, wherein the element is arranged in a central region of the structure between the substantially parallel edge surfaces.

According to a fifth exemplary aspect, a glass article is provided that comprises: a glass layer having a thickness from about 25 μm to about 125 μm, the layer further comprising: (a) a first primary surface; (b) a second primary surface; and (c) a compressive stress region extending from the first primary surface of the glass layer to a first depth in the glass layer, the region defined by a compressive stress of at least about 100 MPa at the first primary surface of the layer. The glass layer is characterized by: (a) an absence of failure when the layer is held at a bend radius from about 3 mm to about 20 mm for at least 60 minutes at about 25° C. and about 50% relative humidity; (b) a puncture resistance of greater than about 1.5 kgf when the second primary surface of the layer is supported by (i) an approximately 25 μm thick pressure-sensitive adhesive having an elastic modulus of less than about 1 GPa and (ii) an approximately 50 μm thick polyethylene terephthalate layer having an elastic modulus of less than about 10 GPa, and the first primary surface of the layer is loaded with a stainless steel pin having a flat bottom with a 200 μm diameter; and (c) a pencil hardness of greater than 8 H.

The assembly of the preceding fifth exemplary aspect, wherein the glass layer comprises an alkali-free or alkali-containing aluminosilicate, borosilicate, boroaluminosilicate, or silicate glass composition.

The assembly of any one of the preceding fifth exemplary aspects, wherein the thickness of the layer is from about 50 μm to about 100 μm.

The assembly of any one of the fifth second exemplary aspects, wherein the bend radius of the layer is from about 3 mm to about 10 mm.

The assembly of any one of the preceding fifth exemplary aspects, wherein the compressive stress at the first primary surface of the glass layer is from about 600 MPa to 1000 MPa.

The assembly of any one of the preceding fifth exemplary aspects, wherein the first depth is set at approximately one third of the thickness of the glass layer or less from the first primary surface of the glass layer.

According to a sixth exemplary aspect, a stack assembly is provided according to the fifth exemplary aspect, further comprising: a second layer having a low coefficient of friction disposed on the first primary surface of the glass layer.

The assembly of any one of the preceding fifth exemplary aspects, wherein the compressive stress region comprises a maximum flaw size of 5 μm or less at the first primary surface of the glass layer.

The assembly of any one of the preceding fifth exemplary aspects, wherein the glass layer is further characterized by an absence of failure when the layer is held at a bend radius from about 3 mm to about 20 mm for at least 120 hours at about 25° C. and about 50% relative humidity.

The assembly of any one of the preceding fifth exemplary aspects and the sixth exemplary aspect, wherein the glass layer and the second layer having a low coefficient of friction are configured for use in a display device.

The assembly of any one of the preceding fifth exemplary aspects, wherein the compressive stress region comprises a plurality of ion-exchangeable metal ions and a plurality of ion-exchanged metal ions, the ion-exchanged metal ions having an atomic radius larger than the atomic radius of the ion-exchangeable metal ions.

The assembly of any one of the preceding fifth exemplary aspects, wherein the glass layer further comprises an edge, and an edge compressive stress region extending from the edge to an edge depth in the glass layer, the edge compressive stress region defined by a compressive stress of at least about 100 MPa at the edge.

The assembly of any one of the preceding fifth exemplary aspects, wherein the glass layer further comprises a core region, and a first and a second clad region disposed on the core region, and further wherein the coefficient of thermal expansion for the core region is greater than the coefficient of thermal expansion for the clad regions.

The assembly of any one of the preceding fifth exemplary aspects, wherein the core region has a core thickness, the first and second clad regions have a first and a second clad thickness, and a thickness ratio is given by the core thickness divided by the sum of the first and the second clad thickness, and further wherein the thickness ratio is greater than or equal to three.

According to a seventh exemplary aspect, a stack assembly is provided according to the fifth exemplary aspect, further comprising: a glass structure having a thickness greater than the thickness of the glass layer and two substantially parallel edge surfaces, the structure comprising the glass layer, wherein the layer is arranged in a central region of the structure between the substantially parallel edge surfaces.

According to an eighth exemplary aspect, a method of making a stack assembly is provided that comprises the steps: forming a first glass layer having a first primary surface, a compressive stress region extending from the first primary surface of the glass layer to a first depth in the glass layer, and a final thickness, wherein the region is defined by a compressive stress of at least about 100 MPa at the first primary surface of the layer; and forming a glass element having a thickness from about 25 µm to about 125 µm, the element further comprising the glass layer, a first primary surface, and a second primary surface. The glass element is characterized by: (a) an absence of failure when the element is held at a bend radius from about 3 mm to about 20 mm for at least 60 minutes at about 25° C. and about 50% relative humidity; (b) a puncture resistance of greater than about 1.5 kgf when the second primary surface of the element is supported by (i) an approximately 25 µm thick pressure-sensitive adhesive having an elastic modulus of less than about 1 GPa and (ii) an approximately 50 µm thick polyethylene terephthalate layer having an elastic modulus of less than about 10 GPa, and the first primary surface of the element is loaded with a stainless steel pin having a flat bottom with a 200 µm diameter; and (c) a pencil hardness of greater than 8 H.

The method according to the eighth exemplary aspect, wherein the step of forming the first glass layer comprises a forming process selected from the group consisting of fusion, slot drawing, rolling, redrawing and float processes, the forming process further configured to form the glass layer to the final thickness.

The method according to any of the eighth exemplary aspects, wherein the step of forming the first glass layer comprises a forming process selected from the group consisting of fusion, slot drawing, rolling, redrawing and float processes, and a material removal process configured to remove material from the glass layer to reach the final thickness.

The method according to any of the eighth exemplary aspects, wherein the glass layer comprises an alkali-free or alkali-containing aluminosilicate, borosilicate, boroaluminosilicate, or silicate glass composition.

According to a ninth exemplary aspect, a method is provided according to the eighth exemplary aspect, wherein the step of forming a compressive stress region extending from the first primary surface of the glass layer to a first depth in the glass layer comprises: providing a strengthening bath comprising a plurality of ion-exchanging metal ions having an atomic radius larger in size than the atomic radius of a plurality ion-exchangeable metal ions contained in the glass layer; and submersing the glass layer in the strengthening bath to exchange a portion of the plurality of ion-exchangeable metal ions in the glass layer with a portion of the plurality of the ion-exchanging metal ions in the strengthening bath to form a compressive stress region extending from the first primary surface to the first depth in the glass layer.

The method according to the ninth exemplary aspect, wherein the submersing step comprises submersing the glass layer in the strengthening bath at about 400° C. to about 450° C. for about 15 minutes to about 180 minutes.

According to a tenth exemplary aspect, a method is provided according to the eighth exemplary aspect, further comprising the step: removing about 1 µm to about 5 µm from the final thickness of the glass layer at the first primary surface after the step of forming the compressive stress region.

The method according to any of the eighth exemplary aspects, wherein the final thickness is from about 50 µm to about 100 µm.

The method according to any of the eighth exemplary aspects, wherein the bend radius is from about 3 mm to about 10 mm.

The method according to any of the eighth exemplary aspects, wherein the compressive stress is from about 600 MPa to 1000 MPa.

The method according to any of the eighth exemplary aspects, wherein the first depth is set at approximately one third of the final thickness of the glass layer or less from the first primary surface of the glass layer.

According to an eleventh exemplary aspect, a method is provided according to the eight exemplary aspect, wherein the step of forming the first glass layer further comprises: forming a core region; and forming a first and a second clad region disposed on the core region, and further wherein the coefficient of thermal expansion for the core region is greater than the coefficient of thermal expansion for the clad regions.

The method according to the eleventh exemplary aspect, wherein the core region has a core thickness, the first and second clad regions have a first and a second clad thickness, and a thickness ratio is given by the core thickness divided by the sum of the first and the second clad thickness, and further wherein the thickness ratio is greater than or equal to three.

The method according to any of the eighth exemplary aspects, further comprising the step: forming a second layer having a low coefficient of friction disposed on the first primary surface of the glass layer.

The method according to the tenth exemplary aspect, wherein the removing step is conducted such that the compressive stress region comprises a maximum flaw size of 5 µm or less at the first primary surface of the glass layer.

The method according to the tenth exemplary aspect, wherein the removing step is conducted such that the compressive stress region comprises a maximum flaw size of 2.5 µm or less at the first primary surface of the glass layer.

The method according to any of the eighth exemplary aspects, wherein the glass layer is further characterized by an absence of failure when the layer is held at a bend radius from about 3 mm to about 20 mm for at least 120 hours at about 25° C. and about 50% relative humidity.

According to a twelfth aspect, there is provided a glass substrate comprising: a first thickness providing a puncture resistance of at least 3 Kg force; and a second thickness providing the substrate the ability to achieve a bend radius of 5 mm.

According to a thirteenth aspect, there is provided the glass substrate of aspect 12, wherein the second thickness provides the substrate the ability to achieve a bend radius of 2 mm.

According to a fourteenth aspect, there is provided the glass substrate of aspect 12, wherein the second thickness provides the substrate the ability to achieve a bend radius of 1 mm.

According to a fifteenth aspect, there is provided the glass substrate of any one of aspects 12-14, wherein the second thickness is ≤30 microns.

According to a sixteenth aspect, there is provided the glass substrate of any one of aspects 12-14, wherein the second thickness is ≤25 microns.

According to a seventeenth aspect, there is provided the glass substrate of any one of aspects 12-16, further comprising a length, and wherein the second thickness is continuously provided across the entire length.

According to an eighteenth aspect, there is provided the glass substrate of any one of aspects 12-17, further comprising a protective member disposed so as to cover a portion of the substrate having the second thickness.

According to a nineteenth aspect, there is provided the glass substrate of any one of aspects 12-18, wherein the first thickness is ≥130 microns.

According to a twentieth aspect, there is provided the glass substrate of any one of aspects 12-19, wherein the glass substrate comprises a composition that is an alkali-free, alumino-boro-silicate, glass.

According to a twenty-first aspect, there is provided the glass substrate of any one of aspects 12-20, capable of at least 100 cycles of bending to a 5 mm radius before failure.

According to a twenty-second aspect, there is provided the glass substrate of any one of aspects 12-21, further comprising a Young's modulus of >50 GPa.

According to a twenty-third aspect, there is provided the glass substrate of any one of aspects 12-22, having a pencil hardness of at least 8 H.

According to a twenty-fourth aspect, there is provided a display device comprising a body and a cover glass, wherein the cover glass comprises the glass substrate of any one of aspects 12-23.

According to a twenty-fifth aspect, there is provided a method of etching glass comprising: obtaining a substrate having a first thickness, wherein the first thickness provides the substrate with a puncture resistance of at least 3 kgf force; and removing a portion of the substrate so as to achieve a second thickness, the second thickness being less than the first, wherein the second thickness provides the substrate the ability to achieve a bend radius of 5 mm, wherein after the removing, the substrate maintains a portion having the first thickness.

According to a twenty-sixth aspect, there is provided the method of aspect 25, wherein the removing is performed by etching.

According to a twenty-seventh aspect, there is provided the method of aspect 25 or aspect 26, wherein the second thickness provides the substrate the ability to achieve a bend radius of 2 mm.

According to a twenty-eighth aspect, there is provided the method of aspect 25 or 26, wherein the second thickness provides the substrate the ability to achieve a bend radius of 1 mm.

According to a twenty-ninth aspect, there is provided the method of any one of aspects 25-28, wherein the second thickness is ≤30 microns.

According to a thirtieth aspect, there is provided the method of any one of aspects 25-28, wherein the second thickness is ≤25 microns.

According to a thirty-first aspect, there is provided the method of any one of aspects 25-30, wherein the substrate comprises a length, and wherein removing provides the second thickness continuously across the entire length.

According to a thirty-second aspect, there is provided the method of any one of aspects 25-31, further comprising disposing a protective member to cover a portion of the substrate having the second thickness.

According to a thirty-third aspect, there is provided the method of any one of aspects 25-32, wherein the first thickness is ≤130 microns.

According to a thirty-fourth aspect, there is provided the method of any one of aspects 25-33, wherein the glass substrate comprises a composition that is an alkali-free, alumino-boro-silicate, glass.

According to a thirty-fifth aspect, there is provided the method of any one of aspects 25-34, wherein the substrate comprises an edge, and the method further comprising etching the edge.

According to a thirty-sixth aspect, there is provided the method of aspect 35, wherein etching the edge is performed simultaneously with the removing.

According to a thirty-seventh aspect, there is provided the method of any one of aspects 25-36, wherein the glass substrate comprises a Young's modulus of >50 GPa.

According to a thirty-eighth aspect, there is provided the method of aspect 25-37, wherein the glass substrate comprises a pencil hardness of at least 8 H.

According to a thirty ninth aspect, there is provided a glass article, comprising:
a glass element having a thickness from about 25 μm to about 125 μm, the glass element further comprising:
(a) a first primary surface;
(b) a second primary surface; and
(c) a compressive stress region extending from the first primary surface of the glass element to a first depth in the glass element, the region defined by a compressive stress σI of at least about 100 MPa at the first primary surface of the glass element,
wherein the glass element is characterized by:
(a) a stress profile such that when the glass element is bent to a target bend radius of from 1 mm to 20 mm, with the center of curvature on the side of the second primary surface so as to induce a bending stress σB at the first primary surface, σI+σB<0; and
(b) a puncture resistance of greater than about 1.5 kgf when the first primary surface of the glass element is loaded with a tungsten carbide ball having a diameter of 1.5 mm.

According to a fortieth aspect, there is provided the glass article of aspect 39, wherein σI+σB<0 to a depth of at least one micron below the first primary surface.

According to a forty first aspect, there is provided the glass article of aspect 39, wherein σI+σB<0 to a depth of at least two microns below the first primary surface.

According to a forty second aspect, there is provided the glass article of aspect 39, wherein σI+σB<0 to a depth of at least three microns below the first primary surface.

According to a forty third aspect, there is provided glass article, comprising:
a glass element having a thickness from about 25 μm to about 125 μm, the glass element further comprising:

(a) a first primary surface;
(b) a second primary surface; and
(c) a compressive stress region extending from the first primary surface of the glass element to a first depth in the glass element, the region defined by a compressive stress of at least about 100 MPa at the first primary surface of the glass element,
wherein the glass element is characterized by:
(a) an absence of failure when the glass element is subject to 200,000 cycles of bending to a target bend radius of from 1 mm to 20 mm, by the parallel plate method;
(b) a puncture resistance of greater than about 1.5 kgf when the first primary surface of the glass element is loaded with a tungsten carbide ball having a diameter of 1.5 mm.

According to a forty fourth aspect, there is provided glass article, comprising:
a glass element having a thickness from about 25 μm to about 125 μm, the glass element further comprising:
(a) a first primary surface;
(b) a second primary surface; and
(c) a compressive stress region extending from the first primary surface of the glass element to a first depth in the glass element, the region defined by a compressive stress of at least about 100 MPa at the first primary surface of the glass element,
wherein the glass element is characterized by:
(a) an absence of failure when the glass element is held at a bend radius from about 1 mm to about 20 mm for at least 60 minutes at about 25° C. and about 50% relative humidity;
(b) a puncture resistance of greater than about 1.5 kgf when the first primary surface of the glass element is loaded with a tungsten carbide ball having a diameter of 1.5 mm.

According to a forty fifth aspect, there is provided the article of any one of aspects 39-44, the glass element comprising (c) a pencil hardness of greater than or equal to 8 H.

According to a forty sixth aspect, there is provided the article of any one of aspects 39-45, the glass element comprising a plurality of layers.

According to a forty seventh aspect, there is provided the article of aspect 46, wherein each of the plurality of layers has the same configuration.

According to a forty eighth aspect, there is provided the article of any one of aspects 39-47, the glass element comprises a puncture resistance of greater than about 1.5 kgf when the first primary surface of the glass element is loaded with a stainless steel pin having a flat bottom with a 200 μm diameter.

According to a forty ninth aspect, there is provided the article of any one of aspects 39-48, the glass element comprises a puncture resistance of greater than about 1.5 kgf when the first primary surface of the glass element is loaded with a tungsten carbide ball having a diameter of 1.0 mm.

According to a fiftieth aspect, there is provided the article of any one of aspects 39-49, the glass element comprises a puncture resistance of greater than about 1 kgf when the first primary surface of the glass element is loaded with a tungsten carbide ball having a diameter of 0.5 mm.

According to a fifty first aspect, there is provided the article of any one of aspects 39-50, wherein when the first primary surface of the glass element is subject to a 1 kgf load from a Vickers indenter, there is introduced a flaw of ≤100 microns in the first primary surface.

According to a fifty second aspect, there is provided the article of any one of aspects 39-50, wherein when the first primary surface of the glass element is subject to a 2 kgf load from a Vickers indenter, there is introduced a flaw of ≤100 microns in the first primary surface.

According to a fifty third aspect, there is provided the article of any one of aspects 39-52, wherein the glass element has a Vickers hardness of 550 to 650 kgf/mm2.

According to a fifty fourth aspect, there is provided the article of any one of aspects 39-53, wherein the glass element has a retained B10 bend strength of greater than 800 MPa after contact with a cube corner diamond indenter loaded with 10 gf.

According to a fifty fifth aspect, there is provided the article of any one of aspects 39-54, comprising F/w≤0.76 N/mm, wherein F is the closing force to put the glass element at the target bend radius, and w is the dimension of the glass element in a direction parallel to the axis around which the glass is bent According to a fifty sixth aspect, there is provided the article of any one of aspects 39-55, wherein the glass element comprises an alkali-free or alkali-containing aluminosilicate, borosilicate, boroaluminosilicate, or silicate glass composition.

According to a fifty seventh aspect, there is provided the article of any one of aspects 39-56, wherein the thickness of the glass element is from about 50 μm to about 100 μm.

According to a fifty eighth aspect, there is provided the article any one of aspects 39-57, wherein the bend radius of the glass element is from about 3 mm to about 10 mm.

According to a fifty ninth aspect, there is provided the article of any one of aspects 39-58, wherein the compressive stress at the first primary surface of the glass element is from about 600 MPa to 1000 MPa.

According to a sixtieth aspect, there is provided the article of any one of aspects 39-59, wherein the first depth is set at approximately one third of the thickness of the glass element or less from the first primary surface of the glass element.

According to a sixty first aspect, there is provided the article of any one of aspects 39-60, further comprising:
a second layer having a low coefficient of friction disposed on the first primary surface of the glass element.

According to a sixty second aspect, there is provided the article of any one of aspects 39-61, wherein the compressive stress region comprises a maximum flaw size of 5 μm or less at the first primary surface of the glass element.

According to a sixty third aspect, there is provided the article of any one of aspects 39-62, wherein the compressive stress region comprises a plurality of ion-exchangeable metal ions and a plurality of ion-exchanged metal ions, the ion-exchanged metal ions having an atomic radius larger than the atomic radius of the ion-exchangeable metal ions.

According to a sixty fourth aspect, there is provided the article of 63, wherein the glass element further comprises an edge, and an edge compressive stress region extending from the edge to an edge depth in the glass element, the edge compressive stress region defined by a compressive stress of at least about 100 MPa at the edge.

According to a sixty fifth aspect, there is provided a foldable electronic device, comprising:
an electronic device having a foldable feature,
wherein the foldable feature comprises the stack assembly according to aspect 39-64.

According to a sixty sixth aspect, there is provided a method of making a stack assembly, comprising the steps:
forming a glass element having a thickness from about 25 μm to about 125 μm, the glass element further comprising:
(a) a first primary surface;
(b) a second primary surface; and (c) a compressive stress region extending from the first primary surface of the glass element to a first depth in the glass element, the region defined by a compressive stress σI of at least about 100 MPa at the first primary surface of the glass element, wherein the glass element is characterized by:

(a) a stress profile such that when the glass element is bent to a target bend radius of from 1 mm to 20 mm, with the center of curvature on the side of the second primary surface so as to induce a bending stress σB at the first primary surface, σI+σB<0; and (b) a puncture resistance of greater than about 1.5 kgf when the first primary surface of the glass element is loaded with a tungsten carbide ball having a diameter of 1.5 mm.

According to a sixty seventh aspect, there is provided the glass article of aspect 66, wherein σI+σB<0 to a depth of at least one micron below the first primary surface.

According to a sixty eighth aspect, there is provided the glass article of aspect 66, wherein σI+σB<0 to a depth of at least two microns below the first primary surface.

According to a sixty ninth aspect, there is provided the glass article of aspect 66, wherein σI+σB<0 to a depth of at least three microns below the first primary surface.

According to a seventieth aspect, there is provided a method of making a stack assembly, comprising the steps:

forming a glass element having a thickness from about 25 μm to about 125 μm, the glass element further comprising:

(a) a first primary surface;

(b) a second primary surface; and (c) a compressive stress region extending from the first primary surface of the glass element to a first depth in the glass element, the region defined by a compressive stress of at least about 100 MPa at the first primary surface of the glass element, wherein the glass element is characterized by:

(a) an absence of failure when the glass element is subject to 200,000 cycles of bending to a target bend radius of from 1 mm to 20 mm, by the parallel plate method;

(b) a puncture resistance of greater than about 1.5 kgf when the first primary surface of the glass element is loaded with a tungsten carbide ball having a diameter of 1.5 mm.

According to a seventy first aspect, there is provided a method of making a stack assembly, comprising the steps:

forming a first glass element having a first primary surface, a compressive stress region extending from the first primary surface of the glass element to a first depth in the glass element, and a final thickness, wherein the region is defined by a compressive stress of at least about 100 MPa at the first primary surface of the glass element, wherein the glass element is characterized by:

(a) an absence of failure when the glass element is held at a bend radius from about 1 mm to about 20 mm for at least 60 minutes at about 25° C. and about 50% relative humidity;

(b) a puncture resistance of greater than about 1.5 kgf when the first primary surface of the glass element is loaded with a tungsten carbide ball having a diameter of 1.5 mm.

According to a seventy second aspect, there is provided the method of any one of aspects 66-71, wherein the step of forming the first glass layer comprises a forming process selected from the group consisting of fusion, slot drawing, rolling, redrawing and float processes, the forming process further configured to form the glass layer to the final thickness.

According to a seventy third aspect, there is provided the method of any one of aspects 66-71, wherein the step of forming the first glass layer comprises a forming process selected from the group consisting of fusion, slot drawing, rolling, redrawing and float processes, and a material removal process that removes material from the glass layer to reach the final thickness.

According to a seventy fourth aspect, there is provided the method of any one of aspects 66-73, wherein the glass layer comprises an alkali-free or alkali-containing aluminosilicate, borosilicate, boroaluminosilicate, or silicate glass composition.

According to a seventy fifth aspect, there is provided the method of any one of aspects 66-74, wherein the step of forming a compressive stress region extending from the first primary surface of the glass layer to a first depth in the glass layer comprises:

providing a strengthening bath comprising a plurality of ion-exchanging metal ions having an atomic radius larger in size than the atomic radius of a plurality ion-exchangeable metal ions contained in the glass layer; and submersing the glass layer in the strengthening bath to exchange a portion of the plurality of ion-exchangeable metal ions in the glass layer with a portion of the plurality of the ion-exchanging metal ions in the strengthening bath to form a compressive stress region extending from the first primary surface to the first depth in the glass layer.

According to a seventy sixth aspect, there is provided the method of aspect 75, wherein the submersing step comprises submersing the glass layer in the strengthening bath at about 400° C. to about 450° C. for about 15 minutes to about 180 minutes.

According to a seventy seventh aspect, there is provided the method of any one of aspects 66-76, further comprising the step:

removing about 1 μm to about 5 μm from the final thickness of the glass layer at the first primary surface after the step of forming the compressive stress region.

According to a seventy eighth aspect, there is provided the method of aspect 75 or aspect 76, further comprising the step:

removing about 1 μm to about 5 μm from the final thickness of the glass layer at the first primary surface after the step of forming the compressive stress region, wherein the removing step is conducted after the submersing the glass layer step.

According to a seventy ninth aspect, there is provided the method of any one of aspects 66-78, wherein the compressive stress is from about 600 MPa to 1000 MPa.

According to a eightieth aspect, there is provided the method of any one of aspects 66-79, the glass element comprising a pencil hardness of greater than or equal to 8 H.

According to a eighty first aspect, there is provided the method of any one of aspects 66-80, the glass element comprising a plurality of layers.

According to a eighty second aspect, there is provided the method of aspect 81, wherein each of the plurality of layers has the same configuration.

According to a eighty third aspect, there is provided the method of any one of aspects 66-82, the glass element comprises a puncture resistance of greater than about 1.5 kgf when the first primary surface of the glass element is loaded with a stainless steel pin having a flat bottom with a 200 μm diameter.

According to a eighty fourth aspect, there is provided the method of any one of aspects 66-83, the glass element comprises a puncture resistance of greater than about 1.5 kgf when the first primary surface of the glass element is loaded with a tungsten carbide ball having a diameter of 1.0 mm.

According to a eighty fifth aspect, there is provided the method of any one of aspects 66-84, the glass element comprises a puncture resistance of greater than about 1 kgf when the first primary surface of the glass element is loaded with a tungsten carbide ball having a diameter of 0.5 mm.

According to a eighty sixth aspect, there is provided the method of any one of aspects 66-85, wherein when the first primary surface of the glass element is subject to a 1 kgf load from a Vickers indenter, there is introduced a flaw of ≤100 microns in the first primary surface.

According to a eighty seventh aspect, there is provided the method of 85, wherein when the first primary surface of the glass element is subject to a 2 kgf load from a Vickers indenter, there is introduced a flaw of ≤100 microns in the first primary surface.

According to a eighty eighth aspect, there is provided the method of any one of aspects 66-87, wherein the glass element has a Vickers hardness of 550 to 650 kgf/mm2.

According to a eighty ninth aspect, there is provided the method of any one of aspects 66-88, wherein the glass element has a retained B10 bend strength of greater than 800 MPa after contact with a cube corner diamond indenter loaded with 10 gf.

According to a ninetieth aspect, there is provided the method of any one of aspects 66-89, comprising F/w≤0.76 N/mm, wherein F is the closing force to put the glass element at the target bend radius, and w is the dimension of the glass element in a direction parallel to the axis around which the glass is bent.

What is claimed is:

1. A stack assembly comprising:
a glass element having a thickness from about 25 μm to about 125 μm, a first primary surface, and a second primary surface, the glass element further comprising: (a) a first glass layer having a first primary surface; (b) a compressive stress region extending from the first primary surface of the glass layer to a first depth in the glass layer, the region defined by a compressive stress of at least about 100 MPa at the first primary surface of the layer; and (c) a second layer having a coefficient of friction lower than that of the first glass layer disposed on the first primary surface of the glass element, wherein the second layer is a coating comprising a fluorocarbon material selected from the group consisting of thermoplastics and amorphous fluorocarbons; the glass element is characterized by: (a) an absence of failure when the element is held at a bend radius from about 1 mm to about 10 mm for at least 60 minutes at about 25° C. and about 50% relative humidity.

2. The stack assembly of claim 1, wherein the second layer coating further comprises one or more of the group consisting of a silicone, a wax, a polyethylene, a parylene, and a diamond-like coating.

3. The stack assembly of claim 1, wherein the glass element and the second layer having a low coefficient of friction are disposed in a display device.

4. The stack assembly of claim 1, wherein the glass layer comprises an alkali-free or alkali-containing aluminosilicate, borosilicate, boroaluminosilicate, or silicate glass composition.

5. The stack assembly of claim 1, wherein the compressive stress at the first primary surface of the glass layer is from about 600 MPa to 1000 MPa.

6. The stack assembly of claim 1, wherein the first depth is set at approximately one third of the thickness of the glass layer or less from the first primary surface of the glass layer.

7. The stack assembly of claim 1, wherein the first depth is set at approximately 20% of the thickness of the glass layer or less from the first primary surface of the glass layer.

8. The stack assembly of claim 1, wherein the compressive stress region comprises a maximum flaw size of 5 μm or less at the first primary surface of the glass layer.

9. The stack assembly of claim 1, wherein the compressive stress region comprises a plurality of ion-exchangeable metal ions and a plurality of ion-exchanged metal ions, the ion-exchanged metal ions having an atomic radius larger than the atomic radius of the ion-exchangeable metal ions.

10. The stack assembly of claim 1, wherein the glass layer further comprises an edge, and the glass element further comprises an edge compressive stress region extending from the edge to an edge depth in the glass layer, the edge compressive stress region defined by a compressive stress of at least about 100 MPa at the edge.

11. The stack assembly of claim 1, wherein the glass layer further comprises a core region, and a first and a second clad region disposed on the core region, and further wherein the coefficient of thermal expansion for the core region is greater than the coefficient of thermal expansion for the clad regions, wherein the core region has a core thickness, the first and second clad regions have a first and a second clad thickness, and a thickness ratio is given by the core thickness divided by the sum of the first and the second clad thickness, and further wherein the thickness ratio is greater than or equal to three.

12. The stack assembly of claim 1, wherein the glass element further comprises one or more additional glass layers disposed beneath the first glass layer.

13. The stack assembly of claim 1, further comprising: a glass structure having a thickness greater than the thickness of the glass element and two substantially parallel edge surfaces, the structure comprising the glass element, wherein the element is arranged in a central region of the structure between the substantially parallel edge surfaces.

14. The stack assembly of claim 1, the glass element comprises a puncture resistance of greater than about 1.5 kgf when the first primary surface of the glass element is loaded with a tungsten carbide ball having a diameter of 1.5 mm.

15. The stack assembly of claim 1, the glass element comprises a puncture resistance of greater than about 1.5 kgf when the first primary surface of the glass element is loaded with a tungsten carbide ball having a diameter of 1.0 mm.

16. The stack assembly of claim 1, wherein the glass element comprises a pencil hardness of greater than 8 H.

17. The stack assembly of claim 1, wherein when the first primary surface of the glass element is subject to a 1 kgf load from a Vickers indenter, there is introduced a flaw of ≤100 microns in the first primary surface.

18. The stack assembly of claim 1, wherein the glass element has a Vickers hardness of 550 to 650 kgf/mm2.

19. The stack assembly of claim 1, wherein the glass element has a retained B10 bend strength of greater than 800 MPa after contact with a cube corner diamond indenter loaded with 10 gf.

20. The stack assembly of claim 1, comprising F/w≤0.076 N/mm, wherein F is the closing force to put the glass element at the target bend radius, and w is width in mm of the glass element in a direction parallel to the axis around which the glass is bent.

* * * * *